US012701900B2

(12) United States Patent
Choi et al.

(10) Patent No.: US 12,701,900 B2
(45) Date of Patent: Aug. 4, 2026

(54) DISPLAY PANEL PIXEL CONFIGURATION AND MANUFACTURING METHOD FOR THE SAME

(71) Applicant: Samsung Display Co., Ltd., Yongin-Si (KR)

(72) Inventors: Chung Sock Choi, Yongin-si (KR); Yoomin Ko, Yongin-si (KR); Sunho Kim, Yongin-si (KR); Hyewon Kim, Yongin-si (KR); Juchan Park, Yongin-si (KR); Pilsuk Lee, Yongin-si (KR); Sungjin Hong, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 471 days.

(21) Appl. No.: 18/219,103

(22) Filed: Jul. 7, 2023

(65) Prior Publication Data

US 2024/0016032 A1 Jan. 11, 2024

(30) Foreign Application Priority Data

Jul. 8, 2022 (KR) ........................ 10-2022-0084644

(51) Int. Cl.
*H10K 59/80* (2023.01)
*H10K 59/12* (2023.01)
*H10K 59/131* (2023.01)

(52) U.S. Cl.
CPC ... *H10K 59/80521* (2023.02); *H10K 59/1201* (2023.02); *H10K 59/131* (2023.02)

(58) Field of Classification Search
CPC .......... H10K 59/80521; H10K 59/131; H10K 59/1201

(Continued)

(56) References Cited

U.S. PATENT DOCUMENTS

| 7,936,322 B2 | 5/2011 | Chung et al. |
| 8,648,337 B2 | 2/2014 | Hsieh |

(Continued)

FOREIGN PATENT DOCUMENTS

| CN | 103280539 A | 9/2013 |
| CN | 113871430 A | 12/2021 |

(Continued)

*Primary Examiner* — Eric W Jones
(74) *Attorney, Agent, or Firm* — Innovation Counsel LLP

(57) ABSTRACT

Provided is a display panel and a manufacturing method of the same. The display panel includes a plurality of light emitting elements, a plurality of transistors respectively connected to the plurality of light emitting elements, and a plurality of connection lines respectively connecting the plurality of light emitting elements and the plurality of transistors, wherein each of the plurality of connection lines includes a first connection part connected to a corresponding light emitting element among the plurality of light emitting elements, and a second connection part connected to a corresponding transistor among the plurality of transistors, and wherein each of the plurality of light emitting elements includes a first electrode, an intermediate layer disposed on the first electrode, and a second electrode disposed on the intermediate layer, and the first electrodes included in the plurality of light emitting elements are connected to each other to provide an integral shape.

24 Claims, 30 Drawing Sheets

(58) Field of Classification Search
USPC .......................... 257/40, 59, 72, 91, 99, 100
See application file for complete search history.

(56) References Cited

U.S. PATENT DOCUMENTS

| | | | | |
|---|---|---|---|---|
| 11,152,441 | B2 | 10/2021 | Xiong | |
| 12,324,326 | B2 | 6/2025 | Kim et al. | |
| 2009/0015153 | A1* | 1/2009 | Asano | H05B 33/04 |
| | | | | 313/504 |
| 2016/0043341 | A1* | 2/2016 | Heo | H10K 59/1315 |
| | | | | 438/23 |
| 2017/0062755 | A1* | 3/2017 | Im | H10K 50/824 |
| 2018/0062109 | A1 | 3/2018 | Kim | |
| 2018/0151831 | A1* | 5/2018 | Lee | H10K 59/124 |
| 2019/0006442 | A1* | 1/2019 | Byun | H10K 59/131 |
| 2020/0136068 | A1 | 4/2020 | Lee et al. | |
| 2021/0012706 | A1* | 1/2021 | Yang | G09G 3/32 |
| 2021/0202907 | A1 | 7/2021 | Lee et al. | |
| 2021/0210584 | A1* | 7/2021 | Youn | H10K 59/80 |
| 2023/0147514 | A1* | 5/2023 | Kitano | G09F 9/30 |
| | | | | 257/40 |
| 2024/0251635 | A1* | 7/2024 | Tang | H10K 59/1201 |

FOREIGN PATENT DOCUMENTS

| | | | |
|---|---|---|---|
| EP | 3343663 | A1 | 7/2018 |
| KR | 10-1040816 | B1 | 6/2011 |
| KR | 10-2016-0006110 | A | 1/2016 |
| KR | 10-2018-0002436 | A | 1/2018 |
| KR | 10-2022-0034952 | A | 3/2022 |

* cited by examiner

PX: PX11, PX12, ..., PX1m,
    PX21, PX22, ..., PX2m,
    PXn1, PXn2, ..., PXnm

DISPLAY PANEL PIXEL CONFIGURATION AND MANUFACTURING METHOD FOR THE SAME

CROSS-REFERENCE TO RELATED APPLICATIONS

This U.S. non-provisional patent application claims priority under 35 U.S.C. § 119 to Korean Patent Application No. 10-2022-0084644, filed on Jul. 8, 2022, the entire contents of which are hereby incorporated by reference.

BACKGROUND

The present disclosure relates to a display panel and a manufacturing method of the same, and more particularly, to a display panel with a reduced image-sticking defect and a manufacturing method of the same.

A multi-media electronic device such as a television, a mobile phone, a computer (e.g., a tablet), a navigator, a game player, or the like is provided with a display panel for displaying an image.

The display panel includes light emitting elements and a driving circuit for controlling the light emitting element. The light emitting elements included in the display panel emit light and generate an image according to a voltage applied from the driving circuit. In order to improve the reliability of the display panel, the connection between the light emitting elements and the driving circuit is being researched and developed.

SUMMARY

The present disclosure provides a display panel with a reduced image-sticking defect and enhanced lifetime.

The present disclosure also provides a manufacturing method of a display panel with improved reliability.

An embodiment of the inventive concept provides a display panel including: a plurality of light emitting elements; a plurality of transistors respectively connected to the plurality of light emitting elements; and a plurality of connection lines respectively connecting the plurality of light emitting elements and the plurality of transistors, wherein each of the plurality of connection lines includes: a first connection part connected to a corresponding light emitting element among the plurality of light emitting elements; and a second connection part connected to a corresponding transistor among the plurality of transistors, and wherein each of the plurality of light emitting elements comprises a first electrode, an intermediate layer disposed on the first electrode, and a second electrode disposed on the intermediate layer, and the first electrodes included in the plurality of light emitting elements are connected to each other to provide an integral shape.

In an embodiment, the display panel may include a first area, a second area, and a third area disposed along a first direction. The display panel may further include a driving part which is disposed in the third area and is electrically connected to the plurality of the light emitting elements. The plurality of light emitting elements may include first light emitting elements disposed in the first area, second light emitting elements disposed in the second area, and third light emitting elements disposed in the third area, the plurality of transistors may include first transistors connected to the first light emitting elements disposed in the first area, second transistors connected to the second light emitting elements disposed in the second area, and third transistors connected to the third light emitting elements disposed in the third area, the plurality of connection lines may include first connection lines connecting the first transistors to the first light emitting elements, second connection lines connecting the second transistors to the second light emitting elements, and third connection lines connecting the third transistors to the third light emitting elements, a third transistor among the third transistors connected to one of the third light emitting elements disposed in the third area may be disposed in the second area, and the third light emitting elements disposed in the third area may overlap the driving part in a plan view.

In an embodiment, in each of the first area, the second area and the third area, the second light emitting element and the third light emitting element may be disposed in a same side from the first light emitting element, the first light emitting element may be arranged with the second light emitting element and third light emitting element along the first direction, and the second connection part may include a plurality of second connection parts each of which may be arranged between the second light emitting element and the third light emitting element along the first direction.

In an embodiment, each of the first connection lines, the second connection lines, and the third connection lines may include: a first line connected to one of the first connection part and the second connection part, and extending parallel to the first direction; and a second line connected to the first line and bent to extend to a direction different from a direction the first line extends.

In an embodiment, the first line of the second connection line connected to the second light emitting element and the first line of the third connection line connected to the third light emitting element may extend in opposite directions.

In an embodiment, at least one among the first connection lines, the second connection lines, and the third connection lines may further include a third line extending in parallel to the first direction, wherein the third line may be connected to the other of the first connection part and the second connection part which is not connected to the first line.

In an embodiment, the second line in the first area may be bent at a first angle from the first line, the second line in the second area may be bent at a second angle from the first line, and the second line in the third area may be bent at a third angle from the first line, wherein the first angle is about 90°, the second angle is smaller than the first angle, and the third angle is smaller than the second angle.

In an embodiment, in each of the second area and the third area, when a row disposed with the second light emitting element and a row disposed with the third light emitting element are respectively defined as a first row and a second row, a sign of a slope of the second line disposed in the first row and a sign of a slope of the second line disposed in the second row may be opposite to each other.

In an embodiment, the plurality of light emitting elements in the first area may further include a fourth light emitting element spaced apart from the second light emitting element with the first light emitting element interposed therebetween, the plurality of transistors may further include a fourth transistor connected to the fourth light emitting element, the plurality of connection lines may further include a fourth connection line connecting the fourth light emitting element and the fourth transistor, the fourth connection line may include the first connection part connected to the fourth light emitting element and the second connection part connected to the fourth transistor, the fourth connection line may be connected to any one of the first connection part and the second connection part, and may include a first line extending parallel to the first direction and a second line bent to extend from the first line, and a distance from the second line of the first connection line connected to the first light emitting element to the second line of the second connection line connected to the second light emitting element may be substantially same as a distance from the second line of the first connection line connected to the first light emitting element to the second line of the fourth connection line connected to the fourth light emitting element in the plan view.

In an embodiment, the intermediate layer may include a light emitting layer.

In an embodiment, the intermediate layer may further include a functional layer disposed between the first electrode and the light emitting layer or between the light emitting layer and the second electrode.

In an embodiment of the inventive concept, a display panel includes: a transistor; a light emitting element disposed on the transistor; and a connection line connecting the transistor and the light emitting element, wherein the light emitting element includes a first electrode disposed on the connection line, an intermediate layer disposed on the first electrode, and a second electrode disposed on the intermediate layer, and the connection line includes: a first connection part connected to the second electrode; and a second connection part connected to the transistor.

In an embodiment, the connection line may include an undercut portion disposed under a protruding tip part.

In an embodiment, the connection line may include a first layer, a second layer, and a third layer, and a side surface of the third layer may protrude from a side surface of the second layer to form the tip part.

In an embodiment, the second electrode may include a first side and a second side disconnected each other by the tip part, and the first side may contact the side surface of the second layer.

In an embodiment, the intermediate layer may include a light emitting layer and a functional layer, wherein the functional layer is disconnected at the undercut portion by the tip part.

In an embodiment, the display panel may further include: a capping pattern overlapping the tip part in a plan view, wherein the capping pattern is disconnected at the undercut portion by the tip part and is disposed between the second electrode and the tip part.

In an embodiment, the display panel may further include a pixel defining layer in which an emitting opening exposing a portion of the first electrode is defined and which is disposed on the first electrode, and a separator including an insulation material and disposed on the pixel defining layer, wherein the second electrode may be disconnected by the separator.

In an embodiment, the transistor may be an N-type oxide semiconductor transistor.

In an embodiment of the inventive concept, a manufacturing method of a display panel includes: providing a transistor and a first intermediate insulation layer covering the transistor on a base layer; providing a connection line connected to the transistor through a contact hole on the first intermediate insulation layer; providing a second intermediate insulation layer covering the connection line; providing a first opening in the second intermediate insulation layer to expose one side of the connection line; etching the exposed one side of the connection line to provide a protruding tip part; providing a first electrode on the second intermediate insulation layer; providing a pixel defining layer covering the first electrode; providing a second opening exposing the tip part and an emitting opening exposing the first electrode in the pixel defining layer; providing an intermediate layer on the pixel defining layer; and providing a second electrode on the intermediate layer to be connected to the tip part.

In an embodiment, the connection line may include a first layer, a second layer, and a third layer, a side surface of the third layer may protrude from a side surface of the second layer to provide the tip part, and the second electrode may be connected to the side surface of the second layer.

In an embodiment, the manufacturing method may further include providing a separator on the pixel defining layer, wherein the separator is provided to completely surround the tip part and the first electrode, and in the providing of the second electrode, the second electrode is disconnected on the separator into a first portion disposed on a top portion of the separator and a second portion surrounding the separator and disconnected from the first portion.

In an embodiment, the intermediate layer may include a light emitting layer.

In an embodiment, the intermediate layer may further include a functional layer disposed between the first electrode and the light emitting layer or between the light emitting layer and the second electrode.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings:

FIG. 4A is an enlarged plan view of a portion of a display panel according to an embodiment of the inventive concept;

FIG. 5 is a cross-sectional view of a display panel according to an embodiment of the inventive concept;

FIG. 8A is an enlarged plan view of a portion of a display panel according to an embodiment of the inventive concept;

FIGS. 14A, 14B and 14C are drawings schematically showing some of steps of a manufacturing method of a display panel according to an embodiment of the inventive concept.

DETAILED DESCRIPTION

Figure 1:
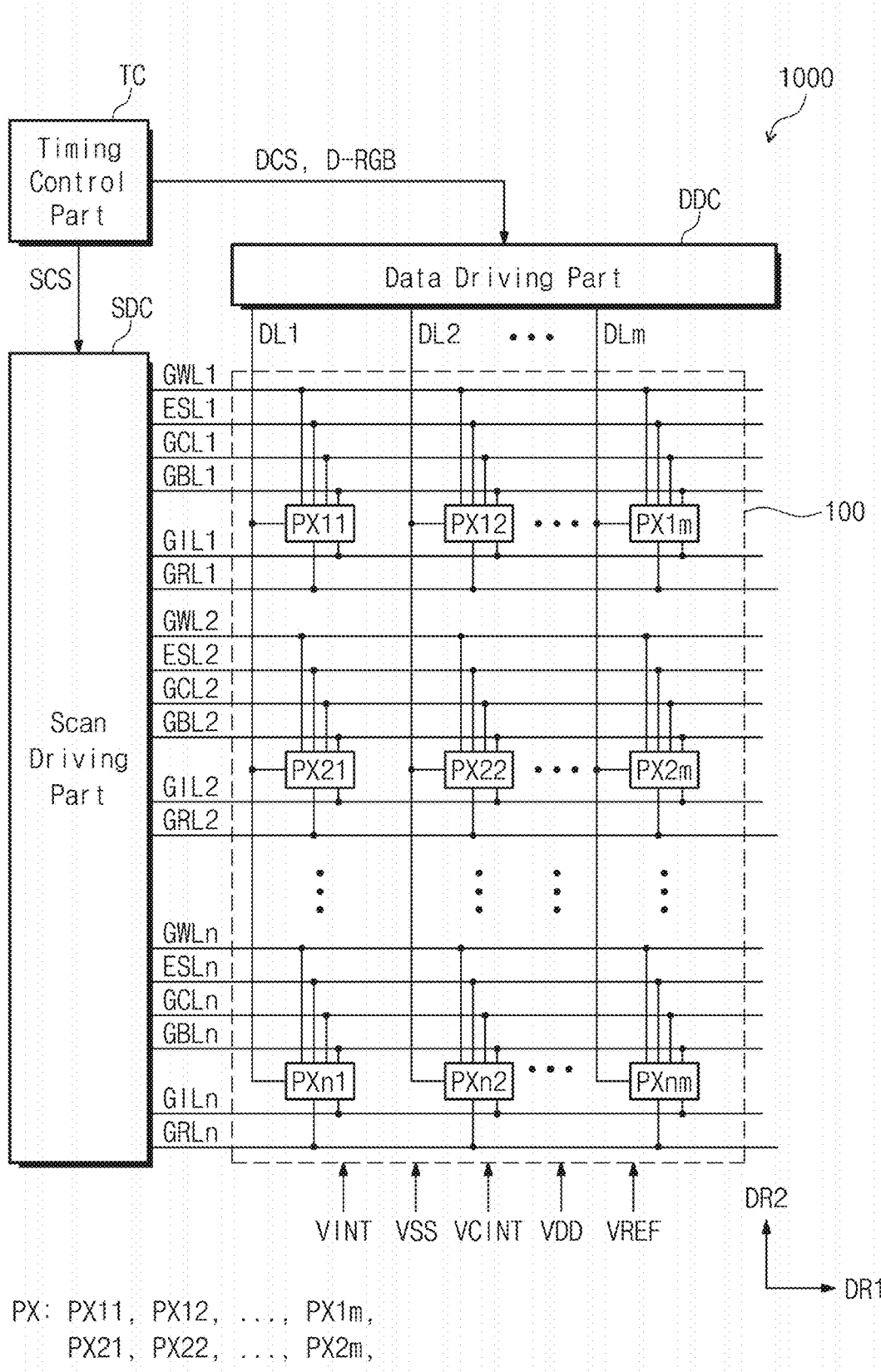
FIG. 1 is a block diagram of a display device according to an embodiment of the inventive concept.

The present inventive concept may be variously modified and realized in various forms, and thus specific embodiments will be exemplified in the drawings and described in detail hereinafter. However, it will be understood that the present inventive concept is not intended to be limited to the specific forms set forth herein, and all changes, equivalents, and substitutions included in the technical scope and spirit of the present inventive concept are included.

It will be understood that when an element or layer is referred to as being "on," "connected to" or "coupled to" another element or layer, it can be directly on, connected or coupled to the other element or layer or intervening third elements or layers may be present.

On the other hand, "being directly disposed" may means that there is not an additional layer, film, region, plate or the like between a part of a layer, film, region, plate or the like and another part. For example, "being directly disposed" may mean that disposition of two layers or two members is performed without using an additional member such as an adhesive member therebetween.

Like reference numerals in the drawings refer to like elements. In addition, in the drawings, the ratio and the dimension (e.g., thickness) of the element are exaggerated for effective description of the technical contents. The term "and/or" includes any and all combinations of one or more of the associated items.

Terms such as first, second, and the like may be used to describe various components, but these components should not be limited by the terms. These terms are only used to distinguish one component from another. For instance, a first component may be referred to as a second component, or similarly, a second component may be referred to as a first component, without departing from the scope of the present disclosure. The singular expressions include plural expressions unless the context clearly dictates otherwise.

In addition, the terms such as "under," "lower," "on," and "upper" are used for explaining associations of items illustrated in the drawings. It will be understood that the spatially relative terms are intended to encompass different orientations of the device in use or operation in addition to the orientation depicted in the figures. In the present specification, the term "disposed on" may refer to not only an upper part of any member but also a lower part thereof.

It will be further understood that the terms "includes" and/or "including", when used in this specification, specify the presence of stated features, integers, steps, operations, elements, components or combinations thereof, but do not preclude the presence or addition of one or more other features, integers, steps, operations, elements, components, or combinations thereof.

Unless otherwise defined, all terms (including technical and scientific terms) used herein have the same meaning as commonly understood by one of ordinary skill in the art to which the present disclosure belongs. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, embodiments of the inventive concept will be described in detail with reference to the accompanying drawings.

FIG. 1 is a block diagram of a display device according to an embodiment of the inventive concept.

The display device 1000 according to the inventive concept may be a semiconductor device including at least one semiconductor. The display device 1000 includes a timing control part TC, a scan driving part SDC, a data driving part DDC, and a display part 100 (or display panel). The display part 100 displays an image according to an electrical signal.

The display part 100 according to an embodiment of the inventive concept may be an emissive display panel, and is not particularly limited thereto. For example, the display part 100 may be an organic light emitting display panel or an inorganic light emitting display panel. A light emitting layer of the organic light emitting display panel may include an organic light emitting material. A light emitting layer of the inorganic light emitting display panel may include quantum dots, quantum rods or the like. In addition, the light emitting layer of the display part 100 may include micro LED elements and/or nano LED elements, etc. Hereinafter, the display part 100 will be described as an organic light emitting display panel.

The timing control part TC receives input image signals, and converts the data format of the input image signals to correspond to the specification of an interface with the data driving part DDC to generate image data D-RGB. The timing control part TC outputs the image data D-RGB and various types of control signals DCS and SCS.

The scan driving part SDC receives a scan control signal SCS from the timing control part TC. The scan control signal SCS may include a vertical start signal for starting an operation of the scan driving part SDC, or a clock signal for determining an output time of signals, etc.

The scan driving part SDC may generate a plurality of scan signals, and sequentially output the scan signals to a plurality of scan lines GWL1, GWL2, . . . , GWLn, GCL1, GCL2, . . . , GCLn, GBL1, GBL2, . . . , GBLn, GIL1 GIL2, . . . , GILn, GRL1, GRL2, . . . , GRLn. In addition, the scan driving part SDC generates a plurality of emission control signals in response to the scan control signal SCS, and outputs the emission control signals to a plurality of emission control signal lines ESL1, ESL2, . . . , ESLn. Here, n may be a natural number greater than zero.

FIG. 1 illustrates that the plurality of scan signals and the plurality of emission control signals are output from one scan driving part SDC, but the embodiment of the inventive concept is not limited thereto. In an embodiment of the inventive concept, the display device 1000 may include more than one scan driving part SDC and each of the scan driving parts SDC outputs scan signals and emission control signals corresponding to a portion of the display part 100. In addition embodiments of the inventive concept, a driving part configured to generate and output the scan signals may be separated from a driving part configured to generate and output the emission control signals.

The data driving part DDC may receive the data control signal DCS and the image data D-RGB from the timing control part TC. The data driving part DDC converts the image data D-RGB to data signals, and outputs the data signals to the data lines DL1, DL2, . . . , DLm (m may be a natural number greater than zero). The data signals have analog voltages corresponding to gradation values of the image data D-RGB.

The display part 100 includes data scan lines GWL1 to GWLn, emission control signal lines ESL1 to ESLn, compensation scan lines GCL1 to GCLn, black scan lines GBL1 to GBLn, initialization scan lines GIL1 to GILn, reset scan lines GRL1 to GRLn, data lines DL1 to DLm and a plurality of pixels PX11, PX12, . . . , PX1*m*, PX21, PX22, . . . , PX2*m*, . . . , PXn1, PXn2, . . . , PXnm connected to the data scan lines GWL1 to GWLn, the emission control signal lines ESL1 to ESLn, the compensation scan lines GCL1 to GCLn, the black scan lines GBL1 to GBLn, the initialization scan lines GIL1 to GILn, the reset scan lines GRL1 to GRLn and the data lines DL1 to DLm. The scan lines GWL1 to GWLn, GCL1 to GCLn, GBL1 to GBLn, GIL1 to GILn, and GRL1 to GRLn extend in a first direction DR1, and are arranged in a second direction DR2 crossing the first direction DR1.

Each of the plurality of emission control signal lines ESL1 to ESLn may be arranged in parallel to the scan lines GWL1 to GWLn, GCL1 to GCLn, GBL1 to GBLn, GIL1 to GILn, and GRL1 to GRLn. The data lines DL1 to DLm and the plurality of scan lines GWL1 to GWLn, GCL1 to GCLn, GBL1 to GBLn, GIL1 to GILn, and GRL1 to GRLn are insulated from and cross each other. For example, the data lines DL1 to DLm extend along the second direction DR2 and are arranged in the first direction DR1.

Each of the plurality of pixels PX is connected to a corresponding scan line among the scan lines GWL1 to GWLn, GCL1 to GCLn, GBL1 to GBLn, GIL1 to GILn, and GRL1 to GRLn, a corresponding emission control signal line among the emission control signal lines ESL1 to ESLn and a corresponding data line among the data lines DL1 to DLm.

Each of the pixels PX may receive a first power supply voltage VDD, a second power supply voltage VSS, an initialization voltage VINT, a compensation initialization voltage VCINT, or a reference voltage VREF.

Meanwhile, the display part 100 may further include a plurality of dummy scan lines. The display part 100 may further include a dummy scan line connected to pixels PX in a first pixel row and a dummy scan line connected to pixels PX in an n-th pixel row. In addition, pixels PX in one pixel column may be connected to one data line among the data lines DL1 to DLm. Two adjacent pixels PX in the one pixel column may be electrically connected. However, the above description is an example, and a connection between the pixels PX according to an embodiment of the inventive concept may be designed in various ways, and is not limited to any one embodiment.

Each of the pixels PX includes a(n) (organic) light emitting element Ld and a pixel driving part configured to control emission of the (organic) light emitting element. The pixel driving part may include transistors and capacitors.

In the present embodiment, at least one of the scan driving part SDC and the data driving part DDC may include transistors provided through the same process as the process forming the pixel driving part. For example, both of the scan driving part SDC and the data driving part DDC may be formed on a substrate on which the display part 100 is formed. Alternatively, any one of the scan driving part SDC and the data driving part DDC may be an IC chip mounted on the substrate in the display part 100, and the other may be mounted on a separate circuit board and be connected to the display part 100.

Hereinafter, a direction, which substantially vertically crosses the plane defined by a first direction DR1 and a second directions DR2, is defined as a third direction DR3. In addition, "when viewed in a plan view" or "in a plan view" in the present specification may be defined as a state of being viewed in the third direction DR3.

The thickness direction of the display part 100 may be parallel to the third direction DR3 that is a normal direction to a plane defined by the first direction DR1 and the second direction DR2. In the present specification, the front surfaces (or top surfaces) and the rear surfaces (or bottom surfaces) of the members constituting the display device 1000 may be defined on the basis of the third direction DR3. In the present specification, "thickness" may indicate a numerical value measured in the third direction DR3, "width' may indicate a numerical value measured in the first direction DR1 or the second direction DR2 that is a horizontal direction.

Figure 2A:
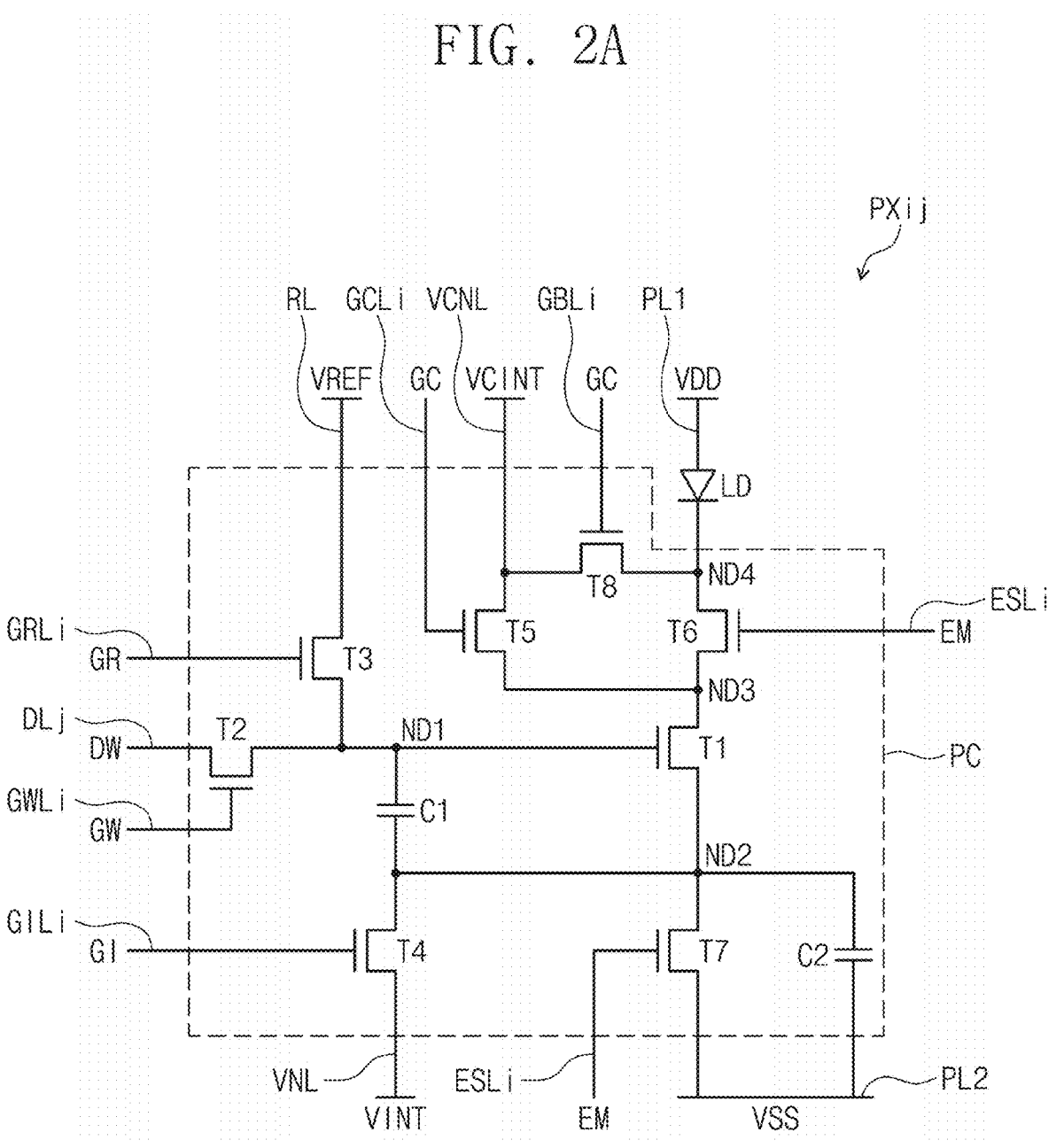
FIG. 2A is an equivalent circuit diagram of a pixel according to an embodiment of the inventive concept.
Figure 2B:
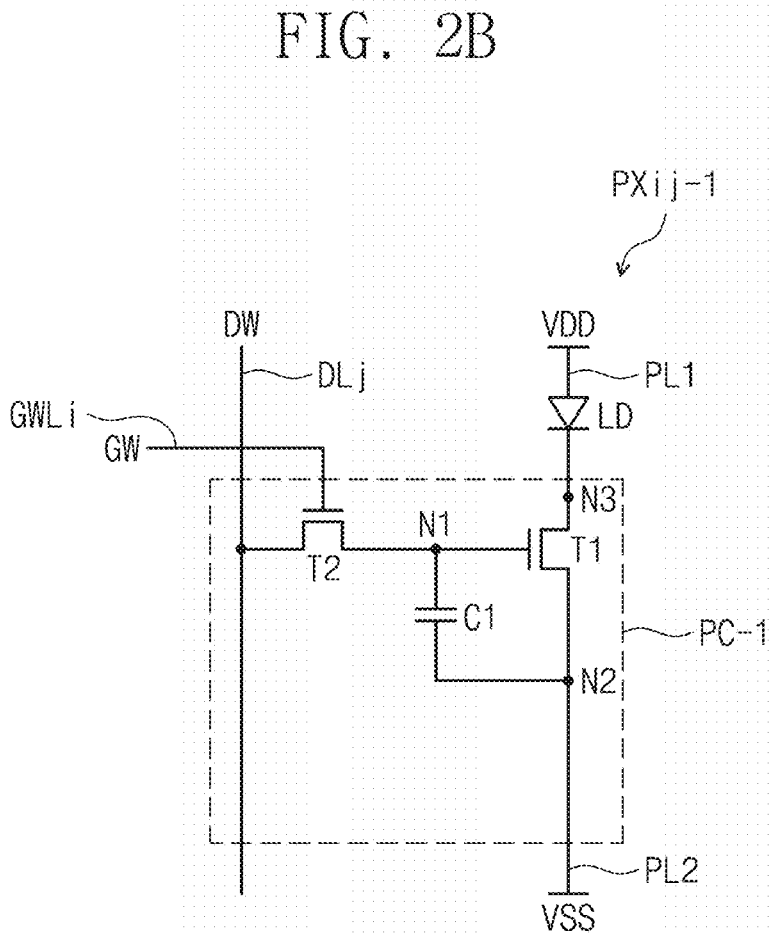
FIG. 2B is an equivalent circuit diagram of a pixel according to an embodiment of the inventive concept.

FIGS. 2A and 2B are equivalent circuit diagrams of a pixel according to an embodiment of the inventive concept. FIGS. 2A and 2B show pixels PXij and PXij-1 (*i* may be a natural number greater than zero and less than or equal to n, and j may be a natural number greater than zero and less than or equal to m) connected to a corresponding data line DLj among the data lines DL1 to DLm.

As shown in FIG. 2A, the pixel PXij includes a light emitting element LD and a pixel driving part PC. The light emitting element LD is connected between a first power line PL1 and a pixel driving part PC.

The pixel driving part PC may be connected to a plurality of scan lines GWLi, GCLi, GBLi, GILi, and GRLi, a data line DLj, an emission control signal line ESLi, and a plurality of power lines PL1, PL2, VNL, VCNL, and RL. The pixel driving part PC may include first to eighth transistors T1, T2, T3, T4, T5, T6, T7 and T8, a first capacitor C1 (or a storage capacitor), and a second capacitor C2 (or a hold capacitor). Hereinafter, each of the first to eighth transistors T1, T2, T3, T4, T5, T6, T7 and T8 will be described as, for example, an N-type transistor. However, the embodiment of the inventive concept is not limited thereto, and some of the first to eighth transistors T1 to T8 may be N-type transistors, and the remainder may be P-type transistors. Each of the first to eighth transistors T1 to T8 may also be a P-type transistor, and the configuration of the first to eighth transistors T1, T2, T3, T4, T5, T6, T7 and T8 is not limited to any one embodiment.

The first transistor T1 may include a gate connected to a first node ND1, a source connected to a second node ND2, and a drain connected to a third node ND3. The first transistor T1 may be a driving transistor.

The second transistor T2 may include a gate connected to the data scan line GWLi, a drain connected to the data line DLj, and a source connected to the first node ND1. The second transistor T2 drives the first transistor T1 by supplying a data signal DW to the first node ND1 in response to a scan signal GW delivered through the data scan line GWLi. The second transistor T2 may be a switching transistor.

The third transistor T3 may include a gate connected to the reset scan line GRLi, a drain connected to the reference voltage line RL, and a source connected to the first node ND1. The third transistor T3 may supply the reference voltage VREF to the first node ND1 in response to the reset scan signal GR delivered through the reset scan line GRLi.

The fourth transistor T4 may include a gate connected to the initialization scan line GILi, a drain connected to the first initialization line VNL, and a source connected to the second node ND2. The fourth transistor T4 may supply the initialization voltage VINT to the second node ND2 in response to the initialization scan signal GI delivered through the initialization scan line GILi. The fourth transistor T4 may be an initialization transistor.

The fifth transistor T5 may include a gate connected to a compensation scan line GCLi, a source connected to the third node ND3, and a drain connected to a second initialization line VCNL. The fifth transistor T5 may supply the compensation initialization voltage VCINT to the third node ND3 in response to the compensation scan signal GC delivered through the compensation scan line GCLi. The compensation initialization voltage VCINT may have a different voltage level from the initialization voltage VINT.

The sixth transistor T6 may include a gate connected to the emission control signal line ESLi, a source connected to a third node ND3, and a drain connected to the fourth node ND4. The fourth node ND4 may correspond to a connection unit in which a cathode of the light emitting element LD and the pixel driving part PC are connected. The sixth transistor T6 may electrically connect the third node ND3 with the cathode of the light emitting element LD in response to the emission control signal EM delivered through the emission control signal line ESLi.

The seventh transistor T7 may include a gate receiving the emission control signal EM, a source connected to the second power line PL2, and a drain connected to the second node ND2. The seventh transistor T7 provides the second power supply voltage VSS to the second node ND2 in response to the emission control signal EM. Here, the seventh transistor T7 may be substantially simultaneously turned on or off with the sixth transistor T6. The gate electrode of the seventh transistor T7 may be connected to the emission control signal line ESLi, or receive the emission control signal EM through another line.

The eight transistor T8 may include a gate connected to a black scan line GBLi, a drain connected to the second initialization line VCNL, and a source connected to the fourth node ND4. The eight transistor T8 may supply the compensation initialization voltage VCINT to the cathode of the light emitting element LD in response to the compensation scan signal GC delivered through the black scan line GBLi.

Meanwhile, in the present embodiment, the eighth transistor T8 and the fifth transistor T5 may be turned on or off by the compensation scan signal GC, and thus the eighth transistor T8 and the fifth transistor T5 may be substantially simultaneously turned on or off. Here, the compensation scan line GCLi and the black scan line GBLi may be substantially provided as a single scan line.

The fifth transistor T5 and the eighth transistor T8 may be turned on by the compensation scan signal GC to provide the compensation initialization voltage VCINT to each of the third node ND3 and the fourth node ND4. The compensation initialization voltage VCINT delivered to the third node ND3 may compensate for a threshold voltage (Vth) of the first transistor T1. In addition, the compensation initialization voltage VCINT delivered to the fourth node ND4 may initialize the cathode of the light emitting element LD. However, this describes an example, and the eighth transistor T8 and the fifth transistor T5 may also be independently driven by different scan signals, and the configuration of the fifth transistor T5 and the eighth transistor T8 are not limited to any one embodiment.

The first capacitor C1 includes one electrode connected to the first node ND1 and the other electrode connected to the second node ND2. The first capacitor C1 stores charge corresponding to the potential difference between the gate electrode of the first transistor T1 and the source electrode of the first transistor T1. The first capacitor C1 is charged or discharged according to the data signal DW delivered to the first node ND1.

The second capacitor C2 may include one electrode connected to the second node ND2 and the other electrode connected to the second power line PL2. The second capacitor C2 stores charge corresponding to the potential difference between the drain of the seventh transistor T7 and the second power supply voltage VSS. The second capacitor C2 has storage capacity higher than that of the first capacitor C1. Accordingly, the potential change at the second node ND2 according to the potential change at the first node ND1 can be minimized.

The light emitting element LD includes the anode connected to the first power line PL1, the cathode facing the anode and a light emitting layer disposed between the anode and cathode. The light emitting element LD emits light according to a current amount flowing through the light emitting element LD due to a voltage difference between a first power supply voltage VDD delivered through the first power line PL1 and the cathode voltage.

According to the embodiment, the anode of the light emitting element LD may be connected to the first power line PL1 to receive the first power supply voltage VDD that is an constant voltage, and the cathode voltage may be controlled by the eighth transistor T8 and the sixth transistor T6 which are connected to the cathode of the light emitting element LD. Accordingly, the potential at the second node ND2 connected to the first transistor T1 may be less influenced by the characteristics of the light emitting element LD. Accordingly, even if the characteristics of the light emitting element LD are degraded due to an increase of usage time of the light emitting element LD or the like, the transistors, specially the gate-source voltage (Vgs) of the sixth transistor T6, may be less influenced. Accordingly, the current amount flowing through the light emitting element LD in an emitting interval during which the sixth transistor T6 and the seventh transistor T7 turn on may not drop according to degradation of the light emitting element LD or the like, thus, stable driving is possible, and the occurrence of problematic display defects such as image-sticking or the like may be reduced. In other words, a range of change in the current amount flowing through the light emitting element LD according to degradation of the light emitting element LD may be reduced, and thus image-sticking defects of the display panel according to an increase of the usage time may be reduced and the lifetime of the display device 1000 may be enhanced.

Alternatively, as shown in FIG. 2B, a pixel PXij-1 may include a pixel driving part PC-1 including two transistors T1 and T2, and one capacitor C1. The pixel driving part PC-1 is connected to the light emitting element LD, the data scan line GWLi, the data line DLj, and the second power line PL2. The pixel driving part PC-1 shown in FIG. 2B may correspond to one in which the third to eighth transistors T3 to T8 and the second capacitor C2 are omitted from the pixel driving part PC shown in FIG. 2A.

Each of the first and second transistors T1 and T2 may be an N-type or a P-type transistor. In the present embodiment, each of the first and second transistors T1 and T2 is described as the N-type transistor.

The first transistor T1 may include a gate connected to the first node N1, a source connected to the second node N2, and a drain connected to the light emitting element LD. The first transistor T1 may be a driving transistor.

The second transistor T2 may include a gate connected to the data scan line GWLi, a drain connected to the data line DLj, and a source connected to the first node N1. The second transistor T2 drives the first transistor T1 by supplying the data signal DW to the first node N1 in response to the scan signal GW delivered through the data scan line GWLi. The second transistor T2 may be a switching transistor.

The capacitor C1 includes one electrode connected to the first node N1 and the other electrode connected to the second node N2. The capacitor C1 is charged or discharged according to the data signal DW delivered to the first node N1.

The light emitting element LD may include the anode, the cathode facing the anode and a light emitting layer disposed between the anode and cathode. anode of the light emitting element LD may be connected to the first power line PL1, and the cathode of the light emitting element LD may be connected to the first transistor T1 of the pixel driving part PC-1. The light emitting element LD may emit light according to a current amount flowing through the first transistor T1 of the pixel driving part PC-1.

The third node N3 to which the cathode of the light emitting element LD and the pixel driving part PC-1 are connected may correspond to the drain of the first transistor T1. In other words, in case that the first transistor T1 is N-type transistor, with connecting the cathode of the light emitting element LD and the first transistor T1, a change in a gate-source voltage of the first transistor T1 may be prevented. Accordingly, a range of change in the current amount according to degradation of the light emitting element LD may be reduced, and thus an image-sticking defect of the display panel according to an increase of the usage time may be reduced and the lifetime of the display device 1000 may be enhanced.

Meanwhile, FIGS. 2A and 2B show the pixel driving parts according to embodiments of the inventive concept, and the display panel according to an embodiment of the inventive concept may be designed in various ways in terms of the number of and a disposition relationship between transistors and the number of and a disposition relationship between the capacitors, if the pixel driving part is connected to the cathode of the light emitting element LD. The embodiment of the inventive concept is not limited to any one embodiment.

Figure 3:
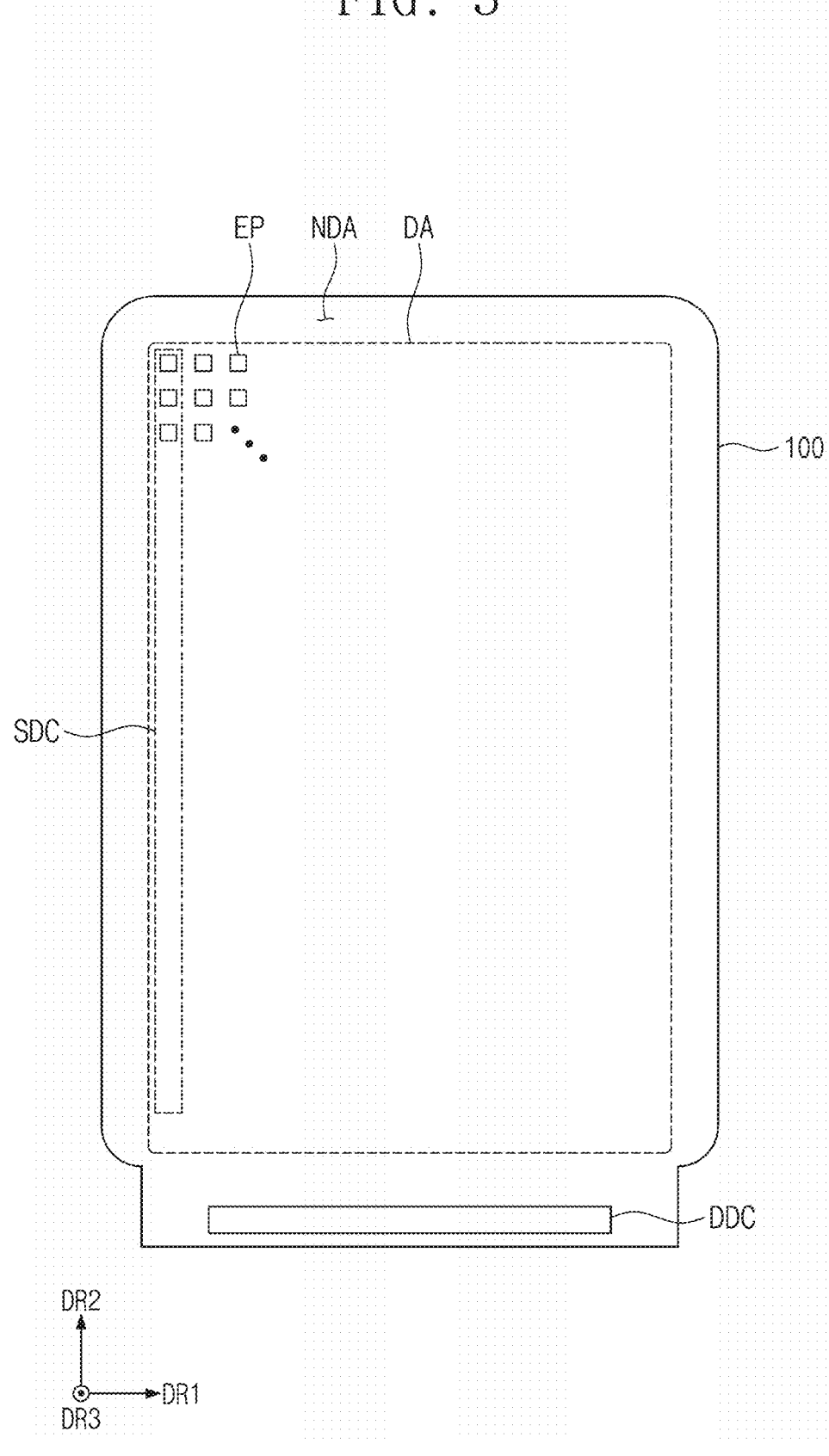
FIG. 3 is a plan view schematically illustrating a display panel according to an embodiment of the inventive concept.

FIG. 3 is a plan view schematically illustrating a display panel according to an embodiment of the inventive concept. In FIG. 3, some components are omitted. Hereinafter, an embodiment of the inventive concept will be described with reference to FIG. 3. Referring to FIG. 3, a display panel 100 of the embodiment may include a display area DA and a non-display area NDA. The display area DA includes a plurality of light emitting parts EP.

The light emitting parts EP may be areas in which pixels PX (see FIG. 1) emit light respectively. Specifically, the light emitting parts EP may respectively correspond to emitting openings OP-PDL (see FIG. 5) to be described below.

The non-display area NDA may be disposed adjacent to the display area DA. In the present embodiment, the non-display area NDA is shown to surround edges of the display area DA. However, this shows an example, and the non-display area NDA may be disposed in one side of the display area DA, or be omitted, and is not limited to any one embodiment.

In the present embodiment, the scan driving part SDC and the data driving part DDC may be disposed in the display panel 100. In an embodiment, the scan driving part SDC may be disposed in the display area DA, and the data driving part DDC may be disposed in the non-display area NDA. The scan driving part SDC may overlap at least some of the plurality of pixels PX in a plan view. As the scan driving part SDC is disposed in the display area DA, the area of the non-display area NDA in the embodiment may be reduced in comparison to a typical display panel in which a scan driving part is disposed in a non-display area, and thus the display device 1000 with narrow bezel may be easily implemented.

Meanwhile, unlike the shown in FIG. 3, the scan driving part SDC may be provided as two separate scan driving parts SDC. The two scan driving parts SDC may be spaced apart by the display area DA interposed therebetween. Alternatively, the scan driving part SDC may be provided in plurality of two or more, and is not limited to any one embodiment.

Meanwhile, FIG. 3 shows an example of the display panel 100, and the data driving part DDC may be disposed in the non-display area NDA.

The data driving part DDC may be an integrated circuit chip mounted in the display panel 100. However, this describes an example. The data driving part DDC may be formed through the same process as the scan driving part SDC, or disposed on a circuit board which is connected to the display panel 100. The embodiment of the inventive concept is not limited to any one embodiment.

Figure 4A:
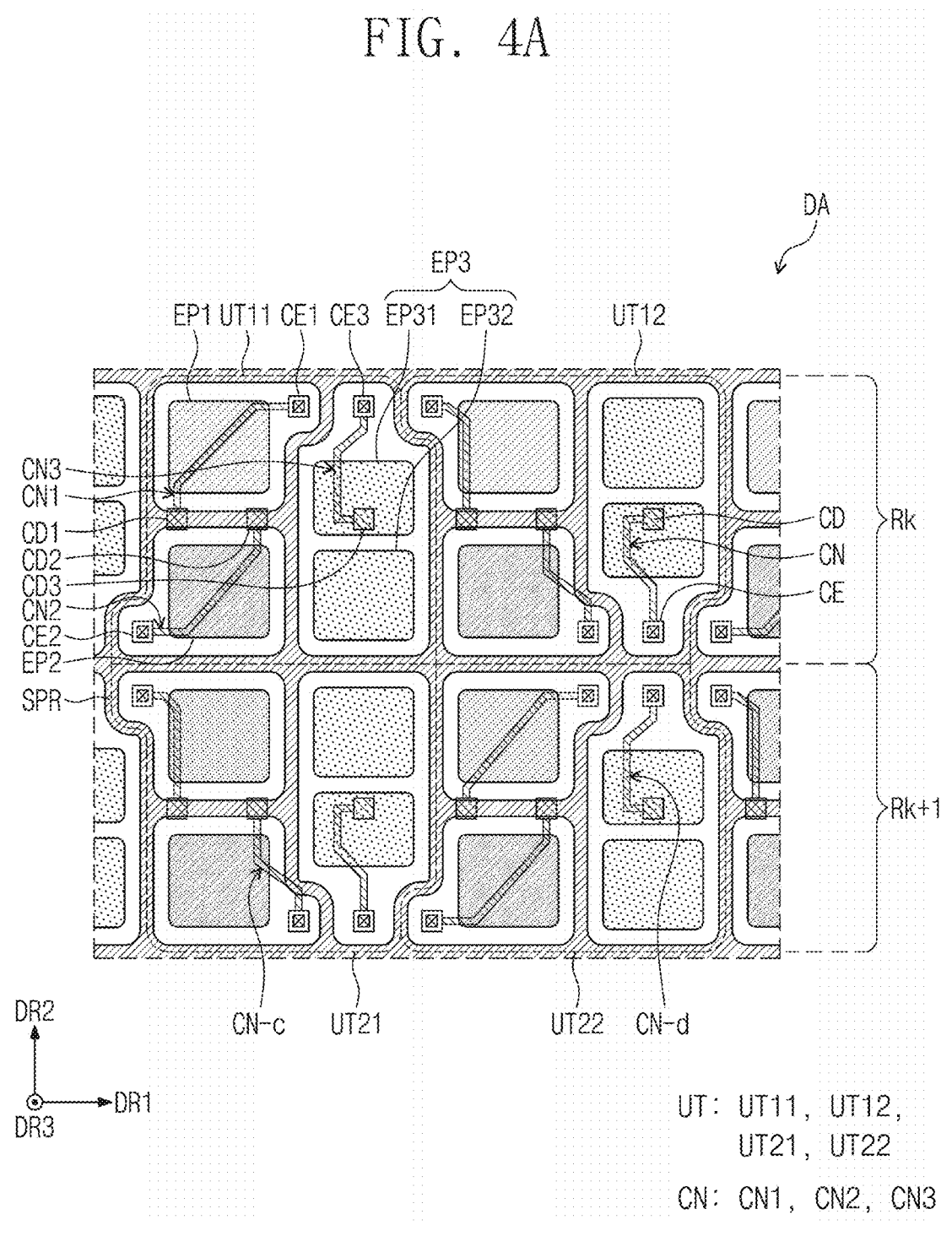
Figure 4B:
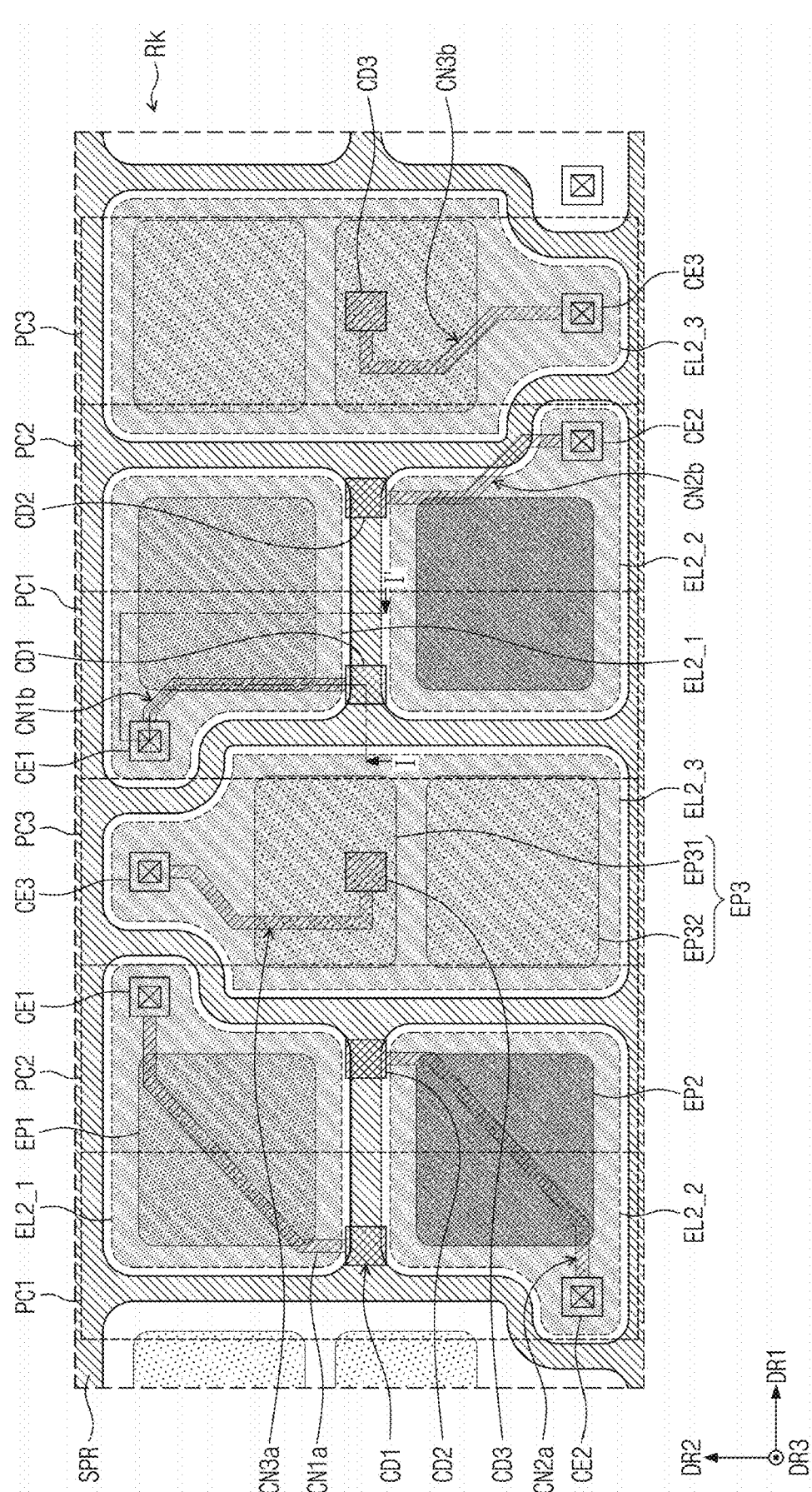
FIG. 4B is an enlarged plan view of a portion of a display panel according to an embodiment of the inventive concept.
Figure 4C:
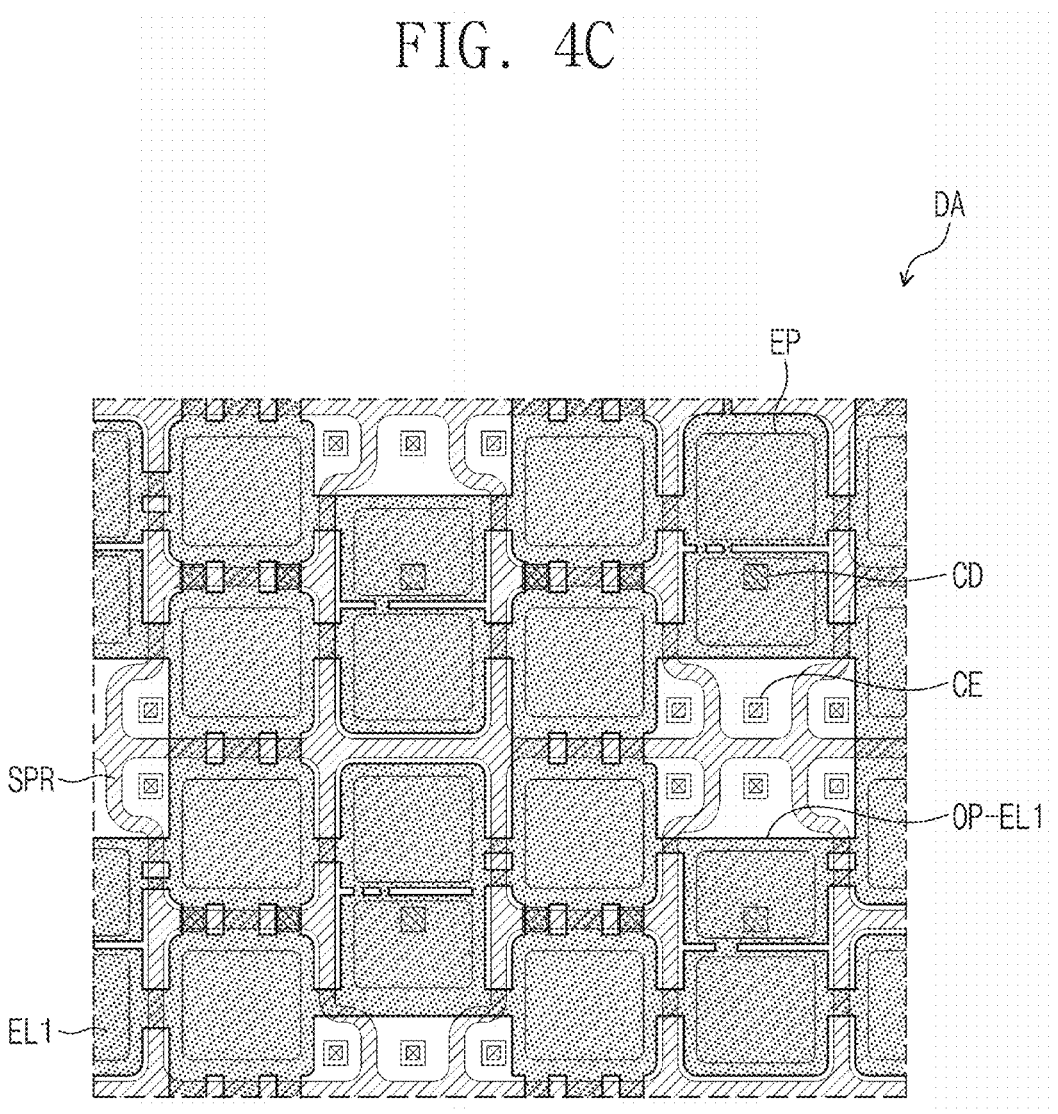
FIG. 4C is an enlarged plan view of a portion of a display panel according to an embodiment of the inventive concept.

FIGS. 4A to 4C are enlarged plan views of a portion of a display panel according to an embodiment of the inventive concept. FIG. 4A shows an area in which total four light emitting units UT are disposed in two rows and two columns, and FIG. 4B shows an enlarged view of a portion of an area shown in FIG. 4A. FIG. 4C shows that some of the components shown in FIG. 4A are highlighted or omitted. Hereinafter, the inventive concept will be described with reference to FIGS. 4A to 4C.

In FIG. 4A, the light emitting units UT11, UT12, UT21, and UT22 in two rows and two columns are shown. First row light emitting parts Rk include light emitting parts in which the light emitting unit UT11 in the first row and the first column and the light emitting unit UT12 in the first row and the second column are repeatedly arranged along the first direction DR1, and second row light emitting parts Rk+1 include light emitting parts in which the light emitting unit UT21 in the second row and the first column and the light emitting unit UT22 in the second row and the second column are repeatedly arranged along the first direction DR1. FIG. 4A to FIG. 4C show, among the components of the display panel, a separator SPR, a plurality of light emitting parts EP1, EP2, and EP3 disposed in an area divided by the separator SPR, connection lines CN1, CN2, and CN3, a first electrode EL1 (hereinafter, anode), and second electrodes EL2_1, EL2_2, and EL2_3 (hereinafter, first to third cathodes).

As described above, each of the light emitting parts EP1, EP2, and EP3 may respectively correspond to the emitting openings OP-PDL to be described below. In other words, each of the light emitting parts EP1, EP2, and EP3 may be an area in which light emitted by the foregoing light emitting element LD is emitted, and with which an anode, a light emitting layer, and a cathode constituting the light emitting element LD are overlapped.

The light emitting parts EP1, EP2, and EP3 may include a first light emitting part EP1, a second light emitting part EP2, and a third light emitting part EP3. The first light emitting part EP1, the second light emitting part EP2, and the third light emitting part EP3 may emit different color of light. For example, the first light emitting part EP1 emits red light, the second light emitting part EP2 displays blue light, and the third light emitting part EP3 emits green light, but a color combination is not limited thereto.

Meanwhile, the third light emitting part EP3, which emits light emitted by the third light emitting element among the light emitting parts EP1, EP2, and EP3, may include two sub-light emitting parts EP31 and EP32 spaced apart from each other in the second direction DR2. However, this shows an example, and the third light emitting part EP3 may be provided in one pattern having an integral shape. At least one of the other light emitting parts EP1 and EP2 may also include sub-light emitting parts, and the configuration of the light emitting parts EP1, EP2, and EP3 is not limited to any one embodiment.

The first row light emitting parts Rk in the present embodiment may include light emitting parts in which the light emitting unit UT11 in the first row and the first column and the light emitting unit UT12 in the first row and the second column are repeatedly arranged along the first direction DR1. The second row light emitting parts Rk+1 may include light emitting parts in which the light emitting unit UT21 in the second row and the first column and the light emitting unit UT22 in the second row and the second column are repeatedly arranged along the first direction DR1. In this invention, the light emitting parts in the light emitting unit UT 21 has the shape and arrangement corresponding to the shape and arrangement of the light emitting parts in the light emitting unit UT12. And the light emitting parts in the light emitting unit UT 22 has the shape and arrangement corresponding to the shape and arrangement of the light emitting parts in the light emitting unit UT11. A portion defining the first row light emitting parts Rk of the separator SPR is linearly symmetric to a portion defining the second row light emitting parts Rk+1 of the separator SPR with respect to an axis extending parallel to the first direction DR1. Accordingly, the shape and arrangement of the light emitting parts and connection parts of connection lines constituting the light emitting unit UT11 in the first row and the first column and the light emitting unit UT12 in the first row and the second column are in a line symmetry with the shape and arrangement of the light emitting parts and connection parts of connection lines constituting the light emitting unit UT21 in the second row and the first column and the light emitting unit UT22 in the second row and the second column with respect to the axis extending parallel to the first direction DR1.

Hereinafter, the light emitting unit UT11 in the first row and the first column will be described. For easy description, FIG. 4B illustrates a plurality of second electrodes EL2_1, EL2_2, and EL2_3, a plurality of pixel driving parts PC, and a plurality of connection lines CN. The second electrodes EL2_1, EL2_2, and EL2_3 may be divided by the separator SPR. In the present embodiment, one light emitting unit UT includes three light emitting parts EP1, EP2, and EP3. Accordingly, the light emitting unit UT may include the three second electrodes EL2_1, EL2_2, and EL2_3, three pixel driving parts PC1, PC2, and PC3, and three connection lines CN1, CN2, and CN3. However, this shows an example, and the number and arrangement of the light emitting units UT may be designed in various ways and is not limited to any one embodiment.

The first to third pixel driving parts PC1, PC2, and PC3 may respectively be connected to the light emitting elements in the first to third light emitting parts EP1, EP2, and EP3. In the present specification, "be connected" includes not only a case of being directly connected, but also a case of being electrically connected.

The first, second and third pixel driving parts PC1, PC2 and PC3 may be sequentially disposed along the first direction DR1. Meanwhile, the positions of the first to third pixel driving parts PC1, PC2, and PC3 may be designed independently from the positions and shapes of the first to third light emitting parts EP1, EP2, and EP3.

For example, the first to third pixel driving parts PC1, PC2, and PC3 may be disposed in an area divided by the separator SPR, namely, positions different from the positions in which the first to third cathodes EL2_1, EL2_2, and EL2_3 are disposed, or designed to have the shapes of areas different from those of the first to third cathodes EL2_1, EL2_2, and EL2_3. Alternatively, the first to third pixel driving parts PC1, PC2, and PC3 are respectively disposed to overlap the first to third light emitting parts EP1, EP2, and EP3, and designed to have the shapes of the areas similar to, for example, those of the first to third cathodes EL2_1, EL2_2, and EL2_3.

In the present embodiment, each of the first to third pixel driving parts PC1, PC2, and PC3 is shown as a rectangular shape, and each of the first to third light emitting parts EP1, EP2, and EP3 is arranged to have an area smaller than and a shape different from the first to third pixel driving parts PC1, PC2, and PC3. The first to third cathodes EL2_1, EL2_2, and EL2_3 are respectively disposed at positions to overlap the first to third light emitting parts EP1, EP2, and EP3 and have irregular shapes.

Accordingly, as shown in FIG. 4B, the first pixel driving part PC1 may be disposed at a position to overlap the first light emitting part EP1 and the second light emitting part EP2, and to partially overlap another adjacent light emitting unit UT. The second pixel driving part PC2 may be disposed at a position to overlap the first light emitting part EP1, the second light emitting part EP2, and a third light emitting part EP3. The third pixel driving part PC3 may be disposed at a position to overlap the third light emitting part EP3. Meanwhile, this shows an example, and the positions of the first to third pixel driving parts PC1, PC2 and PC3 may be designed in various shapes and arrangements independently from the light emitting parts EP1, EP2, and EP3, and are not limited to any one embodiment.

The connection line CN may be provided in plurality and the plurality of connection lines CN may be spaced apart from each other. The connection lines CN connect the pixel driving parts PC and the light emitting elements. Specifically, the connection lines CN may correspond to the fourth node ND4 in FIG. 2A and the third node N3 in FIG. 2B.

Figure 5:
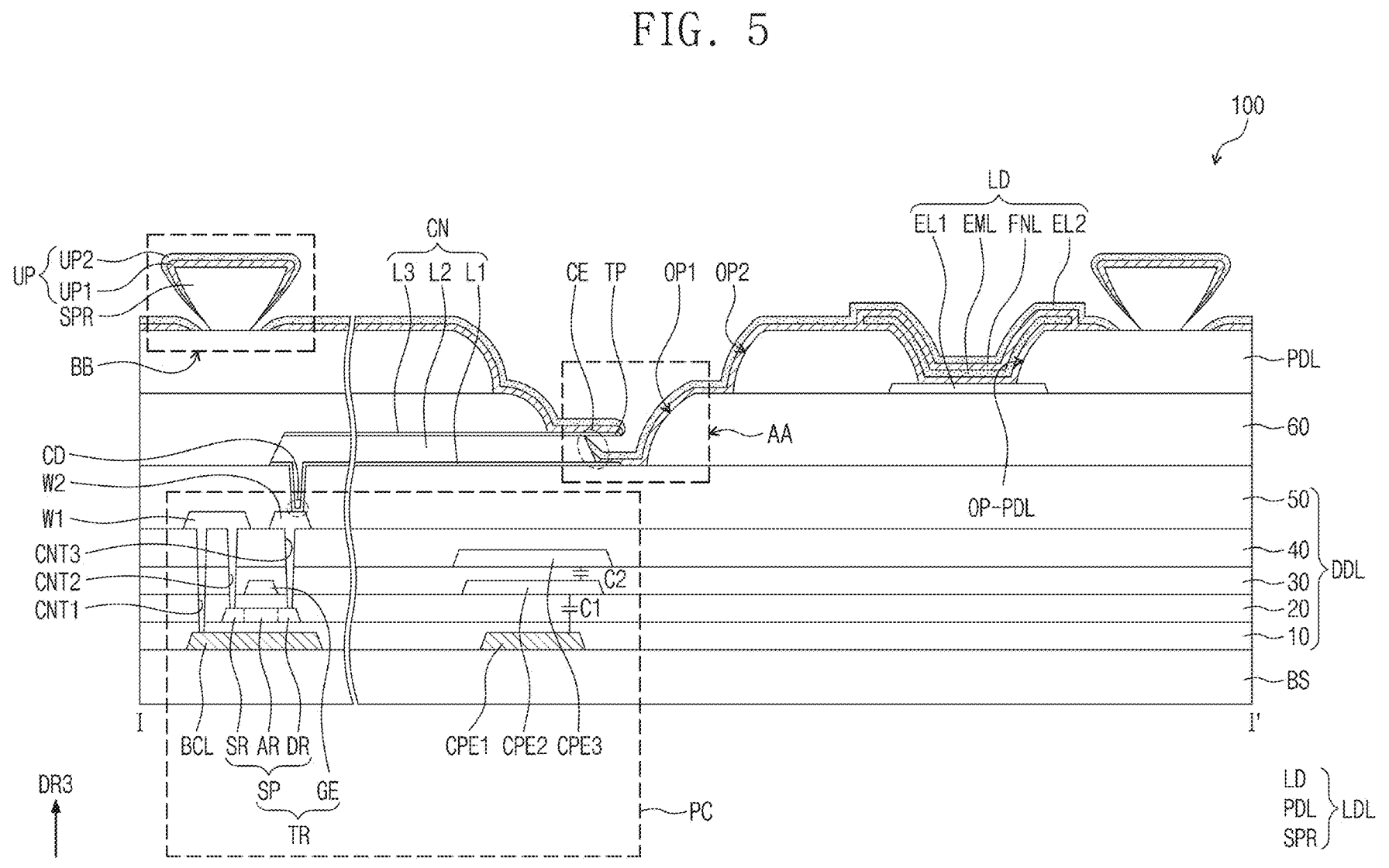

The connection lines CN may include an emission connection part CE (see FIG. 5) and a driving connection part CD (see FIG. 5). The emission connection part CE may be provided on one side of the connection line CN and the driving connection part CD may be provided to the other side of the connection line CN.

The driving connection part CD may be a part of the connection line CN and be connected to the pixel driving part PC. In the present embodiment, the driving connection part CD is connected to the drain of the sixth transistor T6 shown in FIG. 2A or the drain of the first transistor T1 shown in FIG. 2B. Accordingly, the position of the driving connection part CD may correspond to the position of the transistor (see a transistor TR in FIG. 5) physically connected with the connection line CN in the pixel driving part PC. The emission connection part CE may be a part of the connection line CN and be connected to the light emitting element. In the embodiment, the emission connection part CE is connected to a second electrode EL2 (see FIG. 5) (hereinafter, the cathode) of the light emitting element.

The light emitting unit UT includes first to third connection lines CN1, CN2, and CN3. The first connection line CN1 connects the light emitting element in the first light emitting part EP1 with the first pixel driving part PC1, the second connection line CN2 connects the light emitting element in the second light emitting part EP2 with the second pixel driving part PC2, and the third connection line CN3 connects the light emitting element in the third light emitting part EP3 with the third pixel driving part PC3.

Specifically, the first to third connection lines CN1, CN2, and CN3 connect the first to third cathodes EL2_1, EL2_2, and EL2_3 and the first to third pixel driving parts PC1, PC2, and PC3, respectively. The first connection line CN1 may include a first driving connection part CD1 connected to the first pixel driving part PC1 and the first emission connection part CE1 connected to the first cathode EL2_1. The second connection line CN2 may include a second driving connection part CD2 connected with the second pixel driving part PC2, and the second emission connection part CE2 connected with the second cathode EL2_2. The third connection line CN3 may include a third driving connection part CD3 connected with the third pixel driving part PC3 and the third emission connection part CE3 connected with the third cathode EL2_3.

The first to third driving connection parts CD1, CD2 and CD3 may be arranged along the first direction DR1. As described above, the first to third driving connection parts CD1, CD2, and CD3 may respectively correspond to the positions of connection transistors, for example, the sixth transistor T6 in FIG. 2A or of the first transistor T1 in FIG. 2B, constituting the first to third pixel driving parts PC1, PC2, and PC3. According to the inventive concept, the pixel driving parts PC may be designed equally for all the pixels regardless of the shape, the size, or an emission light color of the light emitting parts EP1, EP2, and EP3, and thus the process may be simplified and the cost may also be reduced.

In the present embodiment, the first to third emission connection parts CE1, CE2, and CE3 may not overlap the light emitting parts EP1, EP2, and EP3 in a plan view. As described above, the emission connection parts CE1, CE2, and CE3 is respectively provided at non-overlapping positions with the emitting openings OP-PDL (see FIG. 5), because the emission connection part CE (see FIG. 5) of the connection line CN is a part to which the light emitting element LD (see FIG. 5) is connected, and at which a tip part TP (see FIG. 5) is defined. In other words, the emission connection parts CE1, CE2, and CE3 may be respectively disposed at positions spaced apart from the light emitting parts EP1, EP2, and EP3 in the respective cathodes EL2_1, EL2_2, and EL2_3, and the cathodes EL2_1, EL2_2, and EL2_3 may include partial areas protruding from the light emitting parts EP1, EP2, and EP3 in a plan view in order to connect to the connection lines CN1, CN2, and CN3 at a position where the emission connection parts CE1, CE2, and CE3 are disposed.

For example, the first cathode EL2_1 includes a protruding part protruding from the first light emitting part EP1 to a non-overlapping position with the first light emitting part EP1 in order to connect to the first connection line CN1 at a position where the first emission connection part CE1 is disposed. The first emission connection part CE1 may be provided to the protruding part. Accordingly, the first cathode EL2_1 may be connected to the first connection line CN1 without reducing the emission area of the first light emitting part EP1.

As described above, the connection line CN includes the emission connection part CE (or a first connection part) and the driving connection part CD (or a second connection part). The first driving connection part CD1, which is disposed in an area corresponding to the position of the transistor TR, may be defined at a non-overlapping position with the first light emitting part EP1 in a plan view. According to the present embodiment, the first connection line CN1 is disposed to overlap the first light emitting part EP1, and thus the first cathode EL2_1 and the first pixel driving part PC1 spaced apart from each other may be easily connected.

The third driving connection part CD3 which is disposed in an area corresponding to the position of the transistor TR may be disposed at a non-overlapping position with the third light emitting part EP3 and disposed at an overlapping position with the third cathode EL2_3 in a plan view. According to the present embodiment, the third cathode EL2_3 is connected with the third pixel driving part PC3 through the third connection line CN3, and thus even when the position of the third driving connection part CD3 overlaps the third light emitting part EP3 in a plan view, the third pixel driving part PC3 and the third cathode EL2_3 may be easily connected. Accordingly, constraints in designing the third pixel driving part PC3 according to the position or shape of the third light emitting part EP3 may be reduced, and thus the degree of freedom of the design may be improved.

Referring to FIG. 4A again, the second row light emitting parts Rk+1 includes light emitting parts having the shape and arrangement which is in a linearly symmetry with the shape and arrangement of light emitting parts of the first row light emitting parts Rk with respect to an axis extending parallel to the first direction DR1. Here, the light emitting units UT21 and UT22 in the second row may include light emitting parts in which light emitting parts of the light emitting units UT11 and UT12 in the first row are shifted by one column in the first direction DR1. In other words, the light emitting unit UT21 in the second row and the first column may have the same shape as the light emitting unit UT12 in the first row and the second column, and the light emitting unit UT22 in the second row and the second column may have the same shape as the light emitting unit UT11 in the first row and the first column.

Accordingly, the shape and arrangement of the connection lines CN-c connected to the light emitting parts in the light emitting unit UT21 in the second row and the first column may be the same as that of the connection lines CN1b, CN2b, and CN3b connected to the light emitting parts in the light emitting unit UT12 in the first row and the second column. Similarly, the shape and arrangement of the connection lines CN-d connected to the light emitting parts in the light emitting unit UT22 in the second row and second column may be the same as that of the connection lines CN1a, CN2a, and CN3a connected to the light emitting parts in the light emitting unit UT11 in the first row and the first column.

Referring to FIG. 4C, the anode EL1 according to an embodiment of the inventive concept may be commonly provided to the plurality of light emitting parts EP1, EP2, and EP3. In other words, the anode EL1 may be provided in an integral shape to be disposed to overlap the light emitting parts EP1, EP2, and EP3 or the separator SPR. As described above, the first power supply voltage VDD is applied to the anode EL1 and a common voltage may be provided to all the light emitting parts EP1, EP2, and EP3. The anode EL1 may be connected to the first power line PL1 (see FIG. 2A), which provides the first power supply voltage VDD, in the non-display area NDA, or connected with the first power line PL1 in the display area DA, and is not limited to any one embodiment.

Meanwhile, a plurality of openings may be defined in the anode EL1 according to the present embodiment. The openings OP-EL1 are formed through the anode EL1. The openings OP-EL1 may be disposed at a non-overlapping area with the light emitting parts EP1, EP2, and EP3, and be disposed at an overlapping area with the separator SPR. some of the openings OP-EL1 may make it easy to release gas from an organic layer which is disposed below the anode EL1, for example, a sixth insulating layer 60 (see FIG. 5) to be described below. Therefore, degradation issue of the light emitting element LD caused by gas from the organic layer can be improved. Also, some of the openings OP-EL1 may overlap the emission connection parts CE to prevent the anode EL1 from shorting with the cathode.

According to the inventive concept, the light emitting parts which include cathodes not overlapping the connection transistors of the pixel driving parts may be easily connected to the pixel driving parts using connection lines. According to the inventive concept, due to the connection lines, the light emitting parts may be stably connected to the pixel driving parts without changing the design of the light emitting parts, but only by changing the shape of the cathode. Accordingly, the influence of the shape or arrangement of the light emitting parts on the connection with the pixel driving part may be reduced, and thus the degree of design freedom for the pixel driving part is enhanced, and a decrease in aperture ratio of the light emitting parts may be prevented.

FIG. 5 is a cross-sectional view of a display panel according to an embodiment of the inventive concept. FIG. 5 is a cross-sectional view showing a portion corresponding to a line I-I' of FIG. 4B.

Figure 6A:
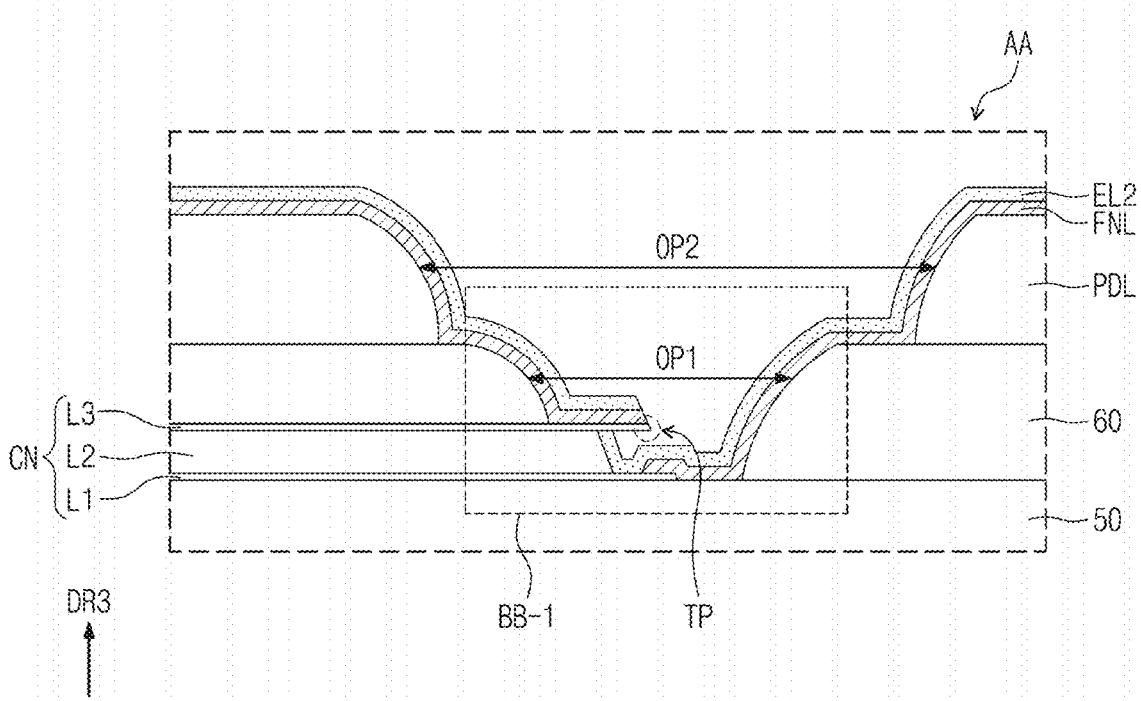
FIG. 6A is an enlarged cross-sectional view of a portion of a display panel according to an embodiment of the inventive concept.
Figure 6B:
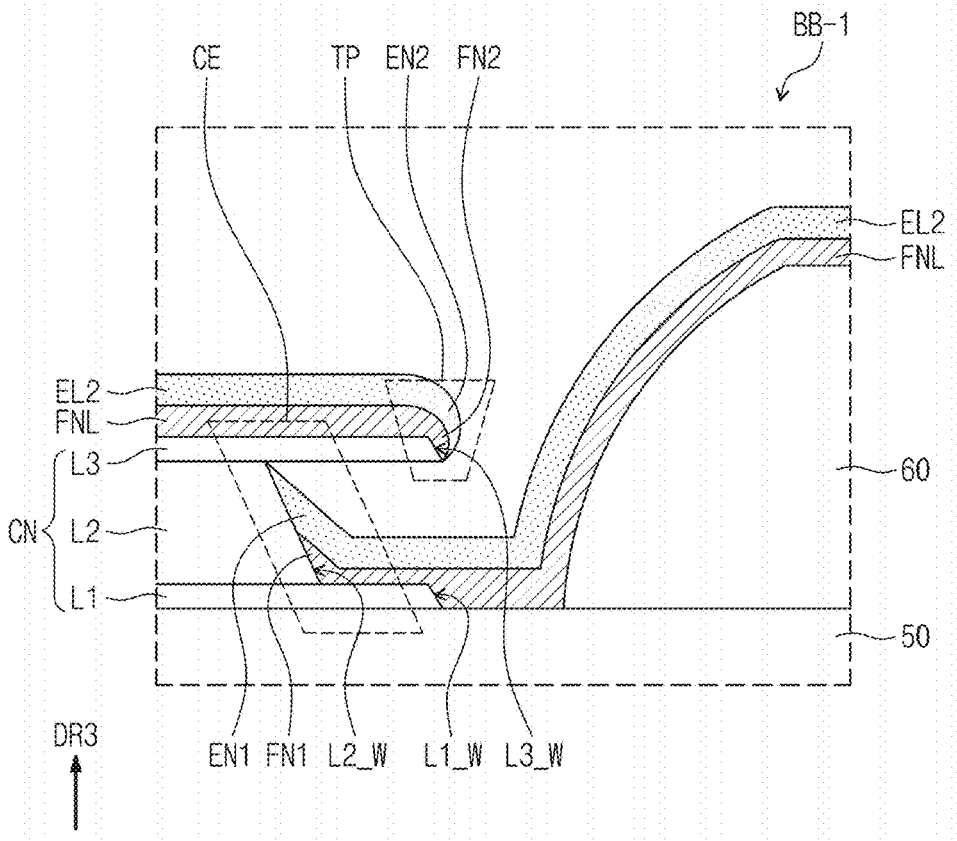
FIG. 6B is an enlarged cross-sectional view of a portion of a display panel according to an embodiment of the inventive concept.

FIG. 6A is an enlarged cross-sectional view of a portion of a display panel according to an embodiment of the inventive concept. FIG. 6B is an enlarged cross-sectional view of a portion of a display panel according to an embodiment of the inventive concept.

Referring to FIG. 5, a display panel 100 in an embodiment may include a base layer BS, driving element layer DDL, light emitting element layer LDL, encapsulating layer ECL, and input sensing layer ISL. The driving element layer DDL may include a plurality of insulation layers 10, 20, 30, 40, and 50 disposed on the base layer BS, and a plurality of conductive patterns and semiconductor patterns disposed between the insulation layers 10, 20, 30, 40, and 50 . . . . The conductive patterns and the semiconductor patterns are disposed between the insulation layers 10, 20, 30, 40, and 50 to constitute the driving element layer DDL. For easy description, FIG. 5 shows a cross section of any one region in the area in which one light emitting part is disposed.

The base layer BS may provide a base surface on which the pixel driving part PC is disposed. The base layer BS may be a rigid substrate, or a flexible substrate that is bendable, foldable, rollable or the like. The base layer BS may be a glass substrate, a metal substrate, a polymer substrate or the like. However, the embodiment of the inventive concept is not limited thereto, and the base layer BS may be an inorganic layer, an organic layer, or a composite material layer.

The base layer BS may have a multilayer structure. The base layer BS may include a first polymer resin layer, a silicon oxide ($SiO_x$) layer disposed on the first polymer resin layer, an amorphous silicon (a-Si) layer disposed on the silicon oxide layer, and a second polymer resin layer disposed on the amorphous silicon layer. The silicon oxide layer and the amorphous silicon layer may be referred to as a base barrier layer.

The polymer resin layer may include a polyimide-based resin. In addition, the polymer resin layer may include at least one among an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, and a perylene-based resin. Further, in the present specification, "~~"-based resin means that the resin includes a functional group of "~~."

The insulation layers or the conductive layers and the semiconductor layers each disposed on the base layer BS may be provided in a coating, deposition or the like manner. Then, through a plurality of times of a photolithography process, the organic layer, the inorganic layer, the semiconductor layer and the conductive layer are selectively patterned to provide a hole in the insulation layer, or the semiconductor patterns, the conductive patterns, the signal lines or the like may be provided.

On the base layer BS, the first to sixth insulation layers 10, 20, 30, 40, 50, and 60 and the pixel driving parts PC may be formed. FIG. 5 shows one transistor TR and two capacitors C1 and C2 in the pixel driving part PC. The transistor TR may correspond to a transistor connected to the light emitting element LD through the connection line CN, namely, a connection transistor connected to the fourth node ND4 in FIG. 2A or the third nod N3 in FIG. 2B, and specifically correspond to the sixth transistor T6 in FIG. 2A or the first transistor T1 in FIG. 2B. Meanwhile, although not shown in the drawing, other transistors constituting the pixel driving part PC may have the same structure as the transistor TR (hereinafter, the connection transistor) shown in FIG. 5. However, this describes an example, and the other transistors constituting the pixel driving part PC may have different structures. It should be understood that the embodiment of the inventive concept is not limited to any one embodiment.

The first insulation layer 10 may be disposed on the base layer BS. The first insulation layer 10 may include an inorganic layer and/or organic layer, and have a single layer or multilayer structure. The first insulation layer 10 may include at least one among aluminum oxide, titanium oxide, silicon oxide, silicon oxynitride, zirconium oxide, and hafnium oxide. In the present embodiment, the first insulation layer 10 is shown as a single silicon oxide layer. The other insulation layers to be described below may include an inorganic layer and/or organic layer, and have a single layer or multilayer structure. The inorganic layer may include at least one among the aforementioned materials, but is not limited thereto.

The first insulation layer 10 may cover a bottom conductive layer BCL. In other words, the display panel 100 may further include the bottom conductive layer BCL disposed to overlap the connection transistor TR in the bottom of the connection transistor TR. The bottom conductive layer BCL may block an electric potential caused by polarization of the base layer BS from influencing the connection transistor TR. In addition, the bottom conductive layer BCL may block light from being incident to the connection transistor TR from the bottom of the bottom conductive layer BCL. At least one of an inorganic barrier layer and a buffer layer may be further disposed between the bottom conductive layer BCL and the base layer BS.

The bottom conductive layer BCL may include a reflective metal. For example, the bottom conductive layer BCL may include titanium (Ti), molybdenum (Mo), an alloy containing molybdenum, aluminum (Al), an alloy containing aluminum, an aluminum nitride ($Al_xN_y$), tungsten (W), a tungsten nitride ($W_xN_y$), copper (Cu) and/or the like.

The bottom conductive layer BCL may be connected to the source electrode of the connection transistor TR through source electrode pattern W1. In this case, the bottom conductive layer BCL may have the same potential as the source electrode of the connection transistor TR. But the embodiment of the inventive concept is not limited to any one embodiment, and the bottom conductive layer BCL may be connected to the gate electrode GE of the connection transistor TR to have the same potential as the gate electrode GE of the connection transistor TR. In an embodiment, the bottom conductive layer BCL may independently receive the constant voltage or pulse signal from another electrode.

In an embodiment, the bottom conductive layer BCL may be in an isolated state from other electrodes or the lines. In this case, the connecting patterns, for example, the source electrode pattern W1 or such like, may be omitted. The bottom conductive layer BCL may be provided in various ways, and is not limited to any one embodiment.

The connection transistor TR is disposed on the first insulation layer 10. The connection transistor TR may include a semiconductor pattern SP and a gate electrode GE. The semiconductor pattern SP may be disposed on the first insulation layer 10. The semiconductor pattern SP may include an oxide semiconductor. For example, the oxide semiconductor may include a transparent conductive oxide (TCO) such as indium tin oxide (ITO), indium zinc oxide (IZO), indium gallium zinc oxide (IGZO), zinc oxide (ZnO), indium oxide ($In_2O_3$) or the like. However, the embodiment of the inventive concept is not limited thereto, and the semiconductor pattern SP may also include amorphous silicon, low-temperature polycrystalline silicon, or polycrystalline silicon.

The second insulation layer 20 may commonly overlap a plurality of pixels and cover the semiconductor pattern SP. The second insulation layer 20 may include an inorganic layer and/or an organic layer, and have a single layer or multilayer structure. The second insulation layer 20 may include at least one among aluminum oxide, titanium oxide, silicon oxide, silicon nitride, silicon oxynitride, zirconium oxide, and hafnium oxide. In the present embodiment, the second insulation layer 20 may be a single silicon oxide layer.

The semiconductor pattern SP may include a source region SR, a drain region DR, and an active region AR (or channel region) according to the degree of conductivity. The channel region AR may be a portion overlapping the gate electrode GE in a plan view. The source region SR and the drain region DR may be spaced apart from each other with the channel region AR interposed therebetween. When the semiconductor pattern SP is an oxide semiconductor, each of the source region SR and the drain region DR may be a reduced area. Accordingly, the source region SR and the drain region DR include a relatively higher reduced metal content in comparison to the active region AR. Alternatively, when the semiconductor pattern SP is polycrystalline silicon, each of the source region SR and the drain region DR may be an area doped at a high concentration.

The source region SR and the drain region DR may have a relatively higher conductivity than the channel CR. The source region SE may correspond to a source electrode of the connection transistor TR, and the drain region DR may correspond to the drain electrode of the connection transistor TR. Meanwhile, this shows an example. The connection transistor TR may be further provided with a separate source electrode and drain electrode respectively connected to the source region SR and the drain region DR. Specifically, the separate source electrode and drain electrode are respectively formed with one of lines constituting the pixel driving parts PC and PC-1 (refer to FIGS. 2A and 2B), and is not limited to any one embodiment.

The gate electrode GE is disposed on the second insulation layer 20. The gate electrode GE may correspond to the gate electrode of the connection transistor TR. In other words, the gate electrode GE may be a component connected to the emission control signal line ESLi (see FIG. 2A) or the first node N1 (See FIG. 2B).

The gate electrode GE may be disposed on the semiconductor pattern SP. However, this shows an example, and the gate electrode GE may be disposed in the lower side of the semiconductor pattern SP, and is not limited to any one embodiment.

The gate electrode GE may include titanium (Ti), silver (Ag), molybdenum (Mo), aluminum (Al), aluminum nitride ($Al_xN_y$), tungsten (W), tungsten nitride ($W_xN_y$), copper (Cu), an alloy thereof or the like, but is not particularly limited thereto.

A first capacitor electrode CPE1, a second capacitor electrode CPE2, the first insulating layer 10 and the second insulating layer 20 may constitute a first capacitor C1. The first capacitor electrode CPE1 and the second capacitor electrode CPE2 may be spaced apart from each other with the first insulation layer 10 and the second insulation layer 20 interposed therebetween.

In an embodiment of the inventive concept, the first capacitor electrode CPE1 and the bottom conductive layer BCL may have an integral shape. In addition, the second capacitor electrode CPE2 and the gate electrode GE may have an integral shape.

A third capacitor electrode CPE3 may be disposed on the third insulation layer 30. The third capacitor electrode CPE3 may be spaced apart from the second capacitor electrode CPE2 with the third insulation layer 30 interposed therebetween. The third capacitor electrode CPE3 may constitute the second capacitor C2 together with the second capacitor electrode CPE2 and the third insulating layer 30.

The fourth insulation layer 40 may be disposed on the third capacitor electrode CPE3.

A source electrode pattern W1 and a drain electrode pattern W2 may be disposed on the fourth insulation layer 40. The source electrode pattern W1 may be connected to the source region SR through the first contact hole CNT1. In addition, the source electrode pattern W1 may be connected to the bottom conductive layer BCL. The source electrode pattern W1 and the source region SR of the connection transistor TR may work as a source electrode of the connection transistor TR. The drain electrode pattern W2 may be connected to the drain region DR of the connection transistor TR through a second contact hole CNT2.

The fifth insulation layer 50 and the sixth insulation layer 60 may be disposed on the source electrode pattern W1 and the drain electrode pattern W2.

Each of the fifth insulation layer 50 and the sixth insulation layer 60 may be an organic layer. For example, each of the fifth insulation layer 50 and the sixth insulation layer 60 may include a general purpose polymer such as Benzocyclobutene (BCB), polyimide, Hexamethyldisiloxane (HMDSO), Polymethylmethacrylate (PMMA), or Polystyrene (PS), a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, or a blend thereof, etc.

The connection line CN is disposed between the fifth insulation layer 50 and the sixth insulation layer 60. A contact hole exposing at least a portion of the connection lines CN may be provided in the sixth insulation layer 60. One side of the connection line CN may be connected to the drain electrode pattern W2 of the connecting transistor TR through a contact hole formed in the fifth insulation layer 50 and the other side of the connection line CN may be connected to the second electrode EL2 of the light emitting element LD. In other words, the connection line CN connects the connection transistor TR and an electrode of the light emitting element LD. A detailed description thereabout will be provided below.

The emitting element layer LDL may be disposed on the sixth insulation layer 60. The emitting element layer LDL may include a pixel defining layer PDL, the light emitting element LD, and the separator SPR. The pixel defining layer PDL may be an organic layer. For example, the pixel defining layer PDL may comprise a general purpose polymer such as Benzocyclobutene (BCB), polyimide, Hexamethyldisiloxane (HMDSO), polymethylmethacrylate (PMMA) or Polystylene (PS), a polymer derivative having a phenol-based group, an acryl-based polymer, an imide-based polymer, an aryl-ether-based polymer, an amide-based polymer, a fluorine-based polymer, a p-xylene-based polymer, vinyl alcohol-based polymer, or blend thereof, or the like.

In an embodiment, the pixel defining layer PDL may have the light absorption property, and have, for example, a black color. The pixel defining layer PDL may include a black coloring agent. The black coloring agent may include a black dye or a black pigment. The black coloring agent may include carbon black, a metal such as chromium, or an oxide thereof. The pixel defining layer PDL may correspond to a light shielding pattern having the light shielding property.

A penetrating opening OP-PDL (hereinafter, an emitting opening) may be defined in a pixel defining layer PDL. The emitting opening OP-PDL may be provided in plurality to correspond to the light emitting elements LD respectively. The emitting opening OP-PDL may be an area in which all the components of the light emitting element LD overlap, and light emitted from the light emitting elements LD may be substantially emitted. Accordingly, the shape of the foregoing light emitting part EP (see FIGS. 3 and 4C) may substantially correspond to the shape of the emitting opening OP-PDL in a plan view. The light emitting element LD may include a first electrode EL1, a light emitting layer EML, a functional layer FNL, and a second electrode EL2. The first electrode EL1 may be a semi-permeable, permeable, or reflective electrode. According to an embodiment of the inventive concept, the first electrode EL1 may include a reflective layer composed of silver (Ag), magnesium (Mg), aluminum (Al), platinum (Pt), palladium (Pd), gold (Au), Nickel (Ni), neodymium (Nd), Iridium (Ir), Chromium (Cr), or a compound thereof, etc., and a transparent or semi-transparent electrode layer provided on the reflective layer. The transparent or semi-transparent electrode layer may include at least one selected from a group consisting of indium tin oxide (ITO), indium zinc oxide (IZO), indium gallium zinc oxide (IGZO), zinc oxide (ZnO), indium oxide (In$_2$O$_3$), and aluminum doped zinc oxide (AZO). For example, the first electrode EL1 may include a laminate structure of ITO/Ag/ITO.

In the present embodiment, the first electrode EL1 may be the anode of the light emitting element LD. In other words, the first electrode EL1 may be connected to the first power line PL1 (see FIGS. 2A and 2B), and receive the first power supply voltage VDD (see FIGS. 2A and 2B). The first electrode EL1 may be connected to the first power line PL1 in the display area DA (see FIG. 3), or connected to the first power line PL1 in the non-display area NDA (see FIG. 3). In the latter case, the first power line PL1 may be disposed in the non-display area NDA, and the first electrode EL1 may have a shape extending from the display area DA to the non-display area NDA.

In the present embodiment, the first electrode EL1 is shown as overlapping the emitting opening OP-PDL and not overlapping the separator SPR, but is not limited thereto. As described above, the first electrodes EL1 of the respective pixels may be integrally provided, and have a mesh shape in which openings are defined in some areas as shown in FIG. 4C. In other words, when the first power supply voltage VDD may be equally applied to the first electrodes EL1 of the plurality of respective light emitting elements LD, the shape of the first electrode EL1 may be provided in various ways, and is not limited to any one embodiment.

The light emitting layer EML and the functional layer FNL may be included in an intermediate layer ML. The intermediate layer ML may be disposed between the first electrode EL1 and the second electrode EL2. The light emitting layer EML may be disposed on the first electrode ELL The light emitting layer EML may be disposed in an area corresponding to the emitting opening OP-PDL. In other words, the light emitting layer EML may have an island pattern and be provided to respective emitting parts EP. When the light emitting layer EML has the island pattern and provided to the respective emitting parts EP, the light emitting layer EML may emit light of at least one color among blue, red, and green. However, the embodiment of the inventive concept is not limited thereto, and the light emitting layer EML may have an integral shape to be commonly provided to adjacent emitting parts EP. In this case, the light emitting layer EML may provide blue light, or white light.

The second electrode EL2 may be disposed on the light emitting layer EML. As described above, the second electrode EL2 is connected with the pixel driving part PC through the fourth node ND4 in FIG. 2A or the third node N3 in FIG. 2B. In the present embodiment, the second electrode EL2 may be electrically connected to the connection transistor TR through the connection line CN.

Meanwhile, the light emitting element LD may further include a function layer FNL disposed between the first electrode EL1 and the second electrode EL2. The functional layer FNL may control the movement of charges. For example, the functional layer FNL may be disposed between the light emitting layer EML and the second electrode EL2, or between the first electrode EL1 and the light emitting layer EML. The functional layer FNL may include at least one among an electron blocking layer, a hole transport layer, a hole injection layer, a hole blocking layer, an electron transport layer, an electron injection layer, and a charge generation layer. In FIG. 5, as an example of the function layer FNL, the electron transport layer is shown as disposed between the light emitting layer EML and the second electrode EL2, but the embodiment of the inventive concept is not limited thereto. If the movement of charges may be controlled, the electron transport layer may be disposed at various positions, such as between the first electrode EL1 and the light emitting layer EML, or between the second electrode EL2 and the light emitting layer EML, and the embodiment of the inventive concept is not limited to any one embodiment.

Meanwhile, the connection line CN according to the present embodiment may include a driving connection part CD and an emission connection part CE. The connection line CN will be described with reference to FIGS. 5 to 6B.

The driving connection part CD of the connection line CN may be connected to the pixel driving part PC, and be substantially connected to the connection transistor TR. In the present embodiment, the driving connection part CD may be connected to the drain electrode pattern W2 through the contact hole formed in the fifth insulating layer 50 to be connected to the drain region DR of the semiconductor pattern SP.

The emission connection part CE of the connection line CN may be connected to the light emitting element LD. The emission connection part CE may correspond to an area exposed from the sixth insulation layer 60, and directly connected to the second electrode EL2. Here, a tip part TP may be defined in the emission connection part CE.

Referring to FIG. 6A, the connection line CN may have a three-layer structure. Specifically, the connection line CN may include a first layer L1, a second layer L2, and a third layer L3 that are sequentially laminated. The first layer L1 may have a relatively thinner thickness than the second layer L2. For example, the first layer L1 may include titanium (Ti).

The second layer L2 includes a different material from the first layer L1. The second layer L2 may include a material having a higher etching rate than that of the first layer L1 to an etching solution. For example, the second layer L2 may include aluminum (Al). A side surface L2_W of the second layer L2 may be disposed in an inner side than a side surface L1_W of the first layer L1. In other words, the side surface L1_W of the first layer L1 may protrude outwards from the side surface L2_W of the second layer L2.

The third layer L3 includes a different material from the second layer L2. The third layer L3 may include a material having a lower etching rate than that of the second layer L2 to the etching solution. Thus, the connection line CN may have an undercut portion in the second layer L2. For example, the third layer L3 may include titanium (Ti).

The side surface L3_W of the third layer L3 may protrude outwards from the side surface L2_W of the second layer L2. The protruding portion of the third layer L3 in comparison to the second layer L2 may become the tip part TP.

The sixth insulation layer 60 and the pixel defining layer PDL expose the tip part TP. Specifically, a first opening OP1, which exposes one side of the connection line CN in which the tip part TP is defined, is formed in the sixth insulation layer 60, and a second opening OP2 overlapping the first opening OP1 may be formed in the pixel defining layer PDL. The planar area of the second opening OP2 may be at least equal to or larger than that of the first opening OP1.

The tip part TP will be described more specifically with reference to FIG. 6B. The second electrode EL2 may also be provided on a partial area of the sixth insulation layer 60 which is exposed by the second opening OP2. The second electrode EL2 is provided on the top surface of the sixth insulation layer 60 and also provided on the top surface of the tip part TP of the connection line CN exposed by the first opening OP1. Here, the second electrode EL2 may include one side EN1 disposed on the first layer L1 of the connection line CN and the other side EN2 disposed on the top surface of the tip part TP of the third layer L3 of the connection line CN. In other words, the second electrode EL2 may have a disconnected portion in the first opening OP1 near the tip part TP, and accordingly, the one side EN1 and the other side EN2 may be spaced apart from each other in the first opening OP1. The one side EN1 is provided along the side surface L2_W of the second layer L2 to contact the side surface L2_W of the second layer L2, and the other side EN2 is disposed on a side surface L3_W of the third layer L3. In other words, according to the inventive concept, the second electrode EL2 may be disconnected at the undercut portion of the connection line CN. One of the disconnected two parts of the second electrode EL2 directly contacts the second layer L2 having a relatively high conductivity to be electrically connected to the connection line CN.

Meanwhile, the functional layer FNL may also be disconnected at the undercut portion. One side FN1 of the functional layer FNL covers the first layer L1 and contacts the second layer L2. The other side FN2 of the functional layer FNL may cover the side surface L3_W of the third layer L3. Here, the one side EN1 of the second electrode EL2 has a relatively larger contact area with the side surface L2_W of the second layer L2 in comparison to the side FN1 of the functional layer FNL disposed adjacent to the one side EN1. A portion of the side surface L2_W of the second layer L2 which is not covered by the functional layer FNL may be covered by the second electrode EL2. Through the difference between deposition angles to be described below, the functional layer FNL is disconnected in the undercut portion, the area contacting with the side surface L2_W of the second layer L2 is maximally reduced, and the area contacted by the second electrode EL2 with the side surface L2_W of the second layer L2 maximally increases. Therefore, the second electrode EL2 may be easily connected to the second layer L2 without the functional layer FNL disposed between the second electrode EL2 and the second layer L2. Accordingly, the second electrode EL2 may be stably connected to the connection line CN without an additional patterning process or the like.

The light emitting element LD may include an organic light emitting material, an inorganic light emitting material, an organic-inorganic light emitting material, quantum dots, quantum rods, micro LEDs, or nano-LEDs.

Referring to FIG. 5 again, in the present embodiment, the display panel 100 may include the separator SPR. The separator SPR may be disposed on the pixel defining layer PDL. The second electrode EL2 and the functional layer FNL may be commonly provided to the plurality of pixels by means of an open mask. Here, the second electrode EL2 and the functional layer FNL may be divided by the separator SPR. As described above, the separator SPR may completely surround each of the light emitting parts EP1, EP2 and EP3 so that each of the light emitting parts EP1, EP2 and EP3 has the second electrode EL2 which is not connected to any other second electrode EL2 disposed in other light emitting part. In other words, the second electrode EL2 may be isolated from second electrodes EL2 disposed in adjacent pixels.

Figure 7:
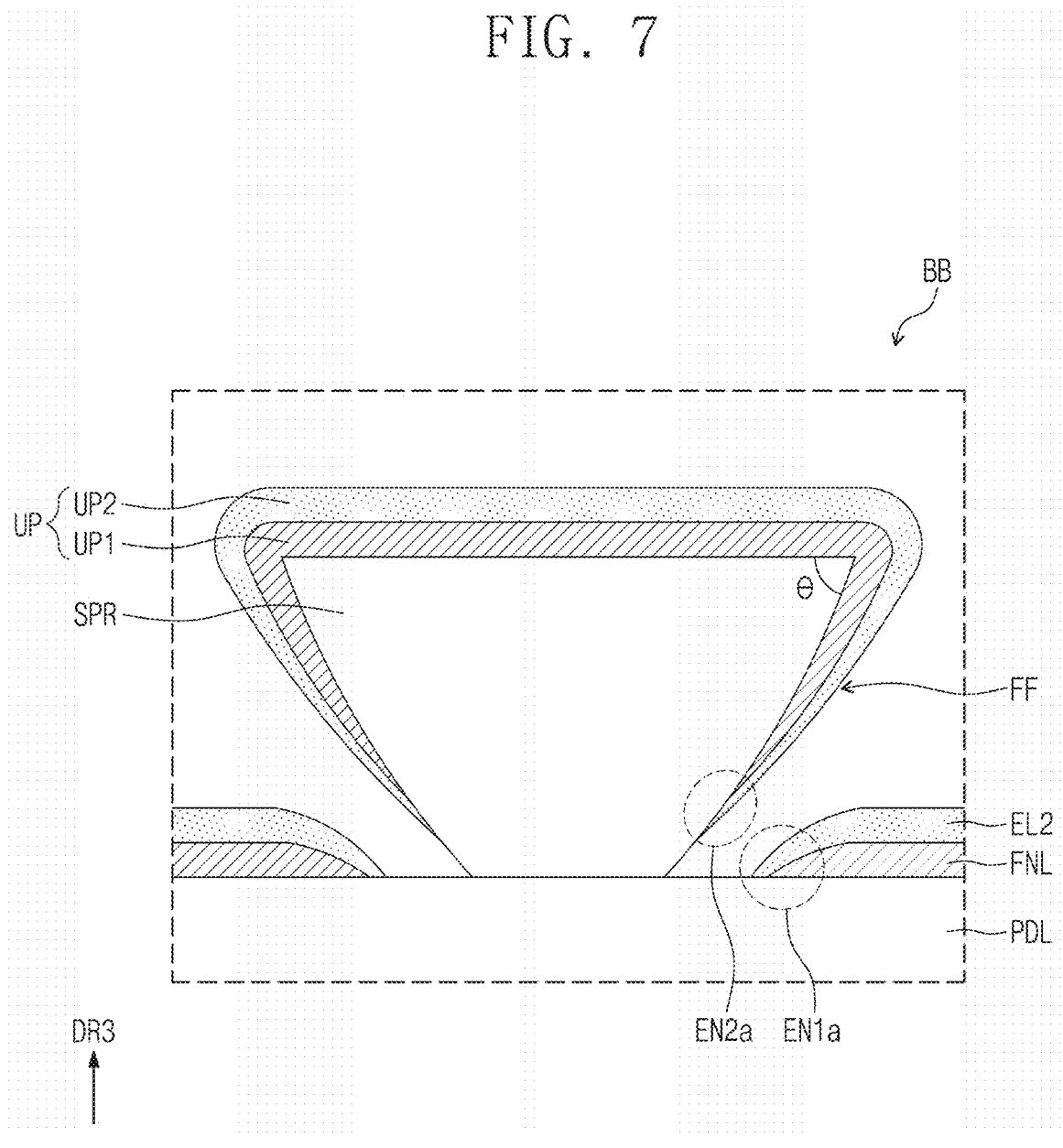
FIG. 7 is an enlarged cross-sectional view of a portion of a display panel according to an embodiment of the inventive concept.

The separator SPR will be described more specifically with reference to FIG. 7. FIG. 7 is an enlarged cross-sectional view of the separator SPR. Referring to FIG. 7, the separator SPR may be disposed on the pixel defining layer PDL.

The separator SPR may have an inverted taper shape. The angle θ of the upper corner of the separator SPR may be about 70° to about 90°, for example, about 90°.

The separator SPR may include an organic insulating material. The functional layer FNL and the second electrode EL2 may be disconnected by the separator SPR. The functional layer FNL and the second electrode EL2 may be disconnected by the separator SPR from the function layer FNL and the second electrode EL2 included in an adjacent light emitting element LD. A first side EN1a and a second side EN2a may be disposed on the pixel defining layer PDL and a side surface FF of the separator SPR, respectively. The first side EN1a may be spaced apart from the separator SPR. The second side EN2a may be separated from the first side EN1a under the separator SPR. In FIG. 7, the first side EN1a is shown as spaced apart by a prescribed interval from the side surface FF of the separator SPR, but the embodiment of the inventive concept is not limited thereto. The first side EN1a may also contact the side surface FF of the separator SPR.

Meanwhile, the first side EN1a and the second side EN2a may be electrically disconnected. In other words, even though the first side EN1a and the second side EN2a are physically connected with each other, if the thickness of a connection portion along the side surface FF of the separator SPR is thin enough not to be electrically connected, the second electrode EL2 may be disconnected by the separator SPR.

A dummy layer UP may be disposed on the top of the separator SPR. The dummy layer UP may include a first dummy layer UP1 disposed on the separator SPR and a second dummy layer UP2 disposed on the first dummy layer UP1. The first dummy layer UP1 may include a material of the functional layer FNL, and the second dummy layer UP2 may include a material of the second electrode EL2. In other words, the first dummy layer UP1 and the second dummy layer UP2 may be provided in the manufacturing processes of the functional layer FNL and the second electrode EL2, respectively. In another embodiment of the inventive concept, the dummy layer UP may be omitted.

According to the inventive concept, although there is not an additional patterning process using a mask, the second electrode EL2 or the functional layer FNL is not provided or is provided thinly on the side surface FF of the separator SPR in processes of forming the second electrode EL2 and the functional layer FNL, and thus the second electrode EL2 or the functional layer FNL may be easily disconnected for each pixel. However, this shows an example, and if the second electrode EL2 and the functional layer FNL may be disconnected, the shape of the separator SPR may vary in various ways, and is not limited to any one embodiment.

Referring to the above-described FIGS. 4A to 7, the display panel 100 according to an embodiment may include the emission connection part CE and the driving connection part CD, which are spaced apart from each other, and thus the positions of the light emitting elements LD may be designed without being limited to the positions of the pixel driving parts PC. In addition, according to the inventive concept, the display panel 100 may include the connection line CD, and thus the second electrode EL2, which is disposed above the first electrode EL1 serving as the anode, may be easily electrically connected with the pixel driving part PC. Accordingly, an inverted type light emitting element may be easily implemented while using the same layer structure of the existing non-inverted type light emitting element. In addition, according to the inventive concept, the tip part TP is provided in the connection line CN, and thus an organic layer such as the functional layer FNL may be easily disconnected without an additional patterning process. In addition, through the control of the deposition angle, electrical connection between the second electrode EL2 and the connection line CN may be easily implemented.

Meanwhile, the connection transistor TR connected with the driving connection part CD of the connection line CN may vary in various ways according to the configuration of the pixel driving parts PC and PC-1 (see FIGS. 2A and 2B). For example, when the display panel 100 according to an embodiment of the inventive concept is designed by means of the pixel driving part PC shown in FIG. 2A, the transistor connected to the driving connection part CD of the connection line CN may be the sixth transistor T6 (see FIG. 2A). Alternatively, when the display panel 100 is designed by means of the pixel driving part PC-1 shown in FIG. 2B, the transistor connected with the driving connection part CD of the connection line CN may be the first transistor T1 (see FIG. 2B). If used for electrical connection between the second electrode EL2 of the light emitting element LD and the pixel driving parts PC and PC-1, the connection line CN may be connected to various transistors constituting the pixel driving parts PC and PC-1, and is not limited to any one embodiment.

Figure 8A:
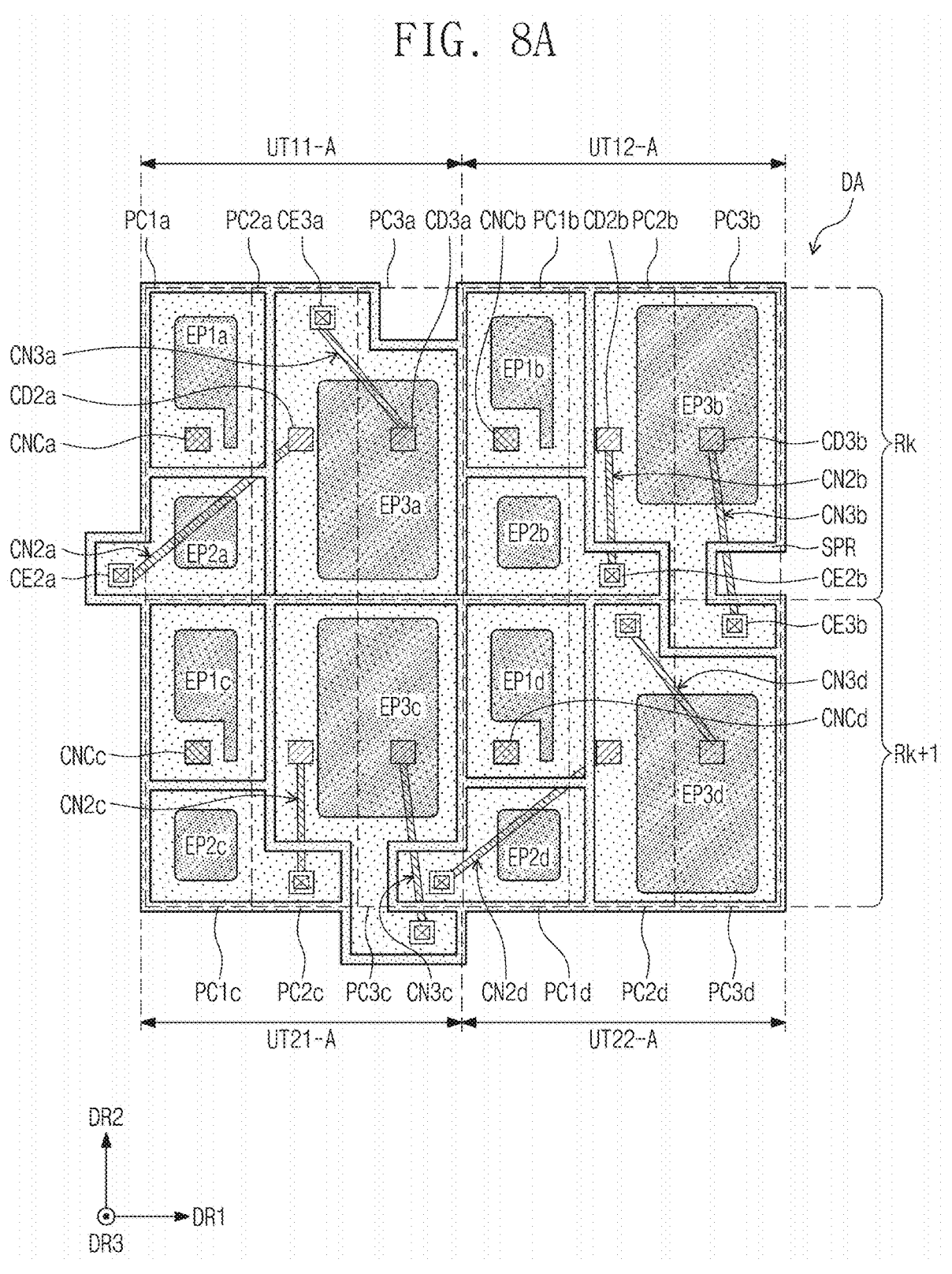
Figure 8B:
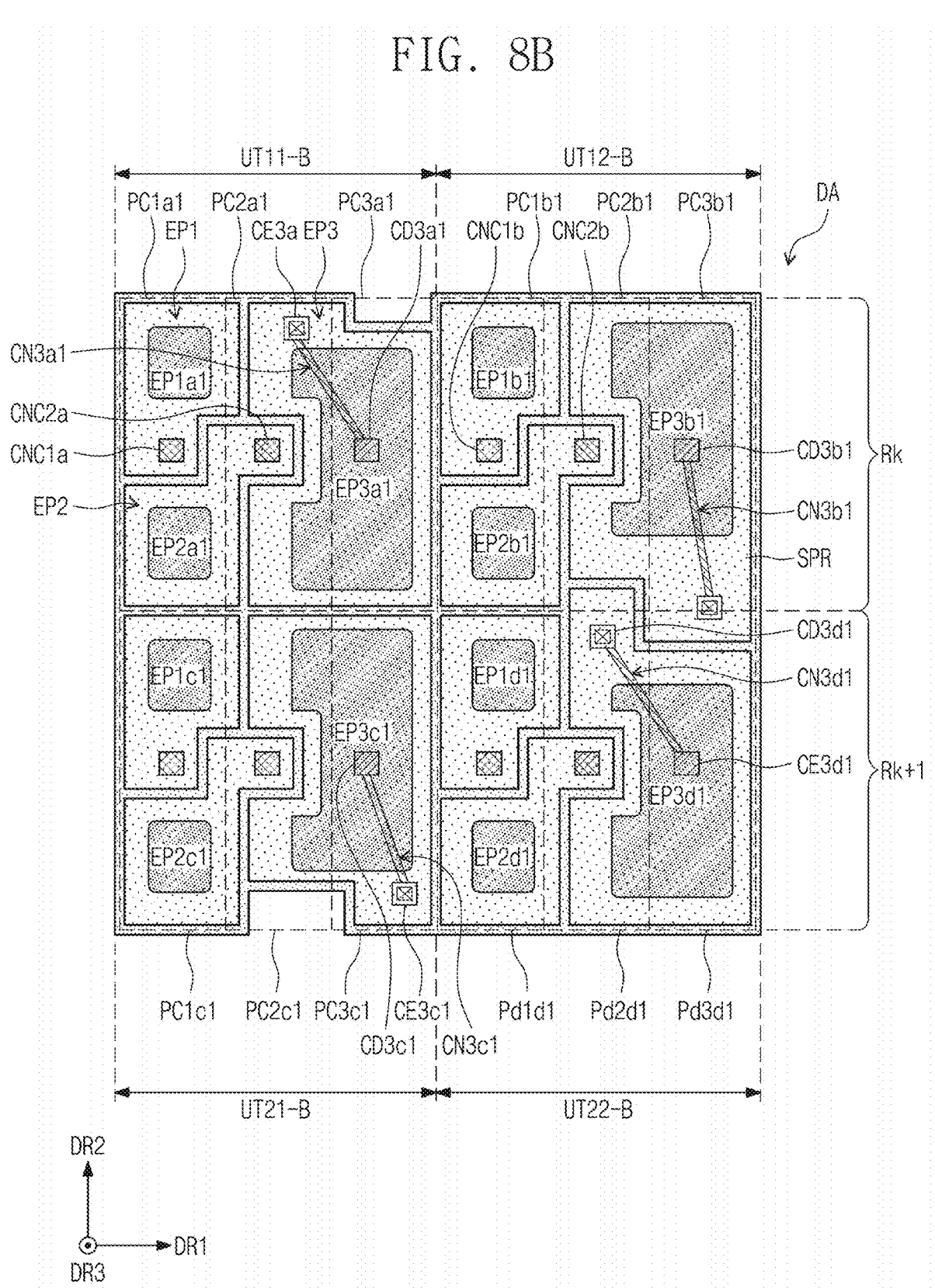
FIG. 8B is an enlarged plan view of a portion of a display panel according to an embodiment of the inventive concept.

FIG. 8A is an enlarged plan view of a portion of a display panel according to an embodiment of the inventive concept. FIG. 8B is an enlarged plan view of a portion of a display panel according to an embodiment of the inventive concept. Each of FIGS. 8A and 8B shows another embodiment of the inventive concept for a portion of the area in FIG. 3.

In FIG. 8A, the light emitting units UT11-A, UT12-A, UT21-A, and UT22-A in two rows and two columns are shown. The first row light emitting parts Rk may include light emitting parts in which the light emitting unit UT11-A in the first row and the first column and the light emitting unit UT12-A in the first row and the second column are repeatedly arranged along the first direction DR1. In other words, although not shown in the drawing, the light emitting unit in the first row and the third column has the same shape as the light emitting unit UT11-A in the first row and the first column, and the light emitting unit in the first row and the fourth column has the same shape as the light emitting unit UT12-A in the first row and the second column.

Similarly, the second row light emitting parts Rk+1 may include light emitting parts in which the light emitting unit UT21-A in the second row and the first column and the light emitting unit UT22-A in the second row and the second column are repeatedly arranged along the first direction DR1. In other words, although not shown in the drawing, the light emitting unit in the second row and the third column has the same shape as the light emitting unit UT21-A in the second row and the first column, and the light emitting unit in the second row and the fourth column has the same shape as the light emitting unit UT22-A in the second row and the second column.

In other words, the display panel according to an embodiment of the inventive concept may include light emitting parts corresponding to those of the four light emitting units UT11-A, UT12-A, UT21-A, and UT22-A shown in FIG. 8A repeatedly arranged along the first direction DR1 and the second direction DR2. Meanwhile, this shows an example, and in the display panel according to an embodiment of the inventive concept, the arrangement or shape of the light emitting parts may vary in various ways, and is not limited to any one embodiment.

The light emitting unit UT11-A in the first row and the first column may include first to third light emitting parts EP1a, EP2a, and EP3a in the first row and the first column, and the light emitting unit UT12-A in the first row and the second column may include first to third light emitting parts EP1b, EP2b, and EP3b in the first row and the second column.

As described above, the pixel driving parts in the same row (Rk or Rk+1) are sequentially arranged along the first direction DR1, and each of the connection transistors TR (see FIG. 5) may be arranged at the same position along the first direction DR1. Accordingly, the connection transistors TR of the pixel driving parts PC1a, PC2a, PC3a, PC1b, PC2b, and PC3b in the first row and the first column and in the first row and the second column, which are respectively connected to the light emitting units UT11-A and UT12-A in the first row and the first and second columns, may be arranged along the first direction DR1. Accordingly, the driving connection parts CD1a (or CNCa), CD2a, CD3a, CD1b (or CNCb), CD2b, and CD3b of the connection lines CN1a (not shown in FIG. 8A), CN2a, CN3a, CN1b (not shown in FIG. 8A), CN2b, and CN3b in the first row and the first column and in the first row and the second column may be disposed at the positions arranged along the first direction DR1.

The emission connection parts CE1a (or CNCa), CE2a, CE3a, CE1b (or CNCb), CE2b, and CE3b of the connection lines CN1a (not shown in FIG. 8A), CN2a, CN3a, CN1b (not shown in FIG. 8A), CN2b, and CN3b in the first row and the first column and in the first row and the second column may be defined at non-overlapping positions with the light emitting parts EP1a, EP2a, EP3a, EP1b, EP2b, and EP3b in a plan view. The emission connection parts CE1a (or CNCa), CE2a, CE3a, CE1b (or CNCb), CE2b, and CE3b may be disposed up and down with respect to the driving connection parts CD1a (or CNCa), CD2a, CD3a, CD1b (or CNCb), CD2b, and CD3b. In the present embodiment, one emission connection part CE3a connected to the light emitting unit UT11-A in the first row and the first column is disposed in an upper side of the driving connection parts CD1a (or CNCa), CD2a, CD3a, CD1b (or CNCb), CD2b, and CD3b, and two emission connection parts CE2b and CE3b connected to the light emitting unit UT12 in the first row and the second column are disposed in a lower side of the driving connection parts CD1a (or CNCa), CD2a, CD3a, CD1b (or CNCb), CD2b, and CD3b.

According to the inventive concept, the emission connection parts CE1a (or CNCa), CE2a, CE3a, CE1b (or CNCb), CE2b, and CE3b are disposed up or down with respect to the driving connection parts CD1a (or CNCa), CD2a, CD3a, CD1b (or CNCb), CD2b, and CD3b, and thus the emission connection parts CE1a (or CNCa), CE2a, CE3a, CE1b (or CNCb), CE2b, and CE3b may be distributed uniformly in the light emitting units UT11-A and UT12-A. Accordingly, the possibility that the connection lines CN1a (not shown in FIG. 8A), CN2a, CN3a, CN1b (not shown in FIG. 8A), CN2b, and CN3b cross each other may be reduced, the electrical reliability may be enhanced, and the degree of design freedom may increase.

In the present embodiment, at least some of the light emitting parts EP1a, EP2a, EP3a, EP1b, EP2b, and EP3b may be directly connected to the pixel driving parts PC1a, PC2a, PC3a, PC1b, PC2b, and PC3b. For example, the first light emitting part EP1a in the first row and the first column in the light emitting unit UT11-A in the first row and the first column may be connected to the pixel driving part PC1a in the first row and the first column through a contact part CNCa (or a connection part). The second electrode EL2_1 (see FIG. 4B) constituting the first light emitting part EP1a in the first row and the first column may overlap the pixel driving part PC1a in the first row and the first column, and may overlap the connection transistor TR. In other words, in the first light emitting part EP1a in the first row and the first column, a portion, which does not overlap the light emitting part EP1a in the second electrode EL2_1, may overlap the connection transistor of the pixel driving part PC1a. Here, the second electrode EL2_1 may be directly connected to the pixel driving part PC1a through the contact part CNCa without a separate connection line.

In the inventive concept, the emission connection part CE (see FIG. 5) and the driving connection part CD (see FIG. 5) may be defined at the same position along the first direction DR1 in a plan view to provide the contact part CNCa. In other words, the contact part CNCa may correspond to an area in which the connection transistor TR (see FIG. 5) of the first pixel driving part PC1a is disposed. Accordingly, the contact parts CNCa and CNCb may be disposed at positions aligned with the driving connection parts CD2a, CD3a, CD2b, and CD3b in the first direction DR1.

Similarly, the light emitting unit UT21-A in the second row and the first column may include first to third light emitting parts EP1c, EP2c, and EP3c and first to third pixel driving parts PC1c, PC2c, PC3c in the second row and the first column, and the light emitting unit UT22-A in the second row and the second column may include first to third light emitting parts EP1d, EP2d, and EP3d and first to third pixel driving parts PC1d, PC2d, PC3d in the second row and the second column. In the same manner, the emission connection parts CE1c (or CNCc), CE2c, CE3c, CE1d (or CNCd), CE2d, and CE3d are disposed up or down with respect to the driving connection parts CD1c (or CNCc), CD2c, CD3c, CD1d (or CNCd), CD2d, and CD3d, and thus the emission connection parts CE1c (or CNCc), CE2c, CE3c, CE1d (or CNCd), CE2d, and CE3d may be distributed uniformly in the light emitting units UT21-A and UT22-A. Accordingly, the possibility that the connection lines CN1c (not shown in FIG. 8A), CN2c, CN3c, CN1d (not shown in FIG. 8A), CN2d, and CN3d cross each other may be reduced, the electrical reliability may be enhanced, and the degree of design freedom may increase.

Alternatively, as shown in FIG. 8B, in one light emitting unit UT11-B, two light emitting parts EP1a1 and EP2a1 may be directly connected to the pixel driving parts PC1a1 and PC2a1 through the contact parts CNC1a and CNC2a, and only one light emitting part EP3a1 may be connected to the pixel driving part PC3a1 through the connection line CN3a1. Here, the second light emitting part EP2a1 in the first row and the first column may include a second electrode including a portion protruding to overlap a corresponding pixel driving part PC2a1, and the contact part CNC2a may be disposed in the protruding portion. According to the inventive concept, the contact parts CNC1a, CNC2a, CD3a1, CNC1b, CNC2b, and CD3b are arranged along the first direction DR1, and the shapes of the second electrodes are modified to overlap the contact parts CNC1a, CNC2a, CNC1b, and CNC2b, respectively. Accordingly, the pixel driving parts may be stably connected to the second electrodes without additional connection lines. In addition, the shapes of the light emitting parts may be modified so as not to overlap the contact parts CNC1a, CNC2a, CNC1b, and CNC2b, and thus, the pixel driving part and the second electrode may be easily connected without decreasing the aperture ratio of the light emitting parts.

Meanwhile, in the present embodiment, the second row light emitting parts Rk+1 may include light emitting parts in which the first row light emitting parts Rk are shifted by one column along the first direction DR1. In other words, the light emitting unit UT21-B in the second row and the first column may have the same shape as the light emitting unit UT12-B in the first row and the second column, and the light emitting unit UT22-B in the second row and the second column may have the same shape as the light emitting unit UT11-B in the first row and the first column.

Accordingly, the shape and an arrangement of the connection lines CN3$c$1 connected to the pixel driving parts PC1$c$1, PC2$c$1, PC3$c$1 of the light emitting unit UT21-B in the second row and the first column may be the same as those of the connection lines CN3$b$1 connected to the pixel driving parts PC1$b$1, PC2$b$1, PC3$b$1 of the light emitting unit UT12-B in the first row and the second column. Similarly, the shape and an arrangement of the connection lines CN3$d$1 connected to the pixel driving parts PC1$d$1, PC2$d$1, PC3$d$1 of the light emitting unit UT22-B in the second row and the second column may be the same as those of the connection lines CN3$a$1 connected to the pixel driving parts PC1$a$1, PC2$a$1, PC3$a$1 of the light emitting unit UT11-B in the first row and the first column.

According to the inventive concept, the cathode of the light emitting part may not overlap the connection transistor of the pixel driving part and a connection line may be further included, thereby the cathode of the light emitting part may be easily connected to the pixel driving part. According to the inventive concept, due to the connection lines, the light emitting part may be stably connected to the pixel driving part without changing the design of the light emitting part, but only by changing the shape of the cathode. Accordingly, the influence of the shape or arrangement of the light emitting part on the connection with the pixel driving part may be reduced, and thus the degree of design freedom for the pixel driving part is enhanced, and a decrease in aperture ratio of the light emitting parts may be prevented.

Figure 9:
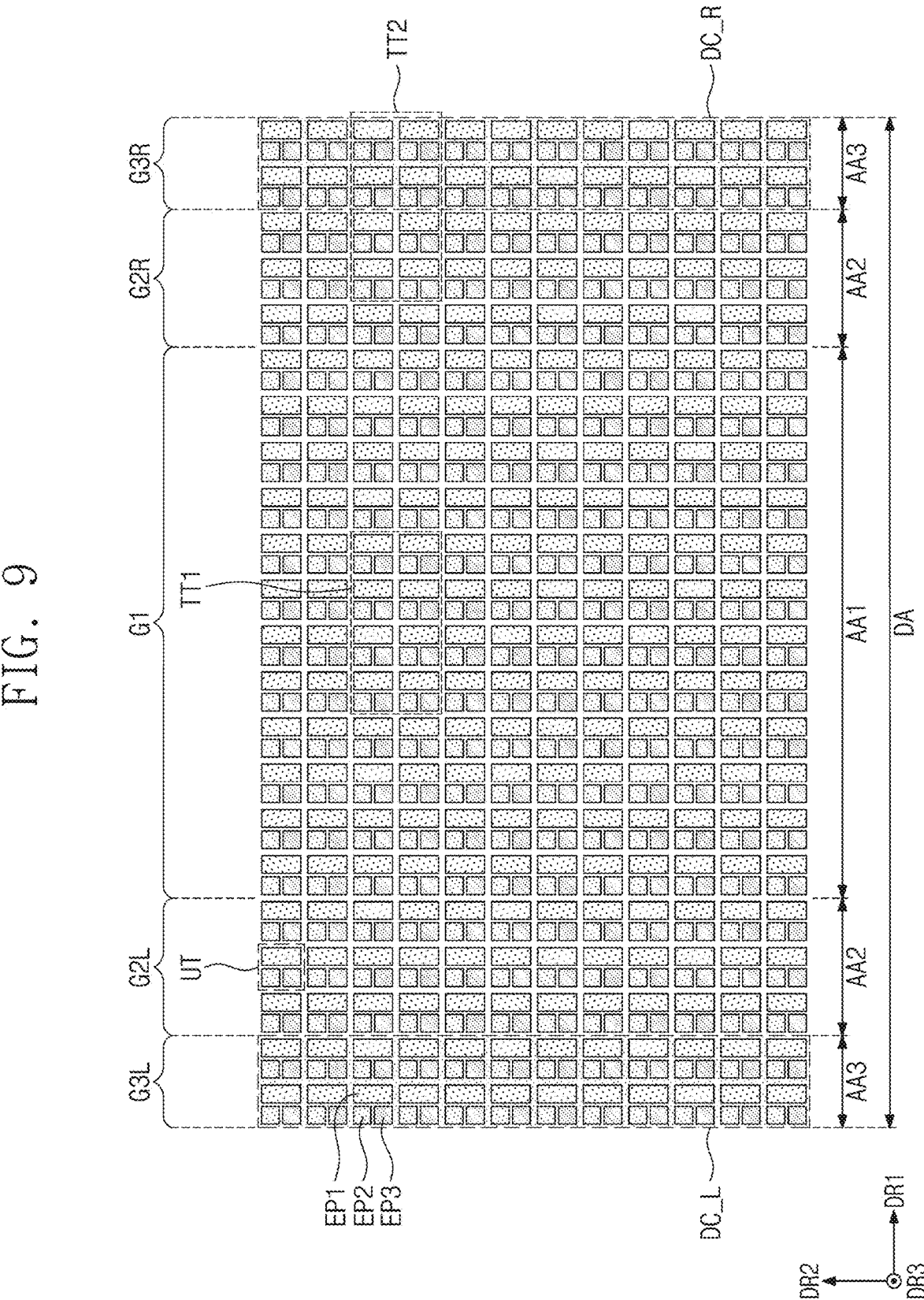
FIG. 9 is a plan view of a display panel according to an embodiment of the inventive concept.
Figure 10A:
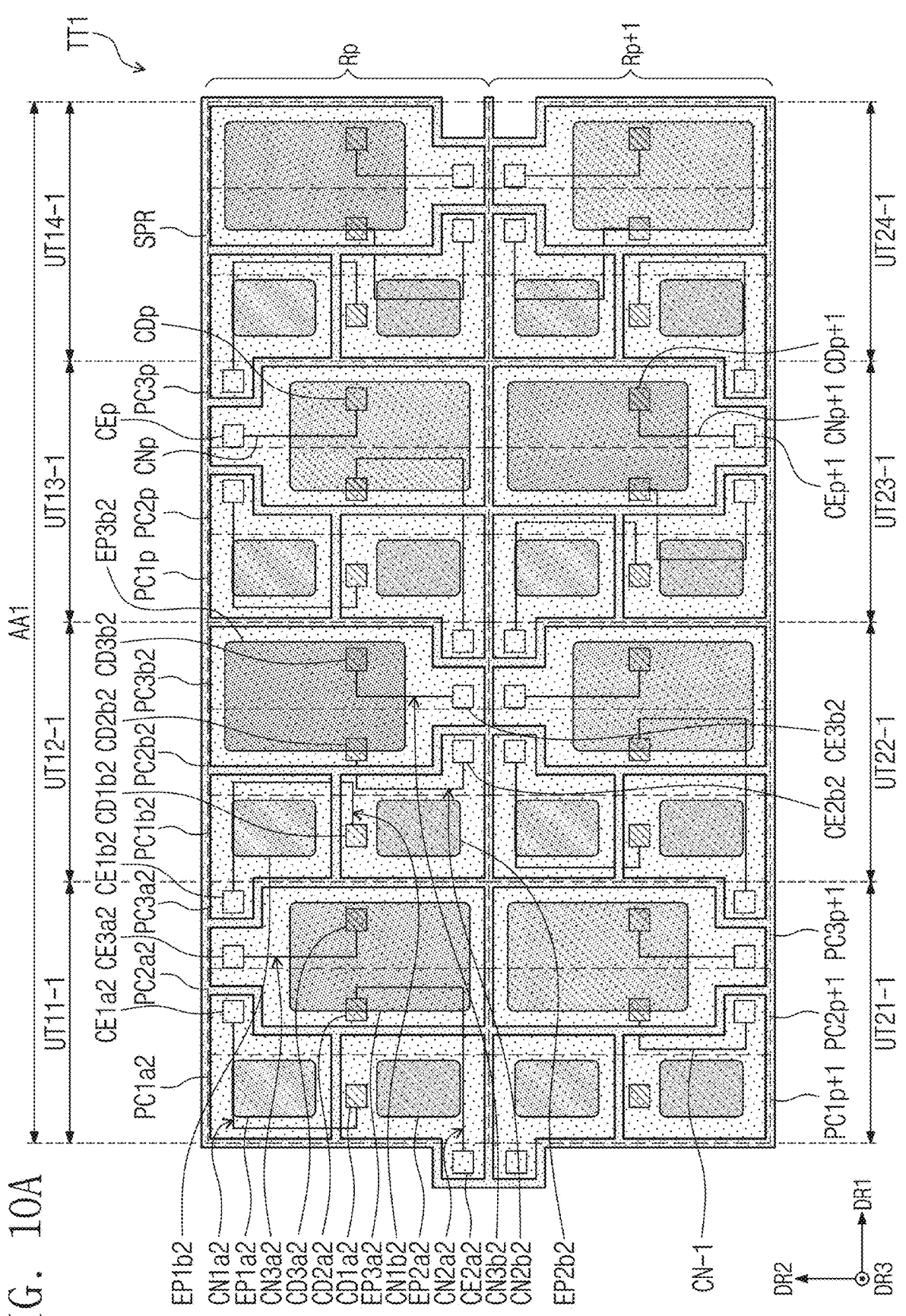
FIG. 10A is an enlarged plan view of an area TT1 in FIG. 9.

FIG. 9 is a plan view of a display panel according to an embodiment of the inventive concept. FIG. 10A is an enlarged plan view of an area TT1 in FIG. 9. FIG. is an enlarged plan view of an area TT2 in FIG. 9. FIG. 10C is an enlarged plan view of a portion in FIG. 10B.

As shown in FIG. 9, the light emitting units UT including the light emitting parts EP1, EP2, and EP3 may be disposed in the display area DA, and the display area DA may include a first area AA1, a second area AA2, and a third area AA3. The first area AA1 may be disposed at the center of the display area DA, and the light emitting parts EP1, EP2, and EP3 and a pixel driving part connected thereto overlap each other in a plan view. The light emitting units UT disposed in the first area AA1 constitute a first group G1 of the light emitting units UT.

The third area AA3 may be an area in which driving parts DC_R and DC_L are disposed. The driving parts DC_R and DC_L may correspond to the scan driving part SDC in FIG. 3. In the present embodiment, the driving parts DC_R and DC_L may be provided in plurality and include a left driving part DC_L and a right driving part DC_R. The third area AA3 may be provided in plurality and spaced apart from each other with the first area AA1 and the second area AA2 interposed therebetween. The third area AA3 is disposed with the light emitting units UT constituting third groups G3L and G3R. The third groups G3L and G3R may include a left third group G3L and a right third group G3R.

The second area AA2 may be disposed between the first area AA1 and the third area AA3 and overlaps the pixel driving part in a plan view, but the light emitting parts EP1, EP2, and EP3 may be disposed at the positions spaced apart from the pixel driving parts connected to the light emitting parts EP1, EP2, and EP3 in a plan view. The light emitting units UT disposed in the second area AA2 constitute second groups G2R and G2L. In the present embodiment, since the third area AA3 is provided in plurality, the second area AA2 may be also provided in plurality and spaced apart from each other with the first area AA1 interposed therebetween. The second groups G2L and G2R may include a left second group G2L and a right second group G2R.

Figure 10B:
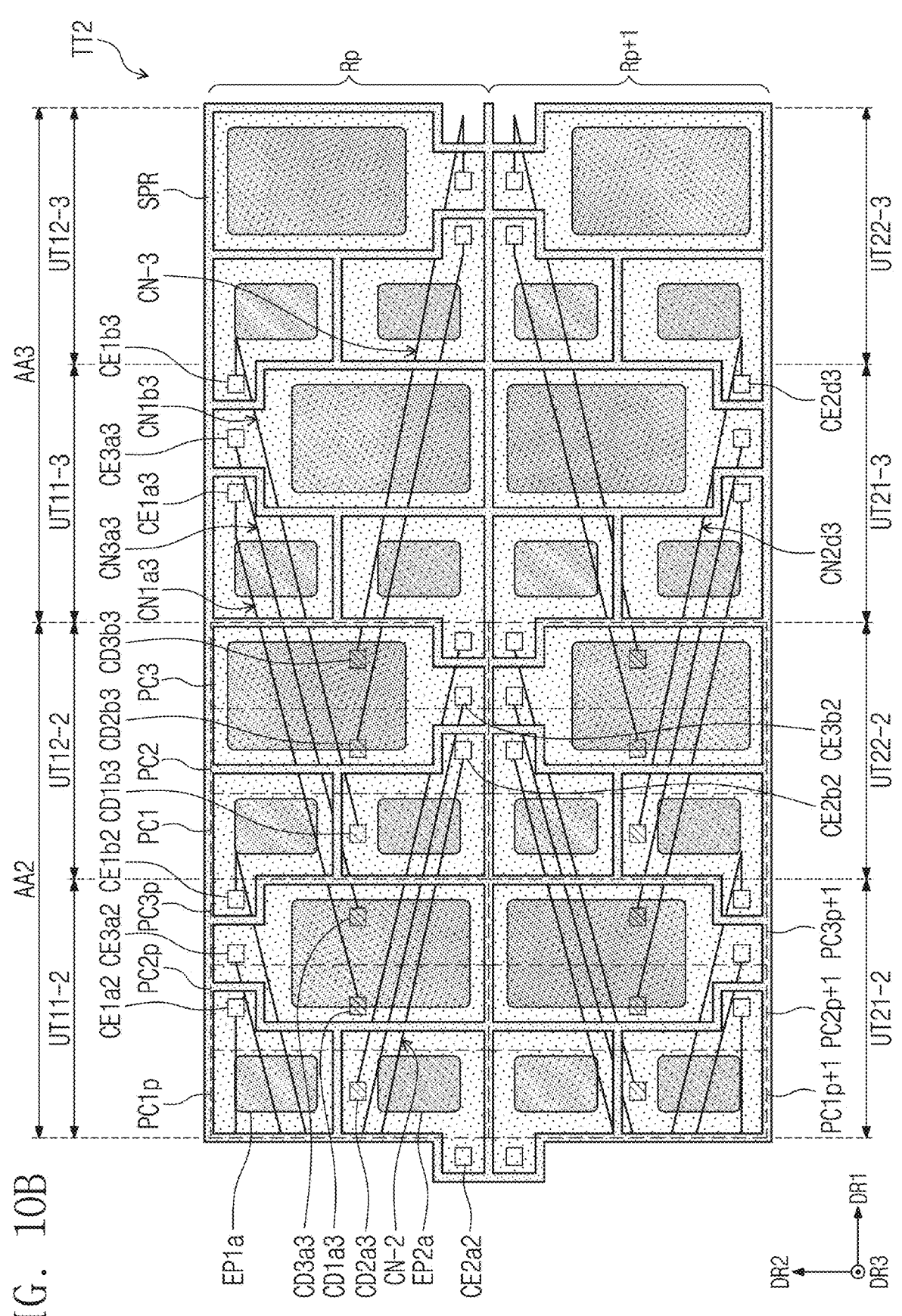
FIG. 10B is an enlarged plan view of an area TT2 in FIG. 9.
Figure 10C:
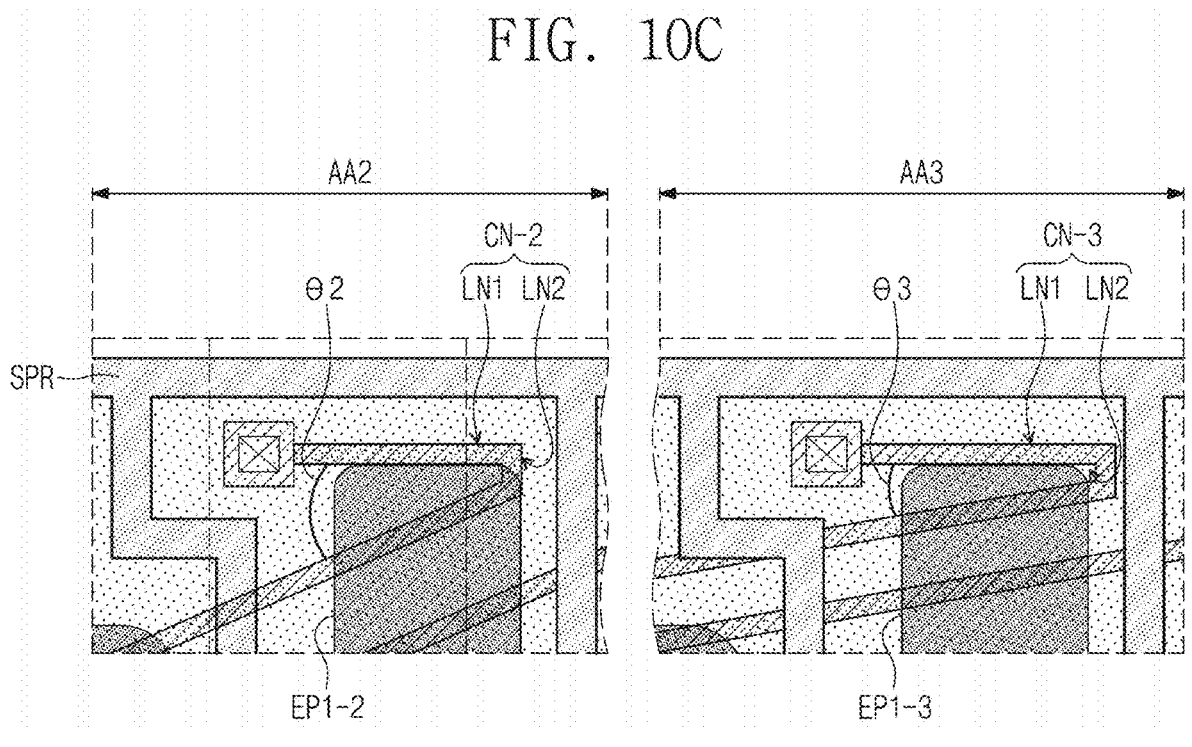
FIG. 10C is an enlarged plan view of a portion in FIG. 10B.

The area TT1 shown in FIG. 10A and the area TT2 shown in FIG. 10B may be two areas having the same area but different positions in the same row. FIG. 10A shows two rows and four columns of the light emitting units UT11-1, UT12-1, UT13-1, UT14-1, UT21-1, UT22-1, UT23-1, and UT24-1 disposed in the first area AA1. FIG. shows two rows and two columns of light emitting units UT11-2, UT12-2, UT21-2, and UT22-2 disposed in the second area AA2, and two rows and two columns of light emitting units UT11-3, UT12-3, UT21-3, and UT22-3 disposed in the third area AA3. The light emitting units UT11-2, UT12-2, UT11-3, UT12-3, UT21-2, UT22-2, UT21-3, and UT22-3 shown in FIG. 10B may substantially include the light emitting parts arranged in the same type as the light emitting units UT11-1, UT12-1, UT13-1, UT14-1, UT21-1, UT22-1, UT23-1, and UT24-1 shown in FIG. 10A. Hereinafter, the shapes of the connection lines according to each of the areas AA1, AA2, and AA3 will be described with reference to the drawings.

As shown in FIG. 10A, the first row light emitting parts Rp may include light emitting parts in which the first light emitting unit UT11-1 and the second light emitting unit UT12-1 are repeatedly arranged along the first direction DR1. In other words, the light emitting unit UT13-1 in the first row and the third column may be the same as the first light emitting unit UT11-1 in the first row and the first column, and the light emitting unit UT14-1 in the first row and the fourth column may the same as the second light emitting unit UT12-1 in the first row and the second column.

The second row light emitting parts Rp+1 may include light emitting parts arranged in a linear symmetric with the first row light emitting parts Rp with respect to an axis extending parallel to the first direction DR1. In other words, the light emitting units UT21-1, UT22-1, UT23-1, and UT24-1 in the second row may be in a line symmetry with the light emitting units UT11-1, UT12-1, UT13-1, and UT14-1 in the first row with respect to an axis extending parallel to the first direction DR1

Accordingly, the shape and an arrangement of the light emitting parts EP1$a$2, EP2$a$2, EP3$a$2, EP1$b$2, EP2$b$2, and EP3$b$2 constituting the first and second light emitting units UT11-1 and UT12-1, and the connection lines CN1$a$2, CN2$a$2, CN3$a$2, CN1$b$2, CN2$b$2, and CN3$b$2 may repeatedly appear in the first row light emitting parts Rp. In addition, a shape and an arrangement of the light emitting parts EP1$a$2, EP2$a$2, EP3$a$2, EP1$b$2, EP2$b$2, and EP3$b$2 constituting the first and second light emitting units UT11-1 and UT12-1, and the connection lines CN1$a$2, CN2$a$2, CN3$a$2, CN1$b$2, CN2$b$2, and CN3$b$2 are linearly symmetric with a shape and an arrangement of those constituting the light emitting units UT21-1 and UT22-1 in the second row light emitting parts Rp+1 with respect to an axis extending parallel to the first direction DR1. Hereinafter, the first and second light emitting unit UT11-1 and UT12-1 will be described.

The first light emitting units UT11-1 may include first to third light emitting parts EP1$a$2, EP2$a$2, and EP3$a$2 in the first row and the first column, and the second light emitting unit UT12-1 may include first to third light emitting parts EP1$b$2, EP2$b$2, and EP3$b$2 in the first row and the second column.

As described above, the pixel driving parts in the same row are sequentially arranged along the first direction DR1, and the connection transistors may be arranged at the same positions along the first direction DR1. Accordingly, the connection transistors of pixel driving parts PC1$a$2, PC2$a$2, PC3$a$2, PC1$b$2, PC2$b$2, and PC3$b$2 in the first row and the first column and the first row and the second column, which are respectively connected to the light emitting units UT11-1 and UT12-1, may be arranged along the first direction DR1. Accordingly, the driving connection parts CD1$a$2, CD2$a$2, CD3$a$2, CD1$b$2, CD2$b$2, and CD3$b$2 of the connection lines CN1$a$2, CN2$a$2, CN3$a$2, CN1$b$2, CN2$b$2, and CN3$b$2 in the first row and the first column and in the first row and the second column may be disposed at the positions arranged along the first direction DR1.

As described above, the emission connection parts CE1$a$2, CE2$a$2, CE3$a$2, CE1$b$2, CE2$b$2, and CE3$b$2 of the connection lines CN1$a$2, CN2$a$2, CN3$a$2, CN1$b$2, CN2$b$2, and CN3$b$2 in the first row and the first column and the first row and the second column may be defined at non-overlapping positions with the light emitting parts EP1$a$2, EP2$a$2, EP3$a$2, EP1$b$2, EP2$b$2, and EP3$b$2 in a plan view. Three and the other three of the emission connection parts CE1$a$2, CE2$a$2, CE3$a$2, CE1$b$2, CE2$b$2, and CE3$b$2 may be disposed up and down with respect to the driving connection parts CD1$a$2, CD2$a$2, CD3$a$2, CD1$b$2, CD2$b$2, and CD3$b$2. In the present embodiment, two emission connection parts CE1$a$2 and CE3$a$2 of the first light emitting unit UT11-1 in the first row and the first column, and one emission connection part CE1$b$2 of the second light emitting unit UT12-1 in the first row and the second column are disposed in an upper side of the driving connection parts CD1$a$2, CD2$a$2, CD3$a$2, CD1$b$2, CD2$b$2, and CD3$b$2, and one emission connection part CE2$a$2 of the first light emitting unit UT11-1 in the first row and the first column, and two emission connection parts CE2$b$2 and CE3$b$2 of the second light emitting unit UT12-1 in the first row and the second column are disposed in a lower side of the driving connection parts CD1$a$2, CD2$a$2, CD3$a$2, CD1$b$2, CD2$b$2, and CD3$b$2.

According to the inventive concept, the emission connection parts CE1$a$2, CE2$a$2, CE3$a$2, CE1$b$2, CE2$b$2, and CE3$b$2 are disposed up or down with respect to the driving connection parts CD1$a$2, CD2$a$2, CD3$a$2, CD1$b$2, CD2$b$2, and CD3$b$2, and thus the emission connection parts CE1$a$2, CE2$a$2, CE3$a$2, CE1$b$2, CE2$b$2, and CE3$b$2 may be distributed uniformly in the light emitting units UT11-1 and UT12-1. Accordingly, the possibility that the connection lines CN1$a$2, CN2$a$2, CN3$a$2, CN1$b$2, CN2$b$2, and CN3$b$2 cross each other may be reduced, the electrical reliability may be enhanced, and the degree of design freedom may increase.

Referring to FIG. 10B, eight light emitting units UT11-2, UT12-2, UT11-3, UT12-3, UT21-2, UT22-2, UT21-3 and UT22-3 disposed in the second area AA2 and the third area AA3 may include light emitting parts respectively having the same shape and arrangement as light emitting parts of the eight light emitting units UT11-1, UT12-1, UT13-1, UT14-1, UT21-1, UT22-1, UT23-1 and UT24-1 shown in FIG. 10A.

The light emitting units UT11-2, UT12-2, UT21-2 and UT22-2 disposed in the second area AA2 may be the light emitting units constituting the right second group G2R disposed between the foregoing first groups G1 and the right third group G3R. The light emitting units UT11-2, UT12-2, UT21-2 and UT22-2 disposed in the second area AA2 are disposed at overlapping positions with the pixel driving parts PC1$p$, PC2$p$, PC3$p$, PC1$p$+1, PC2$p$+1 and PC3$p$+1 in a plan view, but are not connected thereto. In other words, the light emitting units UT11-2, UT12-2, UT21-2 and UT22-2 disposed in the second area AA2 are disposed spaced apart from the connected pixel driving parts in a plan view. In the present embodiment, the light emitting units UT11-2, UT12-2, UT21-2 and UT22-2 disposed in the second area AA2 are disposed spaced apart from the connected pixel driving parts in the first direction DR1. Meanwhile, the pixel driving parts connected to the light emitting units UT11-2, UT12-2, UT21-2 and UT22-2 disposed in the second area AA2 are not shown.

The light emitting units UT11-3, UT12-3, UT21-3 and UT22-3 disposed in the third area AA3 may be light emitting units constituting the right third group G3R disposed on a right side of the right second groups G2R. The light emitting units UT11-3, UT12-3, UT21-3 and UT22-3 disposed in the third area AA3 are disposed at overlapping positions with the right driving part DC_R and in a non-overlapping area with the pixel driving parts PC1$p$, PC2$p$, PC3$p$, PC1$p$+1, PC2$p$+1 and PC3$p$+1. The pixel driving parts PC1$p$, PC2$p$, PC3$p$, PC1$p$+1, PC2$p$+1 and PC3$p$+1 connected to the light emitting units UT11-3, UT12-3, UT21-3 and UT22-3 disposed in the third area AA3 may be disposed in the second area AA2, and in the present embodiment, may overlap the light emitting units UT11-2, UT12-2, UT21-2 and UT22-2 disposed in the second area AA2.

In other words, the light emitting units UT11-2, UT12-2, UT21-2 and UT22-2 disposed in the second area AA2 or the light emitting units UT11-3, UT12-3, UT21-3 and UT22-3 disposed in the third area AA3 shown in FIG. 10B all include light emitting parts disposed at positions spaced apart from the connected pixel driving parts in a plan view. Here, each of the connection lines CN-2 (hereinafter, connection lines of the second area AA2) connecting the light emitting units UT11-2, UT12-2, UT21-2 and UT22-2 disposed in the second area AA2, or each of the connection lines CN-3 (hereinafter, connection lines of the third area AA3) connecting the light emitting units UT11-3, UT12-3, UT21-3 and UT22-3 disposed in the third area AA3 may include at least one first line LN1 and at least one second line LN2.

The first line LN1 extends along a direction parallel to the first direction DR1. The first line LN1 may be connected to the emission connection part or the driving connection part, or be provided in plurality and connected each to the emission connection part and the driving connection part. The second line LN2 may be bent at a prescribed angle with respect to the first line LN1 to connect two first lines LN1, or connect one first line LN1 and the emission connection part, or one first line LN1 and the driving connection part.

In the present embodiment, with respect to adjacently disposed three emission connection parts, the first lines LN1 may extend in different directions from each other. For example, the first line connected to the emission connection part CE1$a$2 of the first light emitting part in the light emitting unit UT11-2 of the first row and the first column may extend in an opposite direction to the first line connected to the emission connection part CE1$b$2 of the first light emitting part in the light emitting unit UT12-2 of the first row and the second column. The first line connected to the emission connection part CE1$a$2 of the first light emitting part in the light emitting unit of UT11-2 the first row and the first column extends from the emission connection part CE1$a$2 in the opposite direction to the first direction DR1, and the first line connected to the emission connection part CE1$b$2 of the first light emitting part in the light emitting unit UT12-2 of the first row and the second column extends from the emission connection part CE1$b$2 in the same direction as the first direction DR1.

Accordingly, the connection line connected to the emission connection part CE1$a$2 of the first light emitting part in the light emitting unit UT11-2 of the first row and the first column and the connection line connected to the emission connection part CE1$b$2 of the first light emitting part in the light emitting unit UT12-2 of the first row and the second column may not cross each other nor interfere with each other. Meanwhile, a bent angle formed in the connection line connected to the emission connection part CE1$a$2 of the first light emitting part in the light emitting unit UT11-2 of the first row and the first column and a bent angle formed in the connection line connected to the emission connection part of the second light emitting part in the light emitting unit UT22-2 of the second row and the second column may be opposite to each other and be expressed by opposite signs on the basis of about 360 degree. Similarly, in the third area AA3, a bent angle formed in the connection line CN1$b$3 connected to the emission connection part CE1$b$3 of the first light emitting part in the light emitting unit UT12-3 of the first row and the second column and a bent angle formed in the connection line CN2$d$3 connected to the emission connection part CE2$d$3 of the second light emitting part in the light emitting unit UT22-3 of the second row and the second column may be opposite to each other and be expressed by opposite signs on the basis of about 360 degree.

According to the third area AA3, the emission connection part CE3$a$3 of the third light emitting part in the light emitting unit UT11-3 of the first row and the first column disposed between the emission connection part CE1$a$3 of the first light emitting part in the light emitting unit UT11-3 of the first row and the first column and the emission connection part CE1$b$3 of the first light emitting part in the light emitting unit UT12-3 of the first row and the second column may be connected to the second line extending in the second direction DR2 of the connection line CN3$a$3. The first line extending in the first direction DR1 of the connection line CN3$a$3 may be connected to the driving connection part CD3$a$3 of the third light emitting part in the light emitting unit UT11-3 of the first row and the first column. Accordingly, crossing or interference may be prevented between two adjacent emission connection parts CE1$a$3 and CE1$b$3 and the connection line CN3$a$3 connected to the emission connection part CE3$a$3 of the third light emitting part in the light emitting unit UT11-3 of the first row and the first column. Similarly, above arrangement may be applied to the connection lines connected to the light emitting part in the light emitting units of the second area AA2.

According to the third area AA3, the second line of the connection line CN3$a$3 connected to the third light emitting part in the light emitting unit UT11-3 of the first row and the first column may be parallel to the second line of the connection line CN1$a$3 connected to the first light emitting part in the light emitting unit UT11-3 of the first row and the first column. The second line of the connection line CN3$a$3 connected to the third light emitting part in the light emitting unit UT11-3 of the first row and the first column may be parallel to the second line of the connection line CN1$b$3 connected to the first light emitting part in the light emitting unit UT12-3 of the first row and the second column.

In other words, the second lines of the connection lines CN1$a$3, CN3$a$3, CN1$b$3 respectively connected to the emission connection parts CE1$a$3, CE3$a$3, and CE1$b$3 adjacent to each other may be parallel to each other along in first direction. In viewed in the first direction, a distance from the second line of the connection line CN3$a$3 connected to the third light emitting part in the light emitting unit UT11-3 of the first row and the first column to the second line of the connection line CN1$a$3 connected to the first light emitting part in the light emitting unit UT11-3 of the first row and the first column may be substantially equal to a distance from the second line of the connection line CN3$a$3 connected to the third light emitting part in the light emitting unit UT11-3 of the first row and the first column to the second line of the connection line CN1$b$3 connected to the first light emitting part in the light emitting unit UT12-3 of the first row and the second column. In this embodiment, with designing the second lines of the connection lines CN1$a$3, CN3$a$3, CN1$b$3 respectively connected to the emission connection parts CE1$a$3, CE3$a$3, and CE1$b$3 adjacent to each other to be parallel to each other, interference between the connection lines CN1$a$3, CN3$a$3, CN1$b$3 is prevented and the design may be simplified.

However, this shows an example, and if adjacent emission connection parts do not interfere with the connection lines, a driving connection part CD3$a$3 of the third light emitting part in the light emitting unit UT11-3 of the first row and the first column may also be connected with the first line, and an extension direction of the first line connected to the emission connection part CE1$a$3 of the first light emitting part in the light emitting unit UT11-3 of the first row and the first column or the first line connected to the emission connection part CE1$b$3 of the first light emitting part in the light emitting unit UT12-3 of the first row and the second column may vary in various ways, and is not limited to any one embodiment.

Referring to FIGS. 10B and 10C, a bent angle $\theta$2 of the connection line CN-2 connected to the first light emitting part EP1-2 disposed in the second area AA2 may be different from a bent angle $\theta$3 of the connection line CN-3 connected to the first light emitting part EP1-3 disposed in the third area AA3. The bent angle $\theta$3 of the connection line CN-3 disposed in the third area AA3 may be smaller than the bent angle $\theta$2 of the connection line CN-2 disposed in the second area AA2. In the present embodiment, when the light emitting parts are one-to-one connected with the pixel driving parts, a large number of the pixel driving parts should be disposed in the same area (e.g., the first area AA1 and the second area AA2) than that of the light emitting parts. Therefore, the closer to the center of the first area AA1, the smaller the distance between the corresponding pixel driving part and light emitting part, and the farther away from the center of the first area AA1, for example, the closer to the third area AA3, the larger the distance. Accordingly, the connection line CN-3 disposed in the third area AA3 may be required to be longer and inclined at a lower angle than the connection line CN-2 disposed in the second area AA2. Accordingly, the bent angle $\theta$3 of the connection line CN-3 disposed in the third area AA3 may be smaller than the bent angle $\theta$2 of the connection line CN-2 disposed in the second area AA2.

Meanwhile, referring to FIG. 10A, the connection line CN-1 disposed in the first area AA1 may also include two or more lines, but the bent angle $\theta$1 may be almost degrees. In other words, the connection line CN-1 disposed in the first area AA1 may include two or more connected bent lines or one straight line. The bent angle $\theta$1 may be larger than the bent angle $\theta$2 in the second area AA2 or the bent angle $\theta$3 in the third area AA3. In the first area AA1, since the connected pixel driving part and light emitting part overlap in a plan view, the length of the connection line CN-1 may be relatively short and the slope may not be large. According to the inventive concept, each of the connection lines CN-1, CN-2 and CN-3 are composed of a horizontal part (the first line LN1) and an inclined part (the second line LN2), and a bent angle between the first line LN1 and the second line LN2 is designed in various ways according to the location between the pixel driving parts and the light emitting parts. Therefore, interference between the connection lines CN-1, CN-2, and CN-3 is prevented and the design may be simplified.

Figure 11:
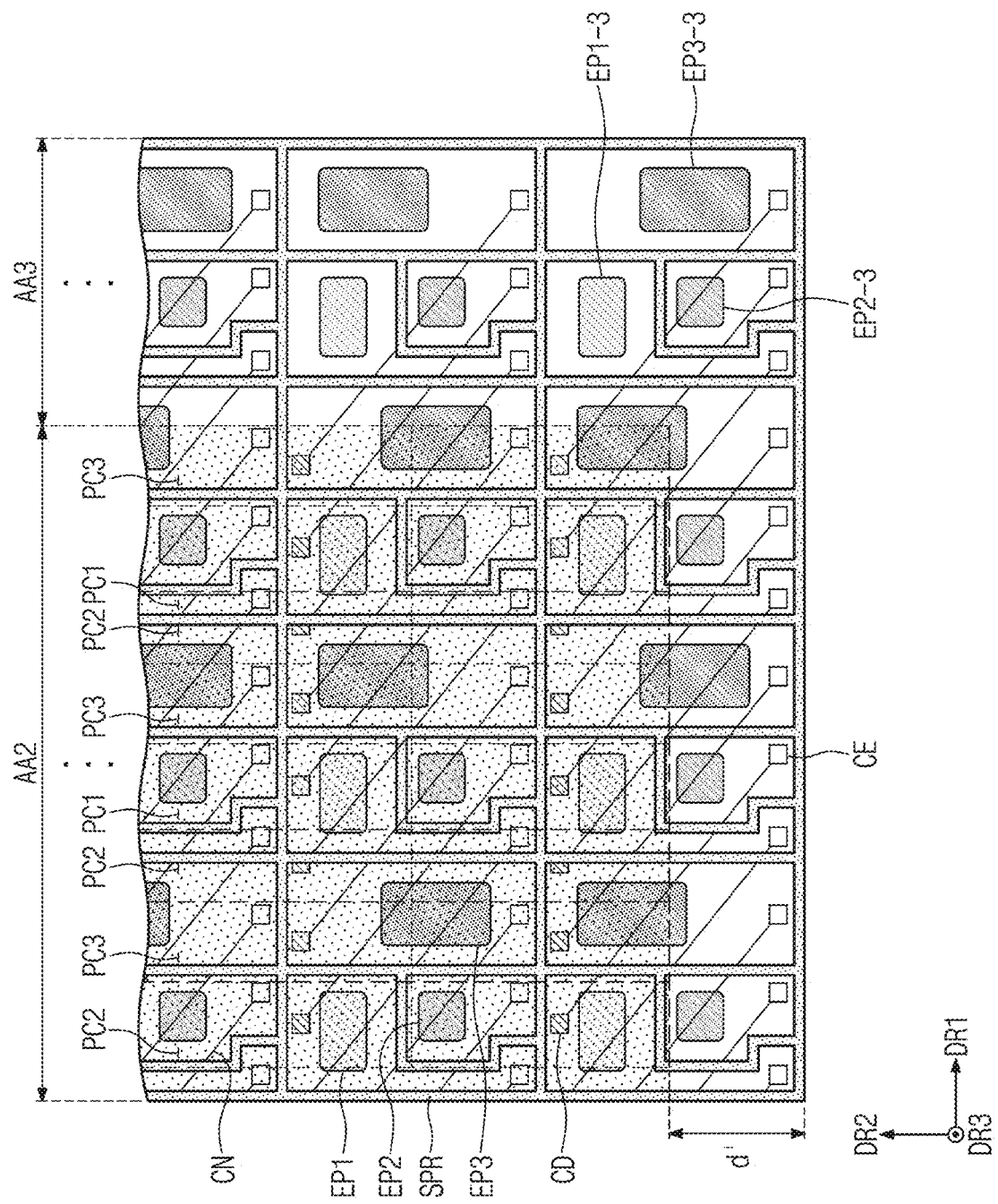
FIG. 11 is an enlarged plan view of a portion of a display panel according to an embodiment.

FIG. 11 is an enlarged plan view of a portion of a display panel according to an embodiment. FIG. 11 shows an enlarged bottom right corner region of the display area DA shown in FIG. 3.

Referring to FIG. 11, some of the light emitting parts EP1, EP2, and EP3 may be spaced apart from the second area AA2 in which the pixel driving parts PC1, PC2 and PC3 are disposed, and be disposed in the third area AA3. The pixel driving parts PC1, PC2 and PC3 may be disposed in the second area AA2. In other words, some light emitting parts among the light emitting parts EP1, EP2, and EP3 are disposed in the second area AA2 to overlap the pixel driving parts PC1, PC2 and PC3, and some other light emitting parts may be disposed in the third area AA3 not to overlap the pixel driving parts PC1, PC2 and PC3.

The light emitting parts EP1-3, EP2-3 and EP3-3 disposed in the third area AA3 may be disposed not to overlap the pixel driving parts PC1, PC2 and PC3. Accordingly, the connection lines connected to the light emitting parts EP1-3, EP2-3 and EP3-3 disposed in the third area AA3 may extend from the third area AA3 toward the second area AA2. According to the inventive concept, the connection lines may be further included, and thus the light emitting parts EP1-3, EP2-3 and EP3-3 disposed in the third area AA3 may be easily connected to the pixel driving parts PC1, PC2 and PC3 in the second area AA2 and the display area DA may increase.

Meanwhile, the light emitting parts EP1, EP2, and EP3 disposed in the second area AA2 are disposed to overlap the pixel driving parts PC1, PC2 and PC3, but disposed at a non-overlapping position with the corresponding pixel driving part. Accordingly, the connection lines connected to the light emitting parts EP1, EP2, and EP3 disposed in the second area AA2 have the length expanding to a non-overlapping area with the light emitting parts EP1, EP2, and EP3 so as to be connected to the corresponding pixel driving part.

According to the inventive concept, the connection line CN is further included, and thus the display panel 100 may have an expanding display area along a direction parallel to the second direction DR2 (the expanding portion d' along the second direction DR2) and the third area AA3 in which the pixel driving parts are not disposed. The emission connection parts CE are disposed in the extending portion d.' Therefore, even when the expanding portion d' is disposed with the light emitting parts EP1, EP2, and EP3 to be spaced apart from the pixel driving parts PC1, PC2 and PC3, the light emitting parts EP1, EP2, and EP3 may be easily connected to the pixel driving parts PC1, PC2 and PC3 through the driving connection parts CD. Accordingly, for the light emitting parts EP1-3, EP2-3 and EP3-3 disposed in the non-overlapping area with the pixel driving parts PC1, PC2 and PC3, an independent pixel driving part may be provided to be able to stably drive the light emitting parts EP1-3, EP2-3 and EP3-3, and thus a display device having a narrow bezel may be provided.

Figure 12:
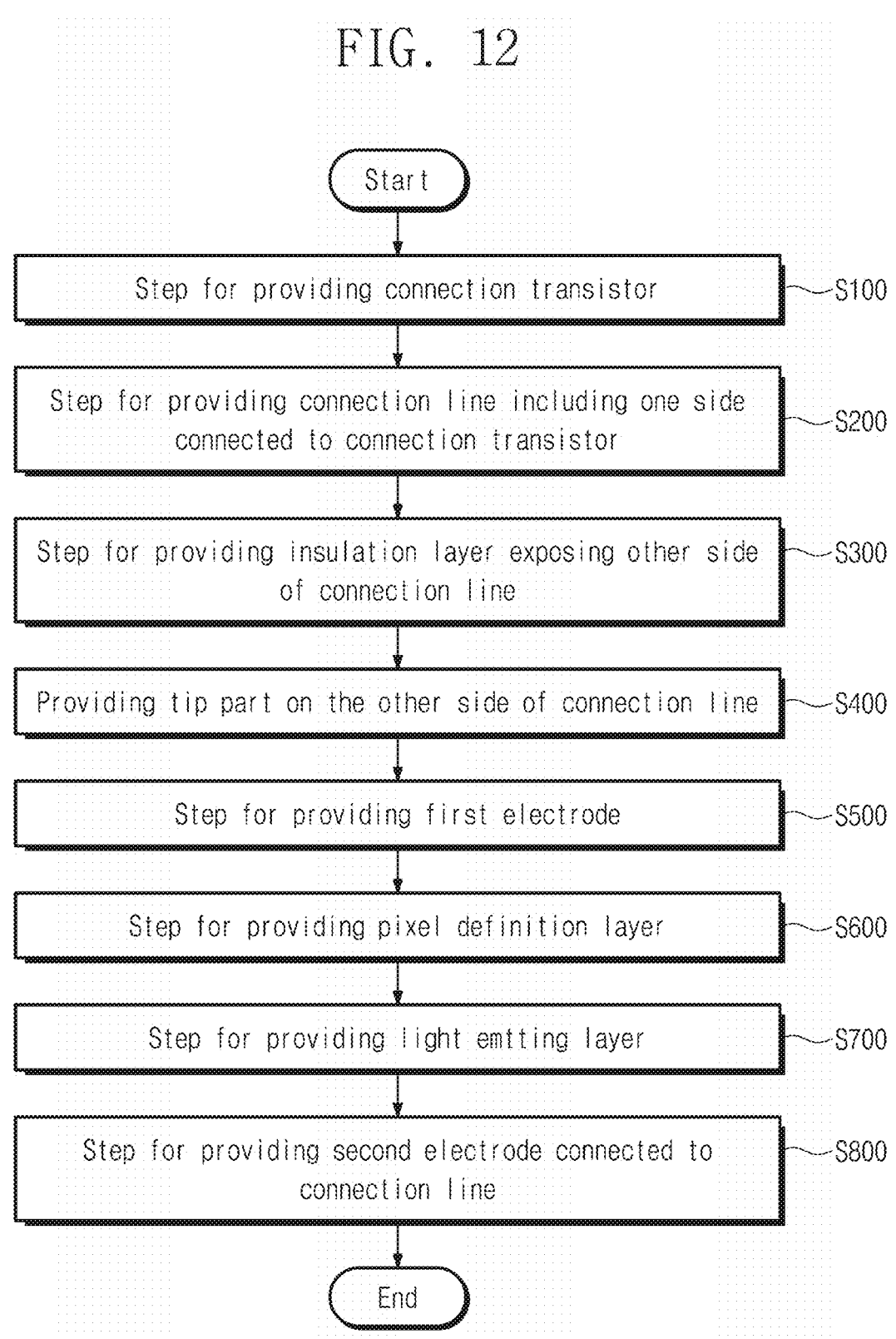
FIG. 12 is a flowchart of steps of a manufacturing method of a display panel according to an embodiment of the inventive concept.

FIG. 12 is a flowchart of steps of a manufacturing method of a display panel according to an embodiment of the inventive concept.

Referring to FIG. 12, a manufacturing method of a display panel according to an embodiment includes a step S100 for providing a connection transistor, a step S200 for providing a connection line including one side connected to the connection transistor, a step S300 for providing an insulation layer exposing the other side of the connection line, a step S400 for providing a tip part on the other side of the connection line, a step S500 for providing a first electrode, a step S600 for providing a pixel defining layer, a step S700 for providing a light emitting layer, and a step S800 for providing a second electrode connected to the connection line.

FIGS. 13A to 13J are drawings schematically showing some of steps of a manufacturing method of a display device according to an embodiment of the inventive concept. Hereinafter, like numerals are given to like components described with reference to FIG. 1 to FIG. 11, and repetitive descriptions thereabout will be omitted.

Figures 13A, 13B:
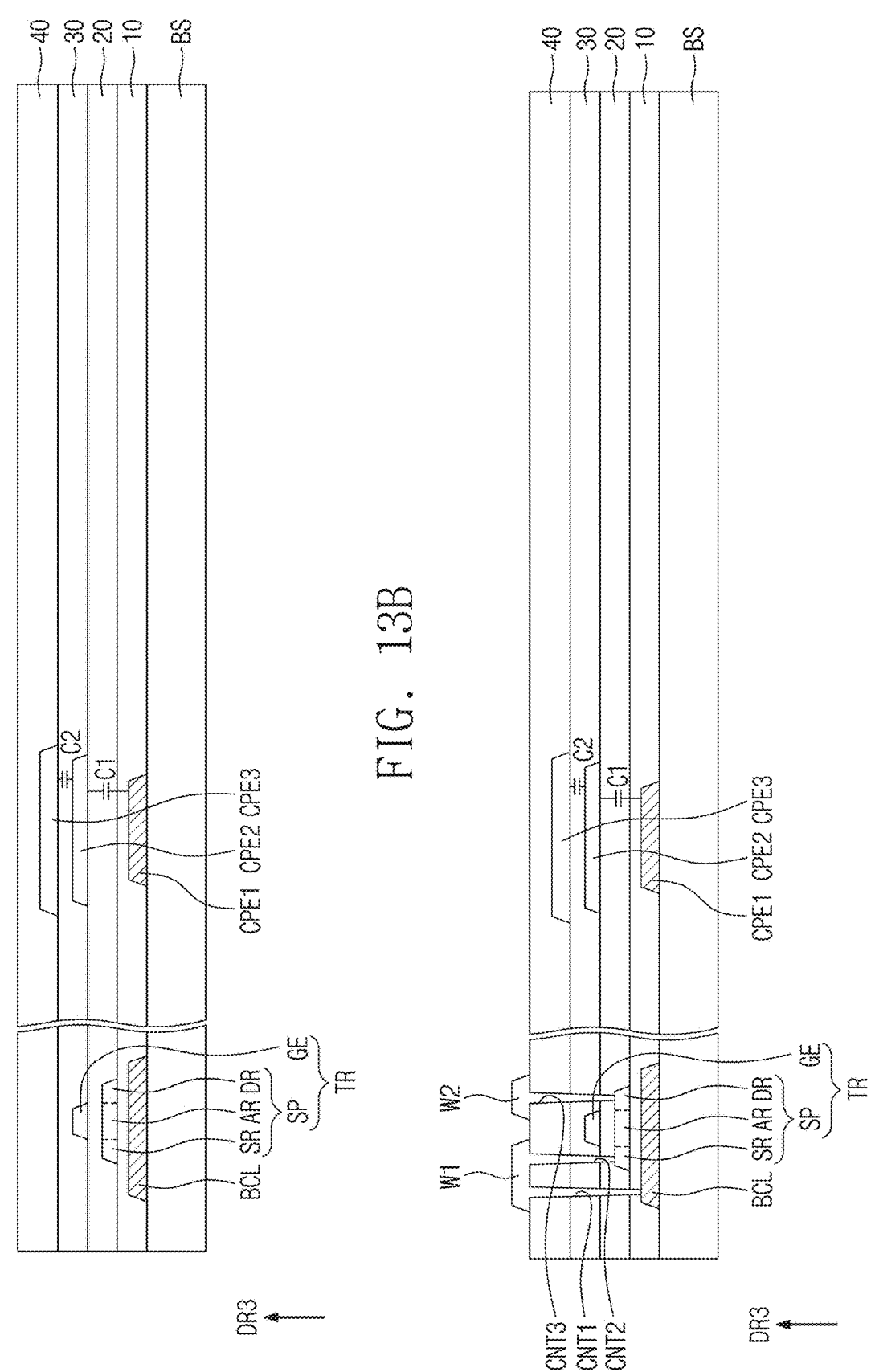
FIGS. 13A, 13B, 13C, 13D, 13E, 13F, 13G, 13H, 13I and 13J are drawings schematically showing some of steps of a manufacturing method of a display panel according to an embodiment of the inventive concept.

With reference to FIGS. 12 and 13A, the step S100 for providing a connection transistor includes a step for providing the base layer BS, a step for forming the connection transistor TR on the base layer BS, and forming a first intermediate insulation layer covering the connection transistor TR. The first intermediate insulation layer may include a third insulation layer 30 and a fourth insulation layer 40.

The organic layer, the inorganic layer, the semiconductor pattern, the conductive pattern, and the signal line may be provided on the base layer BS. The organic layer, the inorganic layer, the semiconductor layer and the conductive layer are selectively patterned to provide the insulation layer, the semiconductor pattern, the conductive pattern, and the signal line.

Specifically, the bottom conductive layer BCL may be provided on the base layer BS. The bottom conductive layer BCL may be provided by coating or depositing a metal material on the base layer BS and then patterning the same. Meanwhile, the first capacitor electrode CPE1 may be disposed on the same layer as the bottom conductive layer BCL. Here, the first capacitor electrode CPE1 may be formed simultaneously with the bottom conductive layer BCL using the same material layer as the bottom conductive layer BCL and the same mask for forming the bottom conductive layer BCL. Accordingly, the process becomes simplified and a processing cost may be reduced. However, this describes an example, and the first capacitor electrode CPE1 and the bottom conductive layer BCL may be provided through different processes, and the embodiment of the inventive concept not limited to any one embodiment.

The first insulation layer 10 is provided to cover the first capacitor electrode CPE1 and the bottom conductive layer BCL. The first insulation layer 10 may be provided by depositing an insulation material, for example, an inorganic material on the base layer BS.

Then, the semiconductor pattern SP may be provided on the first insulation layer 10. The semiconductor pattern SP may be provided by coating or depositing a semiconductor material on the first insulation layer 10, and then patterning the same. The semiconductor material may include monocrystalline silicon, polycrystalline silicon, or an oxide semiconductor. In the present embodiment, an example that the semiconductor pattern SP is provided with an oxide semiconductor will be described.

Then, the second insulation layer 20 is provided to cover the semiconductor pattern SP. The second insulation layer 20 may be provided by depositing an insulation material, for example, an inorganic material on the first insulation layer 10 to cover the semiconductor pattern SP.

Then, the gate electrode GE is provided on the second insulation layer 20 to provide the connection transistor TR. The gate electrode GE may be provided by coating or depositing a metal material on the second insulation layer 20, and then patterning the same.

Then, the source region SR, the drain region DR, and the channel AR are provided in the semiconductor pattern SP. The source region SR and the drain region DR may be provided by reducing a non-overlapping area with the gate electrode GE in the semiconductor pattern SP. Alternatively, when the semiconductor pattern SP is provided with silicon, the source region SR and the drain region DR may be provided by doping dopants to the non-overlapping area with the gate electrode GE in the semiconductor pattern SP. Meanwhile, the source region SR, the drain region DR, and the channel AR may be provided prior to providing the gate electrode GE, and is not limited to any one embodiment.

The second capacitor electrode CPE2 may be disposed on the same layer as the gate electrode GE. Here, the second capacitor electrode CPE2 may be formed simultaneously with the gate electrode GE using the same material layer as the gate electrode GE and the same mask for forming the gate electrode GE. Accordingly, the process becomes simplified and a processing cost may be reduced. However, this described an example, and the second capacitor electrode CPE2 and the gate electrode GE may be provided through different processes. Therefore, the embodiment of the inventive concept is not limited to any one embodiment.

Then, the third insulation layer 30 is provided to cover the gate electrode GE and the second capacitor electrode CPE2. The third insulation layer 30 may be provided by depositing an insulation material, for example, an inorganic material on the second insulation layer 20.

Then, the third capacitor electrode CPE3 and the fourth insulation layer 40 may be sequentially provided. The third capacitor electrode CPE3 may be provided by depositing (or coating) a metal material and then patterning the same. The fourth insulation layer 40 may be provided by depositing an insulation material, for example, an inorganic material on the third insulation layer 30. Meanwhile, this shows an example, and a process sequence between the first to third capacitor electrodes CPE1, CPE2 and CPE3 and the first to fourth insulation layers 10, 20, 30 and 40 may vary according to the positions of the first to third capacitor electrodes CPE1, CPE2 and CPE3, and is not limited to any one embodiment.

Then, referring to FIG. 13B, the source electrode pattern W1 and the drain electrode pattern W2 are provided on the fourth insulation layer 40. First, the plurality of contact holes CNT1, CNT2 and CNT3 are provided in the first to fourth insulation layers 10, 20, 30 and 40. The first contact hole CNT1 is provided through the first to fourth insulation layers 10, 20, 30 and 40 so as to expose one side of the bottom conductive layer BCL. The second contact hole CNT2 is provided through the second to fourth insulation layers 20, 30 and 40 so as to expose at least a portion of the source region SR of the semiconductor pattern SP. The third contact hole CNT3 is provided through the second to fourth insulation layers 20, 30 and 40 so as to expose at least a portion of the drain region DR of the semiconductor pattern SP.

Then, the metal material is deposited or coated on the fourth insulation layer and patterned to provide the source electrode pattern W1 and the drain electrode pattern W2. The source electrode pattern W1 and the drain electrode pattern W2 may be provided by filling the corresponding contact holes among the contact holes CNT1, CNT2 and CNT3. This shows an example, and in the manufacturing method for a display panel according to an embodiment of the inventive concept, a step for providing the source electrode pattern W1 or the drain electrode pattern W2 may be omitted. In this case, the connection line CN to be described below may directly contact the semiconductor pattern SP and the bottom conductive layer BCL through contact holes formed through the first to fourth insulation layers 10, 20, 30 and 40.

Figure 13C:
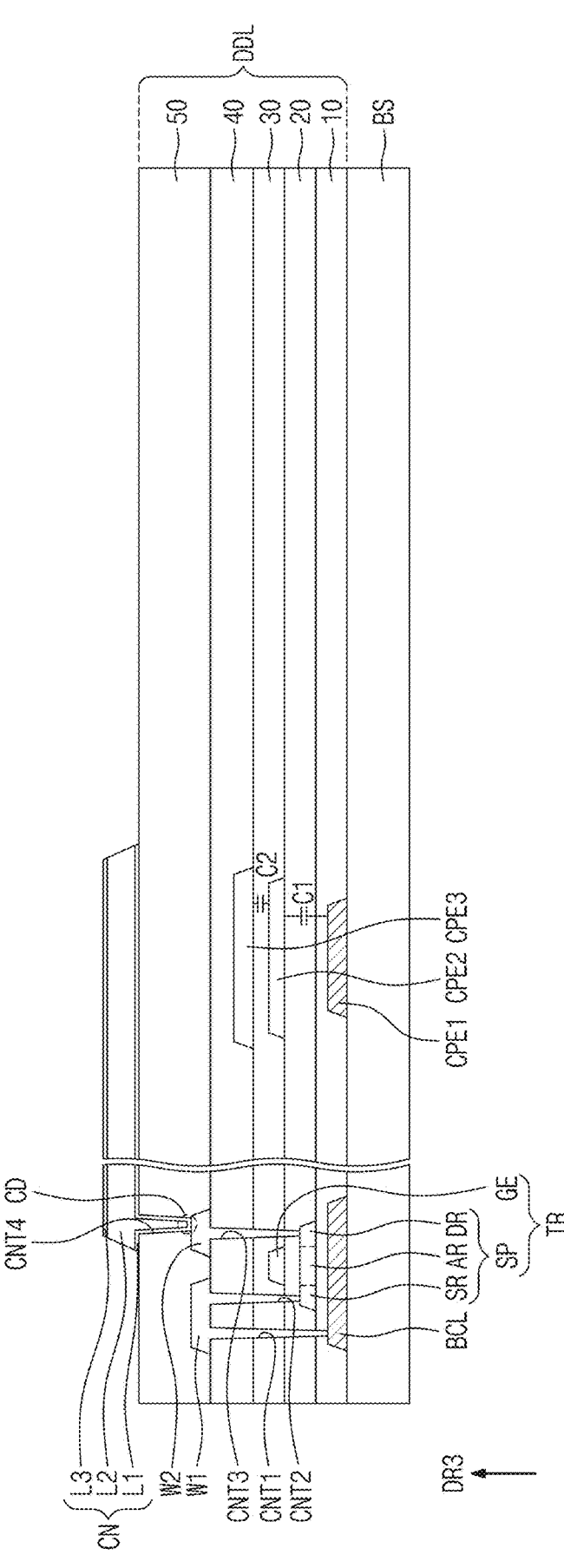

Referring to FIGS. 12 and 13C, a step S200 for providing the connection line including one side connected to the connection transistor may include a step for providing the connection line CN connected with the connection transistor TR through the contact hole CNT4.

Specifically, the step S200 for providing the connection line including one side connected to the connection transistor may include a step for providing a fifth insulation layer 50 on the fourth insulation layer 40, providing a contact hole CNT4 formed through the fifth insulation layer 50, and then providing the connection line CN connected with the connection transistor TR through the contact hole CNT4.

The connection line CN may include the first layer L1, the second layer L2, and the third layer L3. On the fifth insulation layer 50, a metal material layer for forming the first layer L1, a metal material layer for forming the second layer L2, and a metal material layer for forming the third layer L3 are sequentially provided, and then the metal material layers for forming the first to third layers L1, L2, and L3 are patterned to provide the connection line CN which includes the first to third layers L1, L2, and L3. Here, the second layer L2 and the first layer L1 may have different materials, and the second layer L2 and the third layer L3 may have different materials. For example, the second layer L2 may include aluminum, and the first layer L1 and the third layer L3 may include titanium, but are not limited thereto.

Meanwhile, the step for patterning the first to third layers L1, L2 and L3 may include dry etching or wet etching. In the present embodiment, the step for patterning the first to third layers L1, L2 and L3 may include the dry etching.

Figure 13D:
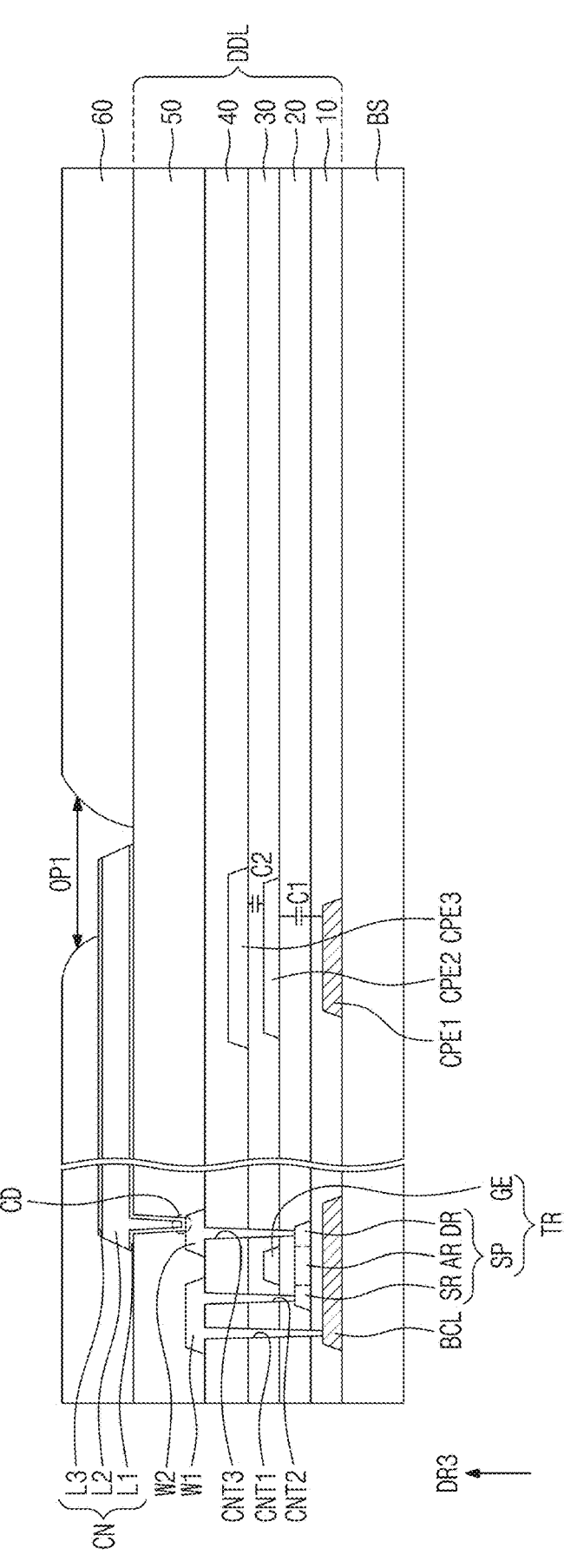
Figure 13E:
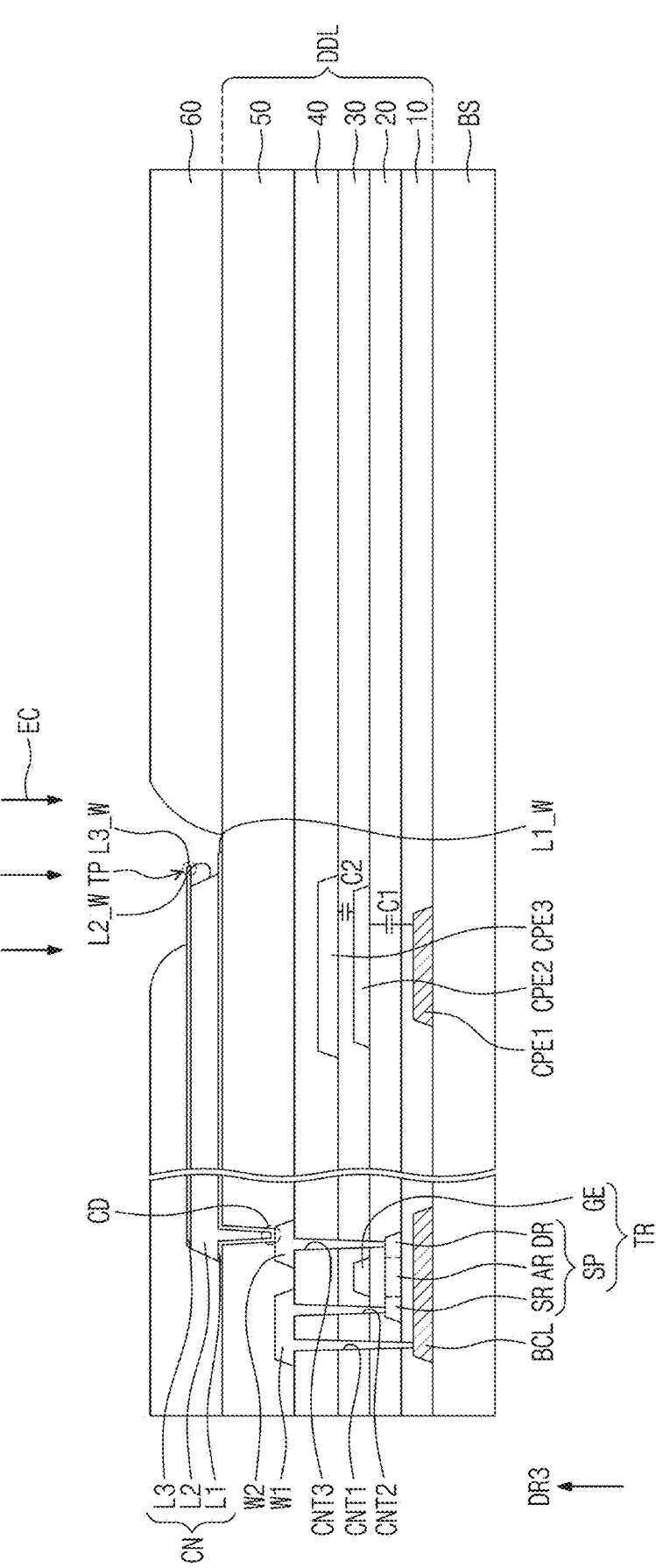

Then, referring to FIGS. 12 and 13D, the step S300 for providing the insulation layer exposing the other side of the connection line may be progressed. The sixth insulation layer 60 may be provided on the fifth insulation layer 50 to cover the connection line CN. The sixth insulation layer 60 may be provided by depositing or coating an insulation material, for example, an organic material.

Then, the first opening OP1 exposing the other side of the connection line NC may be provided in the sixth insulation layer 60. The other side of the connection line CN may be a portion of the connection line CN to which the light emitting element LD is connected. Then, referring to FIGS. 12 and 13E, the step S400 for providing the tip part in the other side of the connection line may be progressed. An etching process EC may be progressed in the other side of the connection line CN exposed through the first opening OP1. In the present embodiment, the etching process EC may be wet etching. The other side of the connection line CN which is exposed by the first opening OP1 may be exposed to an etching solution. An etching rate of the second layer L2 is greater than that of the first layer L1 and the third layer L3. Through the etching process EC, the side surface L2_W of the second layer L2 having a higher etch ratio than that of the first layer L1 and the third layer L3 may be more recessed into an inside of the connection line CN in comparison to the side surface L3_W of the third layer L3. Accordingly, the tip part TP generated by the third layer L3 protruding from the side surface L2_W of the second layer L2 may be provided in the other side of the connection line CN.

The length of the tip part TP, namely, the length of the third layer L3 protruding from the side surface L2_W of the second layer L2 may be provided in various ways according to the concentration of the etching solution, an etching time, an etching selectivity of the second layer L2 and the third layer L3 to the etching solution or the like. According to the inventive concept, the length of the tip part TP may be easily controlled through the concentration of the etching solution, the etching time, the etching selectivity or the like.

Figure 13F:
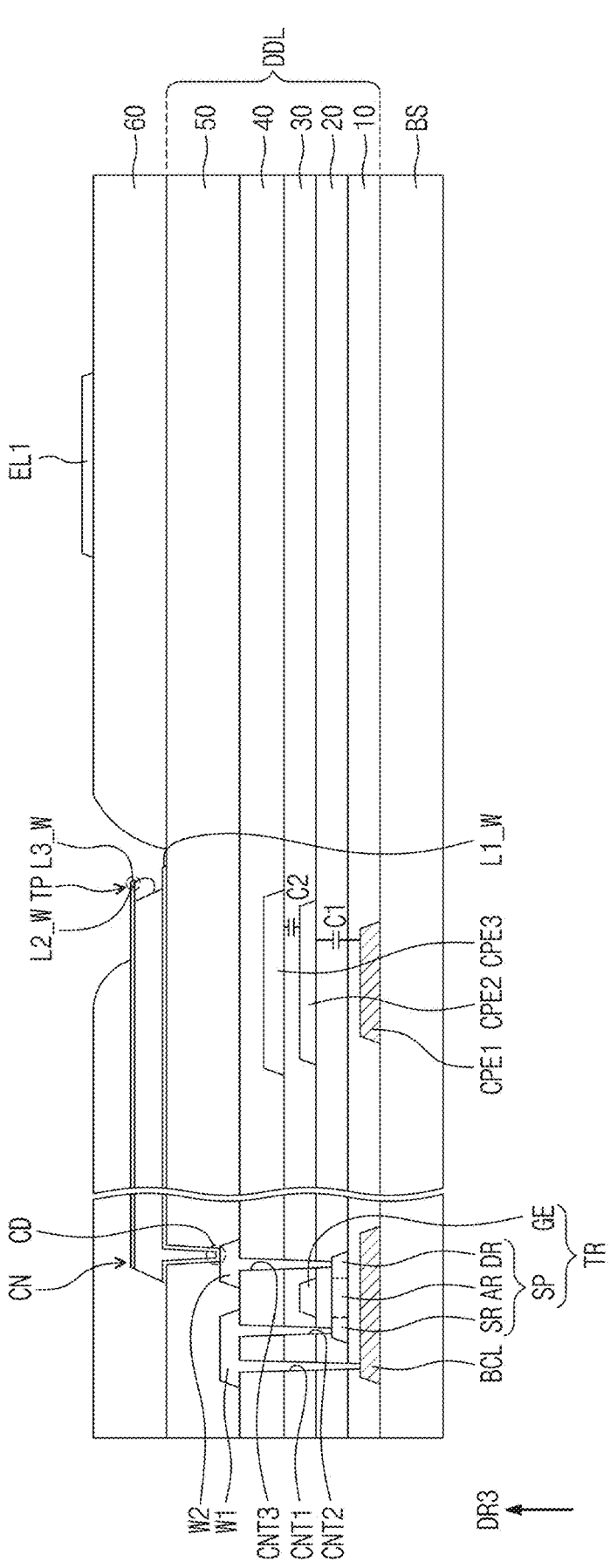

Referring to FIGS. 12 and 13F, the step S500 for providing the first electrode includes a step for providing the first electrode EL1 on the sixth insulation layer 60. The metal material may be deposited or coated on the sixth insulation layer 60, and then patterned to provide the first electrode ELL Then, referring to FIGS. 12 and 13G, the step S600 for providing the pixel defining layer may be progressed. An insulation material is deposited or coated on the sixth insulation layer 60, and then patterned to provide the pixel defining layer PDL. The pixel defining layer PDL may include the second opening OP2 and the emitting opening OP-PDL. The second opening OP2 may be provided in an overlapping area with the first opening OP1 to expose the tip part TP. The emitting opening OP-PDL is provided in an overlapping area with the first electrode EL1 to expose at least a portion of the first electrode EL1. The size and shape of the emitting opening OP-PDL may be the size and shape of the foregoing light emitting part.

Meanwhile, the second opening OP2 and the emitting opening OP-PDL may be substantially simultaneously provided through one mask. However, this describes an example, and the second opening OP2 and the emitting opening OP-PDL may be sequentially patterned and provided through different processes, and are not limited to any one embodiment.

Figure 13G:
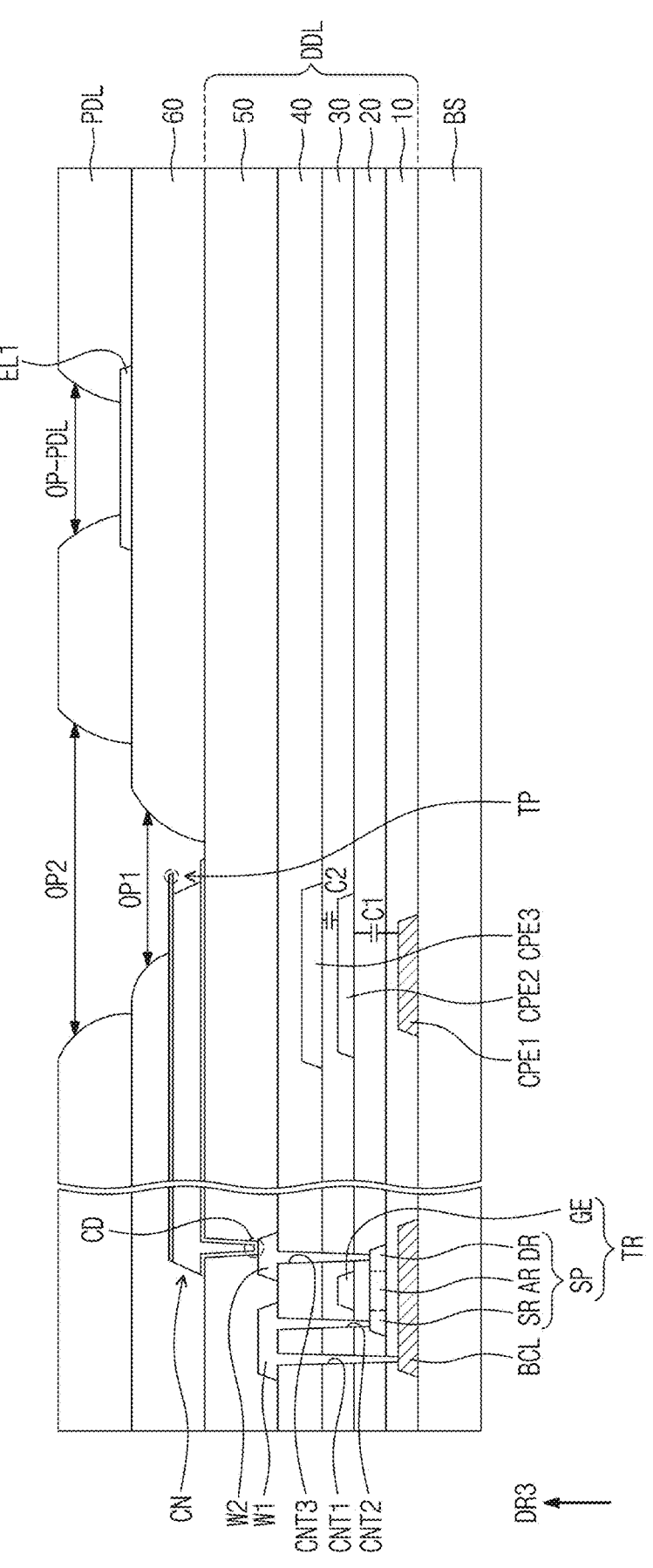
Figure 13H:
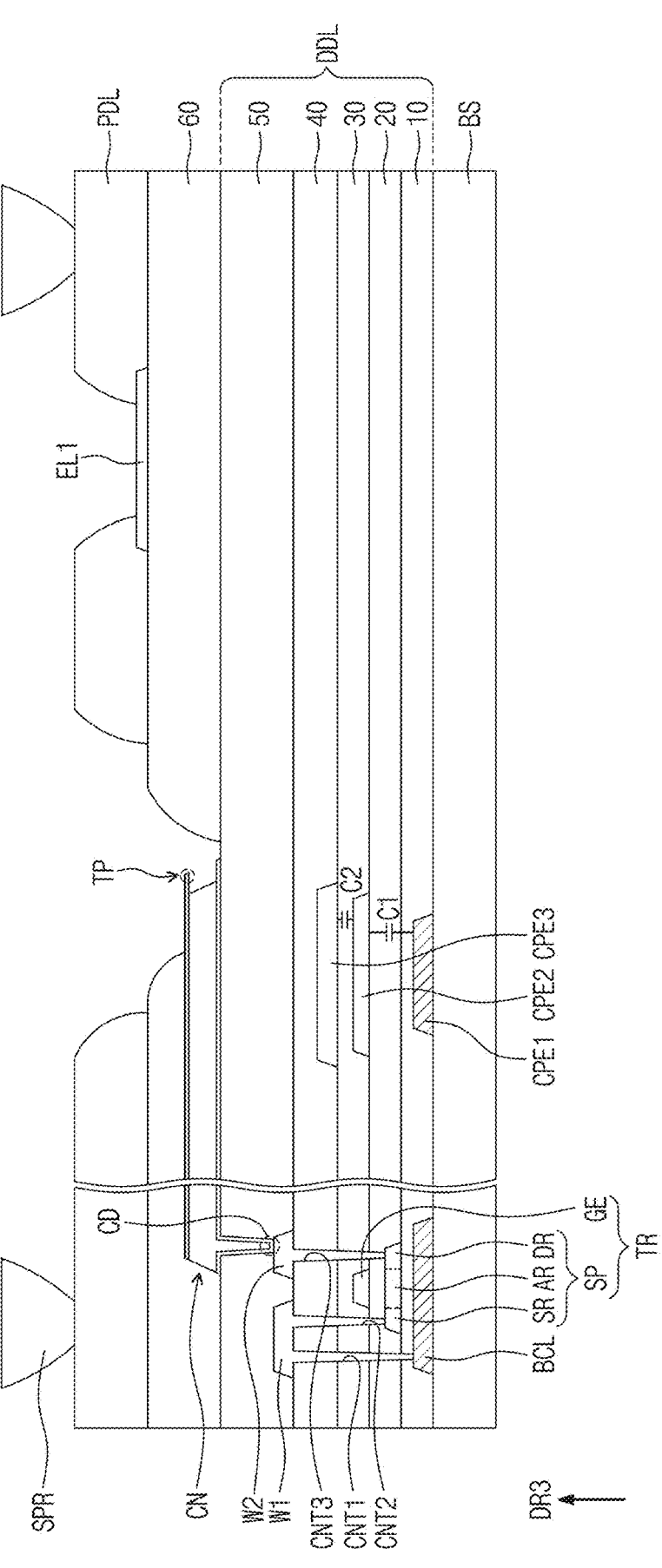

Then, as shown in FIG. 13H, a manufacturing method of a display panel according to an embodiment of the inventive concept may further include a step for providing the separator SPR.

The separator SPR may have the inverted taper shape, but is not limited thereto. The separator SPR may be provided by coating an organic material, but the embodiment of the inventive concept is not limited thereto. The separator SPR may have insulation property.

Figure 13I:
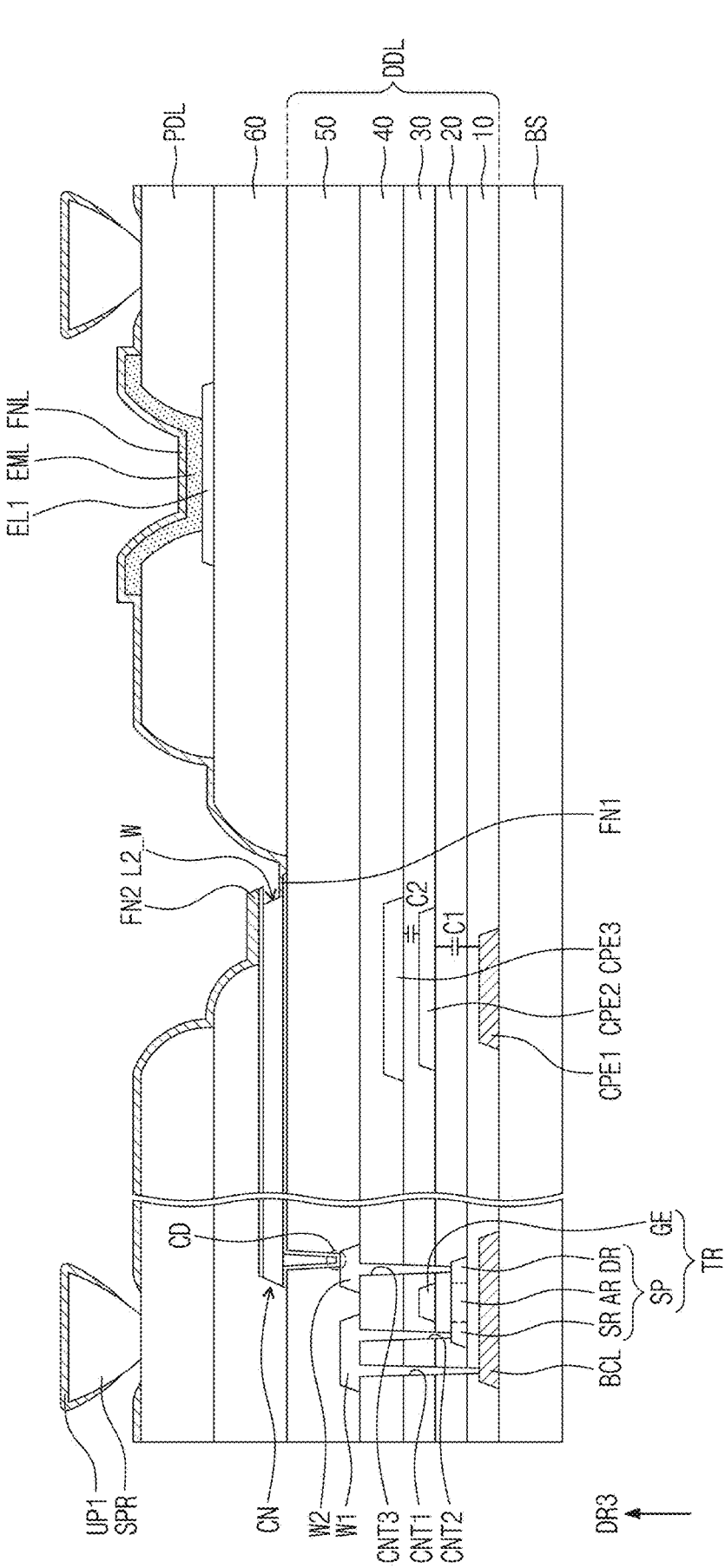

Then, referring to FIGS. 12 and 13I, the step S700 for providing the light emitting layer may be progressed. In the step S700 for providing the light emitting layer EML, a light emitting material may be deposited or coated in the emitting opening OP-PDL.

Here, a step for providing the functional layer FNL may be further included, and the functional layer FNL may be provided prior to providing the second electrode EL2.

The functional layer FNL may be provided by forming an organic material. The functional layer FNL may be provided on the entire base layer BS using an open mask. The functional layer FNL may have disconnected portions on the side surface of the separator SPR and/or in an undercut portion of the connection line CN (the side surface L2_W of the second layer L2). The functional layer FNL may be disconnected due to the inverted taper shape of the separator SPR or the undercut portion of the connection line CN formed by the tip part TP. Accordingly, the functional layer FNL may be disconnected and two divided sides FN1 and FN2 are formed in an area corresponding to the separator SPR and the undercut portion. Meanwhile, the first dummy layer UP1 disconnected from the functional layer FNL may be provided on the top surface of the separator SPR.

Figure 13J:
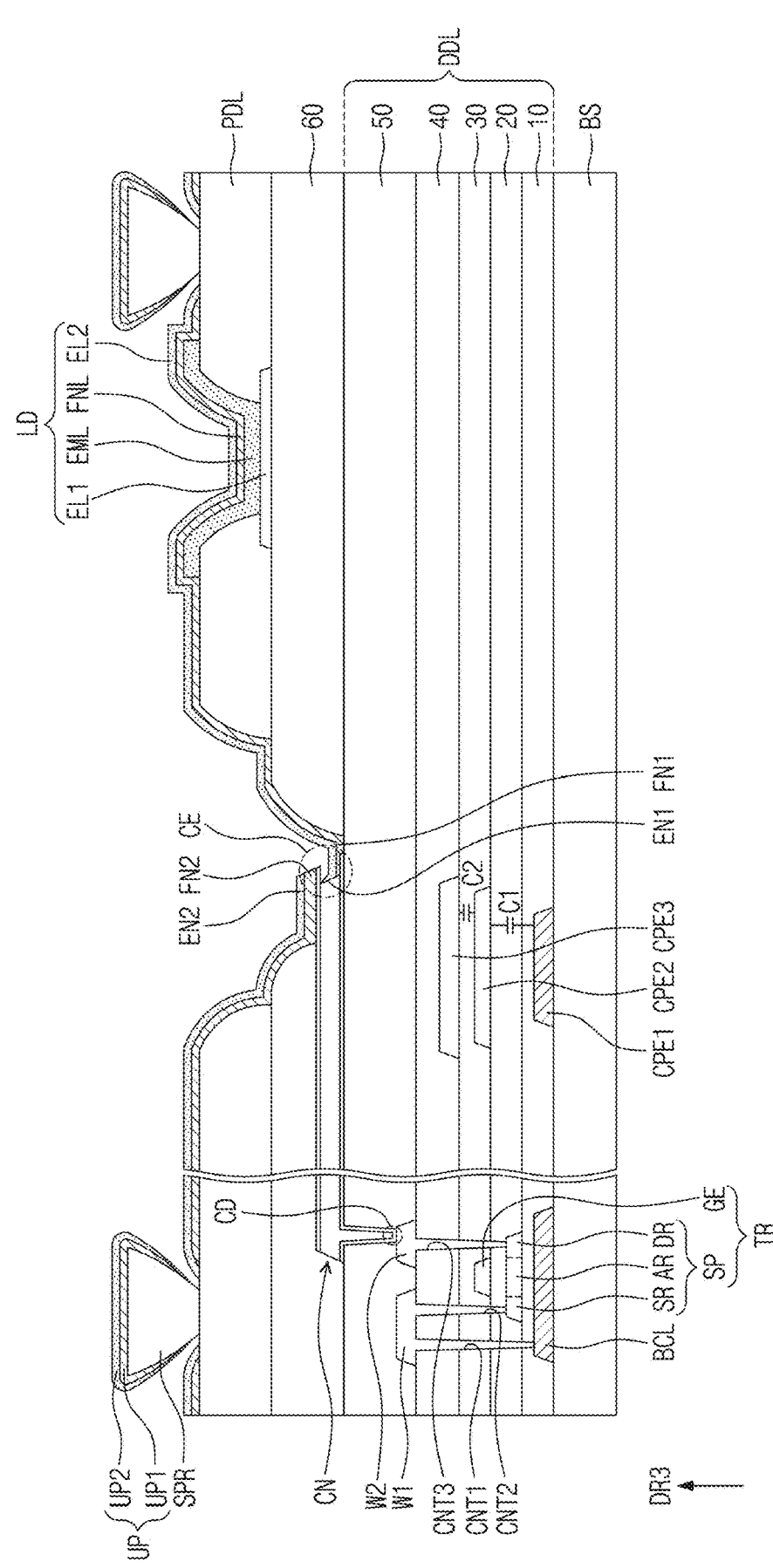

Then, referring to FIGS. 12 and 13J, the step S800 for providing the second electrode connected to the connection line may be progressed. The second electrode EL2 may be provided by forming a metal material. The second electrode EL2 may be provided on the entire base substrate BS using an open mask. The second electrode EL2 may have disconnected portions EN1 and EN2 on the side surface of the separator SPR. The second dummy layer UP2 disconnected from the second electrode EL2 may be provided on the top surface of the separator SPR.

Meanwhile, the second electrode EL2 may be disconnected due to the tip part TP but be provided along the undercut area, namely, the side surface L2_W of the second layer L2 by controlling the deposition angle. In other words, the second electrode EL2 and the functional layer FNL are deposited at different deposition angles, and thus the side surface L2_W of the second layer L2 may be exposed from the functional layer FNL but covered by the second electrode EL2. Accordingly, the second electrode EL2 may be easily electrically connected to the connection line CN.

Here, a portion of the connection line CN connected to the second electrode EL2 on the side surface L2_W of the second layer L2 may be defined as the emission connection part CE. Accordingly, one side of the connection line CN may be the driving connection part CD, and the other side of the connection line CN may be the emission connection part CE. The connection line CN may be easily connected to the second electrode EL2 through the second electrode EL2 formed on the side surface L2_W of the second layer L2 without a separate patterning process, and thus the light emitting element LD may be driven as an inverted element without a change in layered structure.

The manufacturing method of the display panel according to the inventive concept is not limited thereto.

Figure 14A:
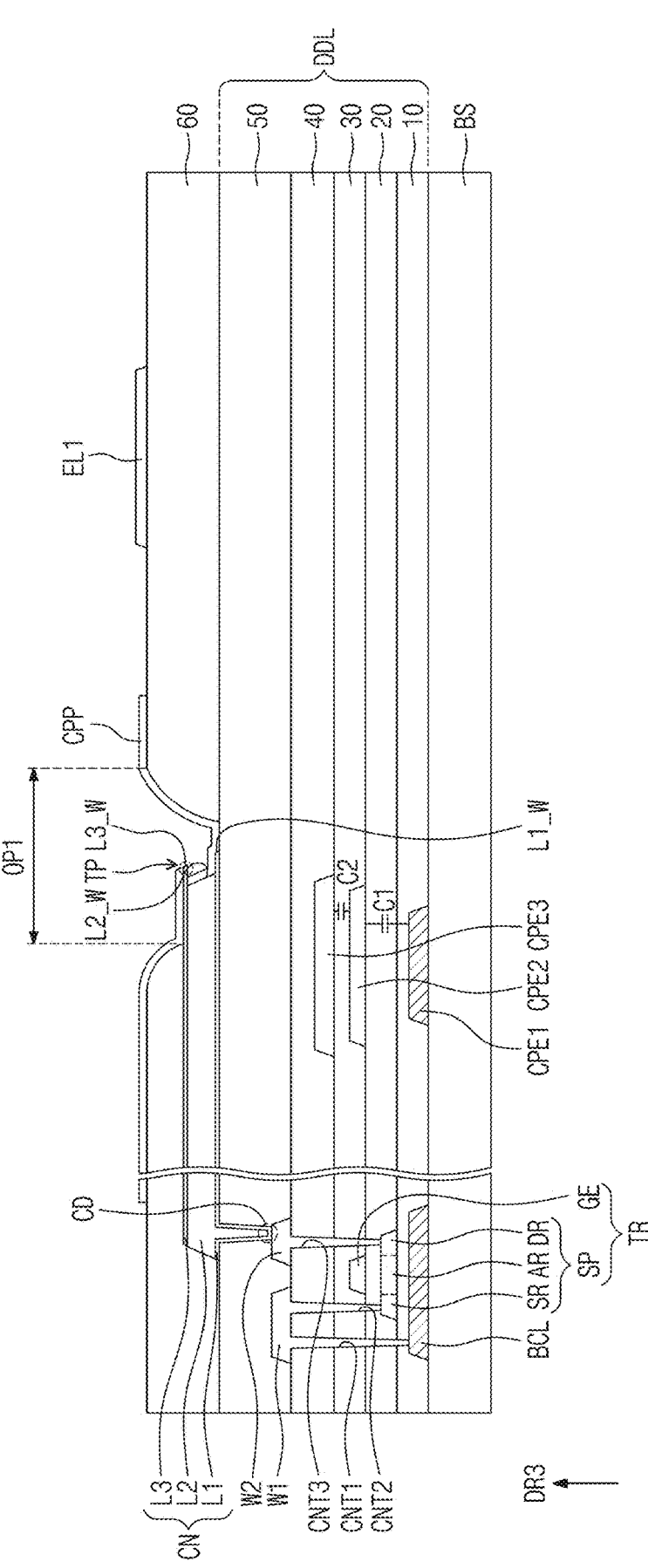
Figure 14B:
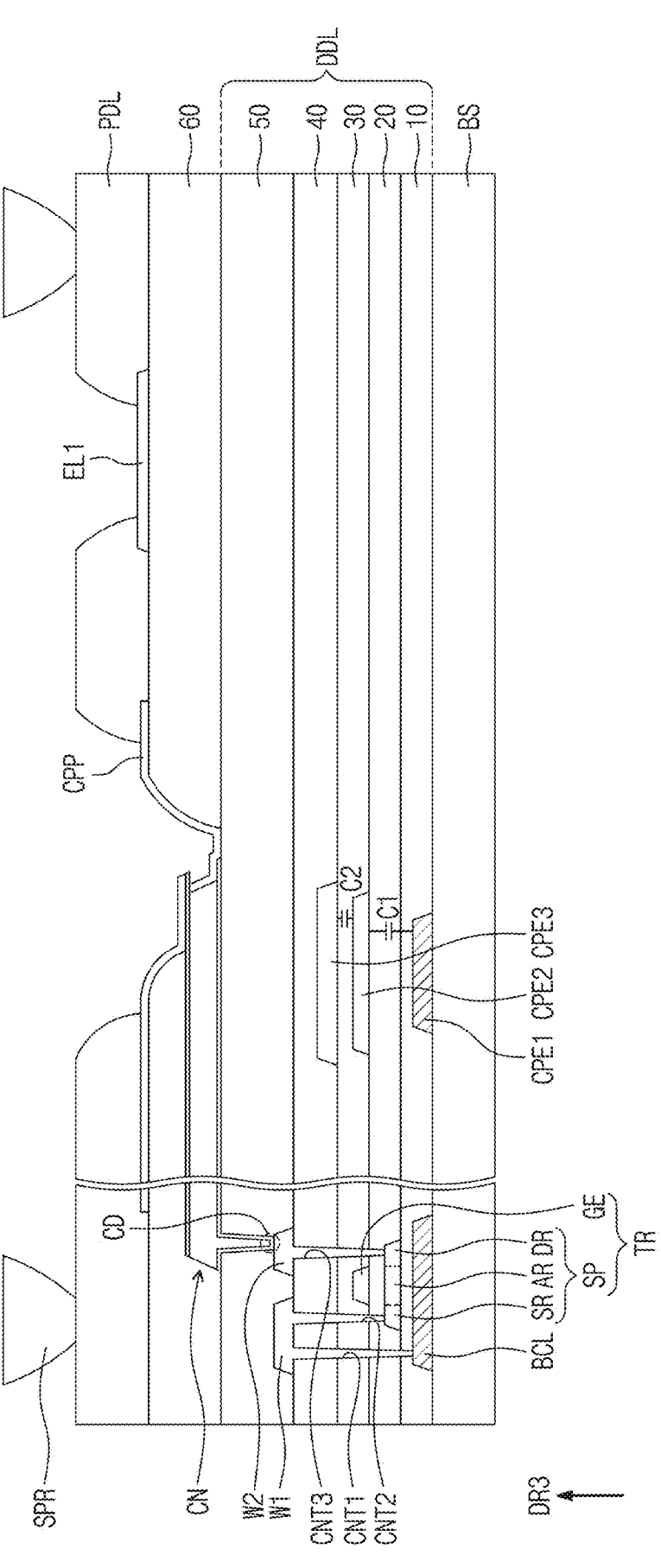
Figure 14C:
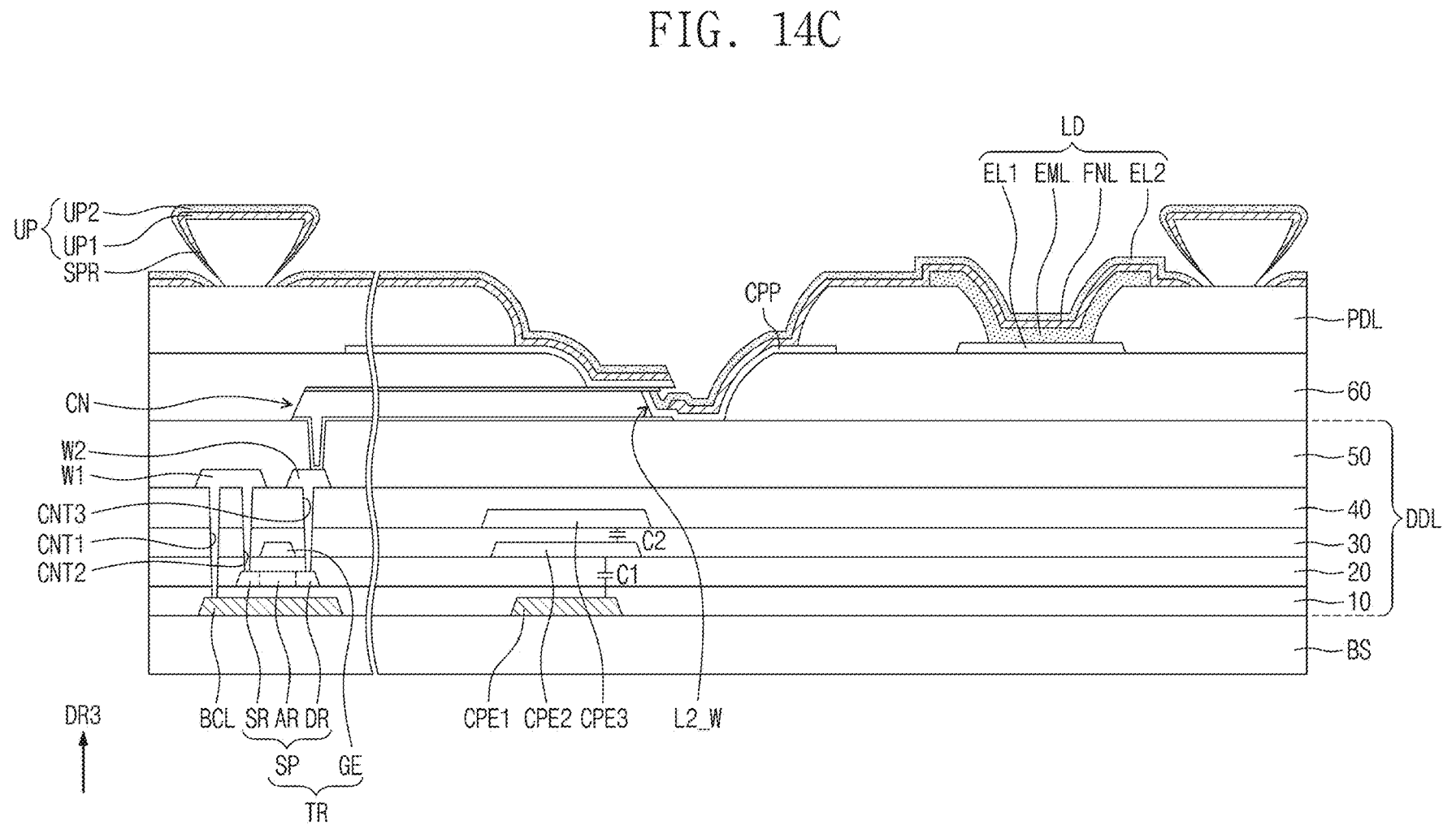

FIGS. 14A to 14C are drawings schematically showing some of steps of a manufacturing method of a display panel according to an embodiment of the inventive concept.

FIGS. 14A to 14C show respective modified embodiments for the foregoing FIGS. 13G, 13H, and 13I. In describing FIGS. 14A to 14C, the above-described details with reference to FIGS. 1 to 13I will be equally applied to the below-described components.

Referring to FIG. 14A, a manufacturing method of a display panel according to an embodiment of the inventive concept may further include a step for providing a capping pattern CPP. The capping pattern CPP may be provided substantially simultaneously with the first electrode ELL In other words, the capping pattern CPP may be provided with the same material as the first electrode EL1 and be provided substantially simultaneously through one mask. However, this describes an example, and the capping pattern CPP may be provided through a different process from that of the first electrode EL1, or be provided with a different material from that of the first electrode ELL Therefore, the embodiment of the inventive concept is not limited to any one embodiment.

The capping pattern CPP may be provided in an overlapping area with the tip part TP, namely be provided to overlap the first opening OP1. Here, the capping pattern CPP may be disconnected by the tip part TP. A portion of the disconnected capping pattern CPP may contact the side surface L2_W of the second layer L2. Another portion of the capping pattern CPP may be disposed on the top portion of the third layer L3, or contact the top surface of the third layer L3.

Then, with reference to FIGS. 14B and 14C, the pixel defining layer PDL, the separator SPR, the light emitting layer EML, the functional layer FNL, and the second electrode EL2 may be sequentially provided.

Here, the side surface L2_W of the second layer L2 may be covered by the capping pattern CPP and then covered by the second electrode EL2. In other words, the second electrode EL2 may be connected to the second layer L2 through the capping pattern CPP. The capping pattern CPP is relatively less recessed from the side surface L3_W of the third layer L3 in comparison to the side surface L2_W of the second layer L2. The second electrode EL2 may be electrically connected to the second layer L2 just by being connected to the capping pattern CPP instead of the side surface L2_W of the second layer L2, and thus the connection line CN may be more easily connected to the second electrode E2.

In addition, a manufacturing method of a display panel according to the inventive concept may include a step for providing the capping pattern CPP on the tip part TP, and thus oxidation of a metal included in the connection line CN or reduction of a metal included in the second electrode EL2 may be prevented in a manufacturing process of the light emitting element LD. For example, as the side surface L2_W of the second layer L2 is protected by the capping pattern CPP, oxidation of aluminum included in the second layer L2 may be prevented during manufacturing the light emitting element LD. In addition, silver included in the second electrode EL2 may be prevented from being reduced while the second electrode EL2 provided thereafter contacts the second layer L2.

The display panel according to the inventive concept may connect the cathode of the light emitting element to the connection transistor. The connection transistor of an N-type structure is selected, and thus a change in the gate-source voltage of the connection transistor may be prevented. Accordingly, a range of change in the current amount according to degradation of the light emitting element LD may be reduced, and thus image-sticking defects of the display panel according to an increase in utilization time may be reduced and the lifetime of the display panel may be enhanced.

The manufacturing method of a display panel according to the inventive concept may include a step for providing the connection line to connect the cathode of the light emitting element to the connection transistor, and thus provide the display panel with improved reliability.

According to the embodiment of the inventive concept, an image-sticking defect of the display panel according to an increase in usage time may be reduced and the lifetime of the display panel may be enhanced.

A manufacturing method of the display panel according to the embodiment may provide a display panel with improved reliability.

While this inventive concept has been described with reference to exemplary embodiments thereof, it will be clear to those of ordinary skill in the art to which the inventive concept pertains that various changes and modifications may be made to the described embodiments without departing from the spirit and technical scope of the inventive concept as defined in the claims and their equivalents.

Therefore, the scope of the inventive concept shall not be restricted or limited by the foregoing description, but be determined by the broadest permissible interpretation of the claims.

What is claimed is:

1. A display panel comprising:
a plurality of light emitting elements;
a plurality of transistors respectively connected to the plurality of light emitting elements; and
a plurality of connection lines respectively connecting the plurality of light emitting elements to the plurality of transistors,
wherein each of the plurality of connection lines comprises:
a first connection part connected to a corresponding light emitting element among the plurality of light emitting elements; and
a second connection part connected to a corresponding transistor among the plurality of transistors,
wherein each of the plurality of light emitting elements comprises an intermediate layer, a first electrode below a lower side of the intermediate layer, and a second electrode on an upper side of the intermediate layer,
wherein the first electrodes are connected to each other to provide an integral shape, and
wherein the connection lines are apart from the first electrodes and connected to the second electrodes.

2. The display panel of claim 1,
wherein the display panel includes a first area, a second area, and a third area disposed along a first direction,
wherein the display panel further includes a driving part which is disposed in the third area and is electrically connected to the plurality of the light emitting elements,
wherein the plurality of light emitting elements comprise first light emitting elements disposed in the first area, second light emitting elements disposed in the second area, and third light emitting elements disposed in the third area,
wherein the plurality of transistors comprise first transistors connected to the first light emitting elements disposed in the first area, second transistors connected to the second light emitting elements disposed in the second area, and third transistors connected to the third light emitting elements disposed in the third area,
wherein the plurality of connection lines comprise first connection lines connecting the first transistors to the first light emitting elements, second connection lines connecting the second transistors to the second light emitting elements, and third connection lines connecting the third transistors to the third light emitting elements,
wherein a third transistor among the third transistors connected to one of the third light emitting elements disposed in the third area is disposed in the second area, and
wherein the third light emitting elements disposed in the third area overlap the driving part in a plan view.

3. The display panel of claim 2, wherein, in each of the first to third areas, the second light emitting element and the third light emitting element are disposed in a same side from the first light emitting element, and the first light emitting element is arranged with the second light emitting element and the third light emitting element along the first direction, and
wherein the second connection part includes a plurality of second connection parts each of which is arranged between the second light emitting element and the third light emitting element along the first direction.

4. The display panel of claim 3, wherein each of the first connection lines, the second connection lines, and the third connection lines comprises:

a first line connected to one of the first connection part and the second connection part, and extending parallel to the first direction; and a second line connected to the first line and bent to extend to a direction different from a direction the first line extends.

5. The display panel of claim 4, wherein the first line of one of the second connection lines connected to a second light emitting element among the second light emitting elements and the first line of one of the third connection lines connected to a third light emitting element among the third light emitting elements extend in opposite directions.

6. The display panel of claim 4, wherein at least one among the first connection lines, the second connection lines, and the third connection lines further comprises a third line extending in parallel to the first direction, and wherein the third line is connected to the other of the first connection part and the second connection part which is not connected to the first line.

7. The display panel of claim 4, wherein the second line in the first area is bent at a first angle from the first line, the second line in the second area is bent at a second angle from the first line, and the second line in the third area is bent at a third angle from the first line, and wherein the first angle is 90°, the second angle is smaller than the first angle, and the third angle is smaller than the second angle.

8. The display panel of claim 7, wherein, in each of the second area and the third area, the second connection lines and the third connection lines are arranged along a first row and a second row, and a slope of the second line of each of the second connection lines and the third connection lines disposed in the first row are symmetrical to a slope of the second line of each of the second connection lines and the third connection lines disposed in the second row with respect to an imaginary line between the first row and the second row.

9. The display panel of claim 7, wherein, in the first area, the plurality of light emitting elements comprise a fourth light emitting element, and a fifth light emitting element and a sixth light emitting element disposed in opposite sides of the fourth light emitting element along the first direction, the plurality of transistors comprise a fourth transistor connected to the fourth light emitting element, a fifth transistor connected to the fifth light emitting element, and a sixth transistor connected to the sixth light emitting element, the plurality of connection lines comprise a fourth connection line connecting the fourth light emitting element to the fourth transistor, a fifth connection line connecting the fifth light emitting element to the fifth transistor, and a sixth connection line connecting the sixth light emitting element to the sixth transistor, each of the fourth connection line, the fifth connection line and the sixth connection line comprises a first line extending parallel to the first direction and a second line bent to extend to a different direction from a direction the first line extends, and a distance between the second line of the fourth connection line connected to the fourth light emitting element and the second line of the fifth connection line connected to the fifth light emitting element is the same as a distance between the second line of the fourth connection line connected to the fourth light emitting element and the second line of the sixth connection line connected to the sixth light emitting element in the plan view.

10. The display panel of claim 1, wherein the intermediate layer comprises a light emitting layer.

11. The display panel of claim 10, wherein the intermediate layer further comprises a functional layer disposed between the first electrode and the light emitting layer, or between the light emitting layer and the second electrode.

12. A display panel comprising:

a transistor;

a light emitting element disposed on the transistor; and a connection line connecting the transistor to the light emitting element, wherein the light emitting element comprises a first electrode disposed on the connection line, an intermediate layer formed on the first electrode, and a second electrode formed on the intermediate layer, and the first electrode, the intermediate layer and the second electrode are sequentially laminated in a thickness direction, wherein the connection line comprises:

a first connection part connected to the second electrode and apart from the first electrode; and a second connection part connected to the transistor, and wherein the first electrode below the intermediate layer is connected to a first electrode of an adjacent light emitting element and forms an integral shape with the first electrode of the adjacent light emitting element.

13. The display panel of claim 12, wherein the connection line comprises an undercut portion disposed under a tip part.

14. The display panel of claim 13, wherein the connection line comprises a first layer, a second layer, and a third layer, and wherein a side surface of the third layer protrudes from a side surface of the second layer to form the tip part.

15. The display panel of claim 14, wherein the second electrode includes a first side and a second side, and the tip part separates the first side from the second side, and the first side of the second electrode contacts the side surface of the second layer.

16. The display panel of claim 13, wherein the intermediate layer comprises a light emitting layer and a functional layer, and wherein the functional layer is disconnected at the undercut portion by the tip part.

17. The display panel of claim 13, further comprising:

a capping pattern overlapping the tip part in a plan view, wherein the capping pattern is disconnected at the undercut portion by the tip part and is disposed between the second electrode and the tip part.

18. The display panel of claim 13, further comprising:

a pixel defining layer comprising an opening exposing a portion of the first electrode and disposed on the first electrode; and a separator comprising an insulation material and disposed on the pixel defining layer, wherein the second electrode is disconnected by the separator.

19. The display panel of claim 12, wherein the transistor is an N-type oxide semiconductor transistor.

20. A manufacturing method of a display panel comprising:

providing a transistor and a first intermediate insulation layer covering the transistor on a base layer;

providing a connection line connected to the transistor through a contact hole on the first intermediate insulation layer;

providing a second intermediate insulation layer covering the connection line;

providing a first opening in the second intermediate insulation layer to expose one side of the connection line;

etching the exposed one side of the connection line to provide a tip part, wherein the connection line contacts the first intermediate insulation layer, and the tip part is apart from the first intermediate insulation layer in a cross-sectional view;

providing a first electrode on the second intermediate insulation layer;

providing a second opening exposing the tip part and a pixel defining layer in which an emitting opening exposing the first electrode is defined;

providing an intermediate layer on the pixel defining layer; and providing a second electrode on the intermediate layer to be connected to the tip part.

21. The manufacturing method of claim 20,
wherein the connection line comprises a first layer, a second layer, and a third layer, and
a side surface of the third layer protrudes from a side surface of the second layer to form the tip part, and the second electrode is connected to the side surface of the second layer.

22. The manufacturing method of claim 20, further comprising:
providing a separator on the pixel defining layer,
wherein the separator surrounds the tip part and the first electrode, and
wherein, in the step of providing of the second electrode, the second electrode is disconnected by the separator, and a first portion disposed on a top portion of the separator and a second portion surrounding the separator and disconnected from the first portion are formed.

23. The manufacturing method of claim 20, wherein the intermediate layer comprises a light emitting layer.

24. The manufacturing method of claim 23, wherein the intermediate layer further comprises a functional layer disposed between the first electrode and the light emitting layer, or between the light emitting layer and the second electrode.

* * * * *